(12) United States Patent
Attarwala

(10) Patent No.: US 7,575,955 B2
(45) Date of Patent: Aug. 18, 2009

(54) METHOD FOR MAKING ELECTRONIC PACKAGES

(75) Inventor: Abbas Ismail Attarwala, Fremont, CA (US)

(73) Assignee: Ismat Corporation, Union City, CA (US)

( * ) Notice: Subject to any disclaimer, the term of this patent is extended or adjusted under 35 U.S.C. 154(b) by 57 days.

(21) Appl. No.: 11/284,552

(22) Filed: Nov. 21, 2005

(65) Prior Publication Data

US 2006/0084254 A1    Apr. 20, 2006

Related U.S. Application Data

(62) Division of application No. 10/753,115, filed on Jan. 6, 2004, now Pat. No. 7,105,931.

(51) Int. Cl.
*H01L 21/00* (2006.01)

(52) U.S. Cl. ................. 438/118; 438/107; 438/108; 438/456; 257/E21.499; 257/E21.514

(58) Field of Classification Search ............ 438/55; 257/E21.5
See application file for complete search history.

(56) References Cited

U.S. PATENT DOCUMENTS

| | | | |
|---|---|---|---|
| 3,999,285 A * | 12/1976 | Lewis et al. ............ 29/827 |
| 5,376,588 A | 12/1994 | Pendse | |
| 5,397,921 A | 3/1995 | Karnezos | |
| 5,409,865 A | 4/1995 | Karnezos | |
| 5,602,059 A * | 2/1997 | Horiuchi et al. ............ 438/15 |
| 5,663,530 A | 9/1997 | Schueller et al. | |
| 5,728,606 A | 3/1998 | Laine et al. | |
| 5,773,884 A | 6/1998 | Andros et al. | |
| 5,835,355 A | 11/1998 | Dordi | |
| 5,926,696 A * | 7/1999 | Baxter et al. ............ 438/118 |
| 6,002,169 A | 12/1999 | Chia et al. | |
| 6,051,273 A | 4/2000 | Dalal et al. | |
| 6,084,297 A | 7/2000 | Brooks et al. | |
| 6,127,735 A | 10/2000 | Berger | |
| 6,288,376 B1 * | 9/2001 | Tsumura ............ 219/635 |
| 6,372,549 B2 * | 4/2002 | Urushima ............ 438/118 |
| 6,472,762 B1 | 10/2002 | Kutlu | |

(Continued)

OTHER PUBLICATIONS

Doran, Mark: From Research and Development at Intel: Beyond the BIOS; Feb. 18, 2003; 39 pages.

(Continued)

*Primary Examiner*—Charles D. Garber
*Assistant Examiner*—Cheung Lee
(74) *Attorney, Agent, or Firm*—N Eric Jorgensen

(57) ABSTRACT

A process for fabricating an electronic package for a Thermally Enhanced BGA package including the steps of fabricating a thermally conductive support member, an adhesive bonding member, and a circuitized member; sandwiching the members together, forming a cavity therein; bonding adhesively the members together with heat and pressure; bonding adhesively a chip to the support member within the cavity; and connecting electrically the chip to the circuitized member. A process for fabricating an electronic flip chip package, including the steps of fabricating an adhesive bonding member, a flip chip, and a circuitized member; aligning the members with respect to each other; sandwiching the members together; bonding the members together with heat and pressure; and connecting electrically the flip chip to the circuitized member.

13 Claims, 26 Drawing Sheets

U.S. PATENT DOCUMENTS

| | | |
|---|---|---|
| 6,479,903 B2 | 11/2002 | Briar |
| 6,488,806 B2 | 12/2002 | Carden et al. |
| 6,549,413 B2 | 4/2003 | Karnezos et al. |
| 6,703,262 B2 * | 3/2004 | Itagaki et al. ............... 438/124 |
| 6,734,535 B1 | 5/2004 | Hashimoto |
| 2002/0158335 A1 | 10/2002 | Towle et al. |

OTHER PUBLICATIONS

Extensible Firmware Interface Specification, Version 1.10; Dec. 1, 2002, pages i-vi and 1-1 to 3-8.

* cited by examiner

METHOD FOR MAKING ELECTRONIC PACKAGES

CROSS REFERENCE TO RELATED APPLICATION

This application is a divisional application of application Ser. No. 10/753,115, filed on Jan. 6, 2004 now U.S. Pat. No. 7,105,931, entitled ELECTRONIC PACKAGE AND METHOD, by Abbas Ismail Attarwala.

FIELD OF INVENTION

The present invention generally relates to electronic packages that incorporate a semiconductor device, such as an integrated circuit chip (chip). More particularly, the invention relates to structures and methods for fabricating electronic packages for wire bonded chips and for flip chips, including thermally enhanced electronic packages and thermally enhanced electronic packages that incorporate shielding against electromagnetic interference.

BACKGROUND OF THE INVENTION

An electronic package typically comprises an electronic package substrate, a chip that is mechanically and electrically connected to the electronic package substrate, and encapsulating material that covers and protects the chip and the electrical connections between the chip and the electronic package substrate from mechanical and environmental damage. The primary function of an electronic package substrate is to provide an electrical bridge from a very dense set of electrical terminals or pads on a chip to a corresponding set of electrical terminals or pads on the electronic package substrate, effectively fanning out the electrical connections from the chip so that the chip can be mechanically and electrically connected to the next level of integration such as a printed circuit board (PC board or PCB). Since many chips produces a significant amount of heat during operation, the electronic package also must dissipate the heat and prevent the chip from overheating and becoming unreliable.

There are two principal types of electronic packages commonly in use, each of which is differentiated by the way that a chip is connected to its corresponding electronic package substrate: electronic packages for wire bonded chips (wire bonded electronic packages) and electronic packages for flip chips (flip chip electronic packages). In wire bonded electronic packages, the chip is connected to the corresponding electronic package substrate by tiny wires in a process called wire bonding or by tabs in a process called tab bonding. In flip chip electronic packages, the chip is connected to the corresponding electronic package substrate by small, typically globular conductive connectors, typically tiny spheres of solder called solder bumps. Because both types of electronic packages have the same purpose and function—to provide a bridge between the very dense set of electrical terminals or connectors on a chip to a less dense set of terminals or connectors on a mother board, application board or other PC board—both types of electronic packages share some of the same limitations and problems. Some of these limitations and problems can be addressed by common or similar improvements. However, because the two types of electronic packages have differences in their respective structures and the way that chips are attached to their respective electronic package substrates, there often are differences in the way that certain limitations and problems can be overcome.

To facilitate the design and manufacture of electronic products, industries have adopted various standards for sizes, shapes, and interfaces for connecting electronic packages to PC boards or other circuits. A very common interface for mechanically and electrically connecting an electronic package to a PC board is a ball grid array (BGA). A ball grid array is an array of solder balls (or similar connector/conductors). A BGA electronic package has an array of solder balls (or similar connector/conductors) connected to a corresponding set of solder ball pads on the outside of the electronic package. The solder balls typically are attached to pads on the electronic package in the electronic package assembly process. When an electronic package is attached to a PC board the array of solder balls on the electronic package is aligned with a corresponding set of solder ball pads or connectors on the PC board. The solder balls are melted and fused to the set of solder ball pads on the PC board.

The components of electronic packages are manufactured in very separate and distinct operations and generally by separate firms that specialize in manufacturing such components. Typically, chips are manufactured in substantial quantities by chip manufacturers in what are often called chip foundries. Typically, electronic package substrates are manufactured in substantial quantities in separate operations by firms that specialize in making such substrates. Electronic package substrates are manufactured in various standard sizes defined by industry standards. In yet another separate operation, generally called the electronic package assembly process, chips are bonded to electronic package substrates, and electrical connections are made between the chips and the electronic package substrates.

In wire bonded electronic package assembly process the chip is mechanically bonded to the electronic package substrate using an adhesive paste between the chip and the electronic package substrate. The chip is then electrically connected to the electronic package substrate, by any of several different methods, the most common being wire bonding, but tab bonding has been and still may be used. Wires (or tabs) are connected between pads or terminals on the chip—typically along the periphery of the chip—and pads or terminals on the electronic package substrate—typically along the edge or periphery of the electronic package substrate closest to the chip. After the chip is electrically connected to the electronic package substrate, the chip and the electrical connections are encapsulated or molded with an organic material to protect the chip and its connections from mechanical and environmental damage. As a final step in the assembly process for making BGA electronic packages, solder balls are attached to the electrical pads on the electronic package substrate so that the electronic package ultimately can be connected to a circuit board or more generally to the next level of integration.

With the historic progress in the design and development of chips and chip-making equipment, the size of circuit elements within a chip has decreased, the number of these circuit elements within a chip has increased, the number of electrical connections needed to connect a chip to its corresponding electronic package substrate has increased, and the space for making these connections has decreased. Instead of utilizing only the area along the periphery of a chip to provide connections between the chip and the corresponding electronic package substrate, as is the case when using wire-bonding or TAB bonding techniques for connecting a chip to the electronic package substrate, the entire surface area of a chip can be used for creating electrical connections by providing electrically conductive terminals on one of the planar surfaces of the chip—denoted as the bottom surface of the chip. The electrical terminals on the bottom surface of the chip, which enable connections to the electronic package substrate, are typically arranged in an array covering most of the surface. Typically, small solder bumps are connected to the terminals on the chip to provide means for connecting the chip to the electronic package substrate. To connect a chip that has this array of solder bumps to a corresponding electronic package substrate, the chip is "flipped" onto the electronic package substrate, and the solder bumps are aligned with a corresponding array of solder bump pads on the electronic package substrate that has been designed and fabricated to accommodate the specific chip. Typically, the electronic package substrate with the solder bumps that are attached to the chip resting on the solder bump pads of the electronic package substrate is heated briefly to a temperature well above the melting temperature of the solder bumps causing the solder bumps to melt and to bond with the solder bump pads. Upon cooling the solder bumps provide mechanical and electrical connections between the electrical contacts or terminals of the chip and the electrical terminals or connections on the electronic package substrate. A chip that has electrically conductive bumps, such as solder bumps, for connecting the chip to an electronic package substrate is generally referred to as a flip chip. An electronic package substrate that is designed to accommodate a flip chip is called a flip chip package substrate.

Just as solder bumps are used to connect a flip chip to a flip chip package substrate, solder balls typically are used to connect a flip chip electronic package to the next level of integration, such as a printed circuit board (PC board or PCB). An electronic package that is designed to use an array of solder balls for making such connections to the next level of integration is called a ball grid array (BGA) electronic package. A BGA electronic package has an array of solder ball pads to which a corresponding array of solder balls is attached for connecting the BGA electronic package to a PC board. The solder ball grid array pattern is sometimes called the footprint of the electronic package. Most flip chip electronic packages use a BGA footprint and are often called BGA flip chip electronic packages. Some electronic packages employ pin connectors, instead of solder balls, for connecting to PC boards.

The term "solder bump" is generally applied to the solder connectors that connect a flip chip to an electronic package substrate, more particularly, to a flip chip package substrate. The term "solder ball" is generally applied to the solder connectors that are used to connect a BGA electronic package to a PC board. Solder bumps typically are about 100 microns or about 4 mils in diameter—much smaller than solder balls, which typically are about 1000 microns or about 40 mils.

As integrated circuits have become more dense, and as chip speeds have increased, over time, the amount of heat generated by chips during their operation also has increased, presenting additional demands upon the electronic package substrate to dissipate heat and to prevent the chip from becoming too hot to operate reliably. When the operating temperature of a chip rises above a certain high temperature range, the chip may become unreliable and fail or produce errors. The high temperature limits for safe and reliable operation of silicon chips today range from about 105° C. to about 115° C. To prevent chips, particularly those with high circuit densities and those that operate at high speeds, from over-heating and breaking down or becoming unreliable at high temperatures, it is essential that electronic packages conduct heat away from the chips and to dissipate the heat from the electronic package. Electronic packages that are designed to dissipate the heat generated in chips are commonly called thermally enhanced electronic packages. The thermal enhancement of the package is usually provided by attaching, to the package, a metallic structure that functions as a heat sink. An electronic package with a heat sink can draw heat out from the chip and then dissipate the heat to the surroundings by convection, conduction and/or radiation. In some electronic packages, the heat sink is added in a separate process step to improve thermal performance, whereas in others the heat sink is an integral part of the electronic package.

As currently made, a typical electronic package substrate for a thermally enhanced BGA wire bonded electronic package comprises (1) a support member and (2) a circuitized member. The support member typically is metallic and typically functions as a support and a heat sink for a chip and as a support or stiffener for the circuitized member. A typical circuitized member may be made from a polyimide substrate or from more rigid single or multilayered organic materials. Typically, the polyimide substrate is embedded with or covered by conductive traces, which may be photo-lithographically developed, providing for interconnecting the input and output terminals of a chip to the external terminals of the electronic package.

In some types of thermally enhanced electronic packages there is a cavity in the metallic support member into which a chip can be placed. Cavities in the metallic member are formed either by milling, etching, or stamping a cavity into the metal support member. The thermally enhanced BGA packages described in U.S. Pat. Nos. 5,376,588, 5,397,921, 5,728,606, and 5,409,865 show packages with cavities that have been etched out or milled out of the metallic substrate. Thermally enhanced BGA packages described in U.S. Pat. Nos. 5,663,530 and 5,773,884 show cavities that have been stamped into the metallic substrate. Generally the circuitized member is bonded to the metallic member by a thin layer of adhesive applied in a paste form.

The processes currently used to make a cavity in an electronic package substrate into which a chip can be placed are relatively expensive, can produce toxic waste, can introduce geometric distortions that tend to limit the speeds at which chips can operate, and often can lessen the structural integrity of the electronic package. Milling out a cavity in a metal support member is a relatively expensive operation. The high cost of the operation and the cost of the material wasted in the milling add significantly to the cost of the electronic package substrate.

Etching a cavity in a metal support member—a common process for making the cavity—is also an expensive operation, though less expensive than milling a cavity. Etching, however, not only wastes material, but it also produces toxic waste products, and it can produce thin spots and depressions in the base of the cavity, which may adversely affect the structural integrity of the electronic package substrate. Etching also creates geometric problems at the base of the cavity, such as rounded transitions from the side walls to the bottom wall or base—rather than a sharply defined and perpendicular intersection of the side walls and the bottom wall.

Another method of forming a cavity is by stamping a cavity into a metal piece, but stamping can weaken the metal and adversely affect the structural integrity of the electronic package substrate. Stamping also produces geometric problems in the base or bottom wall of the cavity, since stamping also produces rounded transitions from the side walls to the bottom wall of the cavity.

Rounded transitions from the side walls to the bottom wall are impediments to decreasing the distance between the chip and the electrical contacts on the electronic package substrate and adversely affect the electrical performance of the electronic package. Rounded transitions at the intersection of the side walls and the bottom wall of the cavity prevents a chip from being placed close to the side walls of the cavity. If a chip were placed too close to one or more of the side walls of a cavity formed by stamping or etching, the chip would be tipped by the rounded transitions where the side walls roll into the bottom wall of the cavity. Such a tipped chip not only would loose substantial mechanical and thermal contact with the heat sink, but it also would be askew and make it more difficult to form electrical connection, such as wire bonds or tabs, in an automatic bonding machine. Because the transitions from the side walls to the bottom wall or base of the cavity are rounded when the cavity is etched or stamped, it is necessary to make the cavity substantially larger than the dimensions of the chip to provide sufficient allowance or clearance for the rounded transitions from side walls to base. Since the chip will not be close to the side walls of the cavity, the wire bonds that connect the chip to wire bond pads on the circuitized member must be made longer than would be the case if the side walls and the base had a sharply defined, perpendicular intersection and the chip could be placed closely adjacent to the side walls of the cavity. In general, increasing the length of the wire bonds decreases the electrical performance of the electronic package. The shorter the wire length, the better it is for electrical signals. The usual methods (stamping or etching) for making the cavities, into which chips are placed produce an inherent impediment to decreasing the distance between the chip and the bonding pads on the electronic package substrate, thereby limiting the abilities of these electronic packages.

In etched cavities the length of the rounded bottom from the edge of the wall to the point where it becomes planar with the base of the cavity is, as a rule of thumb, half the depth of the etched cavity. For a typical etched cavity the depth may be approximately 450 microns, therefore the length of the rounded bottoms at the base of the etched copper stiffener is approximately 225 microns. The depth of the cavity is a sum of the thickness of the die attach, chip and height of wirebonds from the surface of the chip surface to the surface of the circuitized member. Because of the rounded bottom, the chip has to be placed at least 225 microns away from the edge of the cavity wall, otherwise the chip may tilt and thereby cause wire bonding and reliability issues. Placing the chip 225 microns from the wall of the copper stiffener causes an increase in the wire bond length by at least 225 microns. The average length of wire bonds range from 1000 microns to 2500 microns. A cavity in an electronic package substrate with perpendicular or squared transition between the side walls and the bottom wall rather than a rounded transition between the side walls and the bottom wall would result in a decrease in the length of the wirebond by approximately 225 microns. A decrease of 225 microns in the length of the wirebond, translates to about 9% to 22.5% of the current range of lengths of wirebonds and would result in a significant improvement in the electrical performance. Clearly there is a need for a better way to make wire bonded electronic package to produce cavities that do not have rounded transitions between side walls and bottom wall.

Faster microprocessors with higher power consumption and higher currents are not only generating additional heat that must be dissipated by the electronic package, but these microprocessors are generating more electromagnetic interference ("EMI") that is becoming increasingly problematic for other components in other parts of the device. Faster microprocessors and other chips also can be vulnerable to EMI from external sources that interfere with the correct operation of the chip. In the past, the conventional way to deal with EMI was to build a bigger and better chassis enclosure; however, the apertures in the chassis required for airflow for cooling provide large windows for noise from high frequency signals and their harmonics to leak through. More recently designers have been designing and making metal enclosures, based upon the principles of a Faraday Cage, to surround electronic packages. These metallic structures, if properly designed, mounted, and grounded, appear to suppress or significantly reduce EMI generated by the microprocessor, and to suppress or significantly reduce the conduction of noise generated by other sources on a PC board to the microprocessor. These structures often are solid metal enclosures that are brazed together. Metal structures with metal screens or metal structures with small openings may reduce EMI adequately, so long as the small openings in the screen or other structure is smaller than the wavelength of the EMI. An electromagnetic wave with a frequency of 15 gigahertz has a wavelength of 2 cm. The 10× harmonic has a wavelength of 2 mm. A metal enclosure with some gaps no larger than 1-2 mm generally will provide protection against EMI from sources with frequencies up to 15 gigahertz. While these metallic structures have provided considerable benefits in reduction of EMI, the additional structure adds to the cost of the product and takes up additional space in the product. In some products, e.g. compact mobile phones, there may not be enough space for adding a Faraday Cage to the already crowded PC board. Hence there is a real need for both a wire bonded electronic package and a flip chip electronic package that incorporates its own Faraday Cage or the essential elements of a Faraday cage in the basic structure of the electronic package, so that EMI can be mitigated without the need for an additional metallic structure external to the electronic package. PC Boards often have and easily can be constructed with one or more ground planes as one of the layers within the PCB. Since the ground plane within a PCB directly under an electronic package can serve as the bottom side of a Faraday Cage, there is an opportunity and a need for an electronic package that incorporates its own grounded metallic structure around the top and four sides of a chip so that the electronic package can be placed above a ground plane in a PC board and shield the chip from and against EMI.

With the increasing size and complexity of chips there is a corresponding increase in the number of inputs and outputs (I/Os) of chips. As the size of chips and devices shrinks, there is a need to make more connections and denser connections in the electronic package substrate. There is also a need to reduce the number of discrete, individual paths between the chip and the PC board. To reduce the number of paths and to accommodate an increase in the number of I/Os for a chip without increasing the number of solder balls in an array of solder balls it has become a common practice to use a two-side circuitized member and to incorporate a ground plane into one side or a part of one side of the circuitized member. Alternatively a multilayered circuitized member can be used, but using multilayer circuitized members significantly increases the cost of an electronic package. Since thermally enhanced electronic package generally have a metal heat sink, it would be desirable to find a cost effective way to use the metal heat sink as a ground plane and to make connections thereto efficiently so that valuable space on the circuitized member that otherwise would be used for a ground plane or for traces routing ground signals to the ground plane can be freed up to handle more signals or a power plane.

As demands to improve the heat dissipation properties and electrical performance of electronic packages have increased, there has been a tendency to add components to the electronic package and to make packages more elaborate and complex. Unfortunately, as electronic packages have become more elaborate and complex, there are now more components and more interfaces and interconnections that can fail. As a general rule, the overall reliability of any product or system, including an electronic package, can be improved by reducing the number of components and the number of connections in the product or system that can fail. There is a need for an electronic package substrate and an electronic package that can provide the requisite increased heat dissipation, and improved electrical performance with fewer components.

Flip chip electronic packages share with wire bonded electronic packages the limitations, problems and needs for solutions relating to EMI, the need to improve the efficiency of routing electrical connections, and the need to provide heat dissipation in a cost effective and component-minimizing manner. Flip chip electronic packages also are subject to problems peculiar to the way that flip chips are attached to flip chip package substrate that are not pertinent to wire bonded electronic packages.

The process of attaching BGA electronic packages to PC boards requires that solder balls on the BGA electronic package melt and bond with solder ball pads on the PC Board. The process for attaching an electronic package to a PC board is referred to as the package-to-board assembly process. Typically, solder balls on electronic packages are made of eutectic (about 63% Sn, 37% Pb) or near eutectic (about 60% Sn, 40% Pb) lead tin solder that melts about 183.6° C. During the package-to-board assembly process the temperature of the electronic package and the temperature of the PC board are raised significantly above 183.6° C. to compensate for heat absorption and dissipation by various components on the PC board, to enable the kinetics of solder melting in a short period of time, and to ensure that the solder balls melt and attach to the solder ball pads on the PC board. In a typical package-to-board assembly process, the PC board, with the electronic package set in proper position (i.e. with the array of solder balls on the electronic package aligned with the array of solder ball pads on the PC board), is sent through an oven exposing the PC board to a temperature that rises at the rate of about 3° C./second until the temperature reaches about 150° C.; the temperature generally is held at about 150° C. for a minimum of about 60 seconds to a maximum of about 120 seconds; the temperature then is raised at the rate of about 2.5° C./second until the temperature reaches about 235° C.; the temperature generally is held at about 235° C. for a minimum of about 15 seconds to a maximum of about 20 seconds, during which the soldering is effected; the temperature is then lowered during the cooling phase at a rate of about 3° C./second.

Most PC boards are made of organic materials, such as a material commonly known in the industry as FR-4 (sometimes written as FR4) or a similar material known as BT resin (or just BT), a resin supplied by Mitsubishi Corporation of Japan. (The acronym FR is short for fire resistant.) Electronic package substrates for many, if not most, BGA flip chip electronic packages are made of the same organic materials—FR-4 or BT resin. These organic materials have a glass transition temperature of about 150° C. to about 170° C., a temperature above which the materials begin to soften, and a breakdown temperature of about 225° C. to about 235° C., a temperature above which the materials can char or begin to burn. These organic materials will be damaged if exposed to temperatures above 225° C.-235° C. for a sustained time period. In a typical package-to-board assembly process, the temperature of the PC board is raised to about 225° C.-235° C. for a short period of time, to quickly melt the solder balls, and then is quickly lowered, to prevent damage to the PC board and the electronic package substrate material.

High temperatures applied to organic materials, like FR-4 or BT resin, particularly if sustained for a significant period of time, can cause a number of problems that manifest themselves after the electronic package is put into service. Higher temperatures will cause or lead to increased warping of the electronic package, which can adversely affect the integrity of the electronic package and its connections to a PC board. Higher temperatures also lead to an increase in the formation of intermetallics between the solder in the solder balls and the metal layers of the solder ball pads, which cause brittleness in the bonds between the solder balls and the solder ball pads. The encapsulating material used to seal and protect the chip and its connections in an electronic package typically is an organic material. This material absorbs moisture. This moisture turns to steam during the reflow process. If the temperature is too high, or if the electronic package is held at a high temperature too long, the steam cracks the electronic package. This phenomenon has been observed widely and is called "popcorning." Electronic packages that are exposed to higher maximum temperature during the solder reflow process or that are exposed to the maximum temperature for a longer period of time are more susceptible to popcorning. Cracks that are formed in the encapsulating material as a result of popcorning allow moisture or other chemicals to penetrate the electronic package, causing a reliability problem. To avoid these problems, it is important—often critical—to keep the maximum temperature during the package-to-board assembly process as low as possible and to maintain the high temperature for as short a time as possible.

Typically, the solder connections between a flip chip and a flip chip package substrate are encapsulated with an epoxy compound, commonly referred to as an "underfill" in the industry. The solder bumps are encapsulated after the flip chip is soldered onto the flip chip package substrate. The underfill encapsulation binds the chip, the flip chip package substrate, and the solder bumps together and strengthens the mechanical bonding between the chip and the solder bumps and the mechanical bonding between the solder bumps and the flip chip package substrate. The underfill encapsulation increases the reliability and lifetimes of the flip chip-to-solder bump interconnections and the reliability and lifetimes of the solder bump-to-flip chip substrate interconnections.

If the solder bumps melt a second time during the package-to-board assembly process, the volume of the solder bumps will increase during the phase change from solid to liquid. The volume of the solder bumps subsequently will decrease during the cooling cycle as the solder undergoes a second phase change from liquid to solid. The increase in volume of the solder bumps during the phase change from solid to liquid puts pressure on the epoxy underfill encapsulant causing interfacial separation in the interface between the underfill encapsulant and the chip and in the interface between the underfill encapsulant and the solder bump. The subsequent decrease in volume of the solder bumps during the phase change from liquid to solid will leave a gap where there has been an interfacial separation. The interfacial separation results in a loss of mechanical bonding between the flip chip and the flip chip package substrate, thereby degrading the mechanical reliability of the solder bump connections. Gaps at the points of interfacial separation degrade the electrical reliability of the solder bump connections.

To maintain the reliability of the electrical and mechanical connections of the solder bumps (or other electrically conductive bumps) between the flip chip and the flip chip package substrate, it is critical to ensure that the solder bumps (or other electrically conductive bumps) connecting the flip chip to the flip chip package substrate do not melt during the packageto-board assembly process. One way to ensure that the solder bumps on the flip chip do not melt during the package-to-board assembly process is to select a material for the solder bumps that has a melting temperature that is greater than the maximum temperature of the package-to-board assembly process, usually 225° C.-235° C. Typically, solder bumps on flip chips are composed of high lead solder (90% Pb, 10% Sn) that melts around 300° C. Other alloy compositions of lead and tin and alloy compositions other than lead and tin are alternatives for making solder bumps. But, regardless of the alloy chemistry and composition, the solder bumps connecting the flip chip to the flip chip package substrate should have a melting temperature that is substantially higher than the temperature at which the solder balls are melted in connecting the electronic package to the PC board during the package-to-board assembly process.

Because the melting temperature of the solder bumps (or other electrically conductive bumps) on flip chips typically is substantially greater than 225° C.-235° C., the temperature required to melt and attach the solder bumps on the flip chip to the flip chip package substrate in a conventional reflow oven generally is raised substantially higher than 225° C.-235° C. Therefore, the materials used to make the flip chip package substrate should be able to withstand temperatures that are substantially higher than 225° C.-235° C. This requirement has heretofore limited the choice of materials that can be used for the flip chip package substrates.

Flip chip package substrates made of ceramic material are generally used for flip chips that have solder bumps that melt at temperatures greater than 225° C. Electronic package substrates made of ceramic are generally more expensive than electronic package substrates made of organic material.

To get around the problem of not being able to use high-melting-temperature solders with organic electronic package substrates, novel methods have been developed to apply a 'cap' of low melting eutectic solder on high lead solders bumps. These methods are described in U.S. Pat. No. 6,127,735 to Berger, et al., entitled "Interconnect for low temperature chip attachment" and U.S. Pat. No. 5,451,274 to Gupta, entitled "Reflow of multi-layer metal bumps." However, because of competitive pressures on the manufacturing of electronic packages, there is a need for a lower cost solution to the problem.

There is an increasing recognition of the hazzards associated with lead in the environment. Proposed legislative action, pressure by the environmental activists, and a sense of community responsibility are prompting manufacturers to reduce—and ultimately to eliminate if possible—the use of lead in electronic products. There are a number of alloy chemistries being evaluated to replace traditional Lead/Tin solder alloys. The most promising being investigated are ternary alloys of Tin(Sn), Silver(Ag), and Copper(Cu). The alloy compositions of these ternary alloys being evaluated are 95.5% Sn/4.0% Ag/0.5% Cu and 95.5% Sn/3.8% Ag/0.7% Cu. The melting temperature of both of these alloys is about 217° C., which is greater than the melting temperature of eutectic Pb/Sn solder, 183.6° C.

If solder bumps made of 95.5% Sn/4.0% Ag/0.5% Cu and 95.5% Sn/3.8% Ag/0.7% Cu are used, the temperature required in a conventional solder reflow oven that is used in the chip-to-substrate attachment process to melt the solder bumps will need to be in the range of about 240° C.-250° C. The higher temperature required to melt the solder bumps in the typical chip-to-substrate attachment process will limit the type of materials that can be used for making the flip chip package, substrate and may preclude the use of low-cost organic material in making flip chip package substrates.

Since organic materials are significantly less expensive than ceramic materials, and since organic materials have other advantages over ceramic materials in an electronic package substrate, it is desirable to make flip chip electronic package from organic materials. Hence there has been and is a real need for a reliable process—different from the conventional process of using a reflow oven—for attaching flip chips with solder bumps that have high melting temperatures (in the range of about 215° C.-250° C. or higher) to flip chip substrates made of commonly used and relatively inexpensive organic materials, without damaging the substrates.

To facilitate handling in automated assembly machines that can perform operations on multiple electronic packages simultaneously, it is a common practice to join multiple electronic package substrates in a row or in a matrix or array. Typically four to six electronic package substrates are joined together by what is commonly referred to as a lead frame. For example, in making multiple thermally enhanced BGA wire bonded electronic packages, such as Tape Ball Grid Array (sometimes called by the acronym "TBGA") packages, the metal body that is used as a support member and as a heat sink often is extended to join several electronic package substrates in a row so that typically four to six electronic packages can be made simultaneously. After the multiple electronic packages are assembled, it is necessary to singulate the packages, by either sawing or stamping out the individual electronic packages. Because of the continuing need to reduce costs in the electronic package industry, it would be highly desirable to develop a frame for making multiple electronic packages that can be made of a lower cost material and that can reduce the time for fabricating multiple electronic packages and reduce the time for singulating electronic packages from the frame. This need is felt in fabricating, assembling, and singulating wire bonded electronic package and in fabricating, assembling, and singulating flip chip electronic packages.

In summary, in the electronics industry, there is a constant demand to increase the electrical performance of integrated circuits and correspondingly the electrical performance of electronic packages. There also is a constant demand to increase the reliability of an electronic package during its useful life. There also is a constant demand to decrease the cost of electronic components, including electronic packages. It should be apparent from the foregoing that there is a need for a wire bonded electronic package that can be made from fewer components than are required for current wire bonded electronic packages and that can be made with fewer and simpler process steps than are required to make current wire bonded electronic packages and that can be made at a lower cost and that can achieve high reliability and superior electrical performance. It also should be apparent from the foregoing that there is a need for a flip chip electronic package that can be made from fewer components than are required for current flip chip electronic packages, that can be made of relatively inexpensive organic materials and yet be able to accommodate and incorporate a flip chip with Pb/Sn solder bumps or solder bumps made of other alloys that melt at temperatures greater than 250° C., that can be made with fewer and briefer process steps than are required to make current flip chip electronic packages, that can be made at a lower cost than current flip chip electronic packages, and that can achieve high reliability and superior electrical performance. It also should be apparent from the foregoing that there also is a need to for electronic packages for both wire bonded chips and flip chips that incorporate means for protecting the chips against EMI and for suppressing EMI generated by the chips. It also should be apparent from the foregoing that there also is a need for electronic packages for both wire bonded chips and flip chips that incorporate means for more efficient routing and use of space to accommodate the ever increasing demand for higher density routing.

SUMMARY OF THE INVENTION

It is an object of the invention to provide electronic packages that alleviate the above drawbacks and problems and a process for making such electronic packages that reduces the cost of such electronic packages.

Briefly and in general terms, an electronic package substrate for an electronic package according to the invention includes an adhesive bonding member having two planar surfaces and an orifice there through for receiving a chip and a circuitized member having two planar surfaces, one surface being bonded to one of the planar surfaces of the bonding member, said circuitized member being electrically connectable to the chip.

In a first principal embodiment of the invention an electronic package substrate for an electronic package for a wire bonded chip or a tab bonded chip includes an adhesive bonding member having two planar surfaces and an orifice there through, a circuitized member bonded to one of the planar surfaces and having an orifice there through overlying the orifice in the bonding member, and a support member bonded to the other planar surface, blocking the orifices, and thereby forming a cavity in the electronic package substrate for receiving a chip.

In another aspect of the invention, an electronic package for a wire bonded chip or tab bonded chip includes an adhesive bonding member having two planar surfaces and an orifice there through; a circuitized member bonded to one of the planar surfaces and having an orifice there through overlying the orifice in the bonding member; a support member bonded to the other planar surface, blocking the orifices, thereby forming a cavity; and a chip bonded within the cavity to the support member and electrically connected to the circuitized member.

In a second principal embodiment of the invention an electronic package substrate for an electronic package for a flip chip includes an adhesive bonding member having two planar surfaces and an orifice there through, a circuitized member bonded to one of the planar surfaces and blocking the orifice, thereby forming a cavity for receiving a flip chip, and an array of solder pads on the circuitized member within the cavity.

In another aspect of the invention, an electronic package for a flip chip includes an adhesive bonding member having two planar surfaces and an orifice there through, a circuitized member bonded to one of the planar surfaces and blocking the orifice, thereby forming a cavity, an array of solder pads on the circuitized member within the cavity, and a flip chip mounted within the cavity and electrically connected to the solder pads.

In the preferred embodiments of the invention, the bonding member is a structural support for the electronic package substrate. The bonding member is formed from a sheet or a lamination of multiple sheets of a glass-fiber-reinforced/filled epoxy adhesive. The circuitized member is a flexible polyimide tape, with electrically conductive traces terminating in electrically conductive pads, on at least one side of the tape, thereby providing electrical pathways from pads that are connected to pads on a chip to pads that are connectable to pads on a PC board.

In the preferred embodiments of the invention, the support member in the electronic package substrate for an electronic package for a wire bonded chip or a tab bonded chip is thermally conductive thereby enhancing the heat dissipation properties of the electronic package.

In another embodiment of the invention, the support member in the electronic package for a wire bonded chip or a tab bonded chip is electrically conductive; the adhesive bonding member also is electrically conductive; the bonding member is electrically connected to the support member throughout the interface between the support member and the bonding member; the bonding member is also connected to electrically conductive pads on the circuitized member that are connectable to grounded pads on a PC board, thereby making the support member a ground plane when the electronic package is properly connected to the PC board and thereby allowing the electronic package to provide more ground connections to the chip bonded within the cavity than the number of pads required to provide ground connections to the electronic package. This embodiment also provides five of the six sides required for a Faraday Cage such that when the electronic package is connected to the PC board above a ground plane, a Faraday Cage, comprising the electronic package and the ground plane of the PC Board, provides shielding of the chip against electromagnetic interference and provides shielding of other circuit elements on the PC board against electromagnetic interference generated by the chip.

In another embodiment of the invention, the electronic package for a flip chip includes a thermally conductive secondary bonding member and a thermally conductive heat sink thereby enhancing the heat dissipation properties of the electronic package.

In another embodiment of the invention, the bonding members and the heat sink are electrically conductive and connectable to ground providing the electronic package for a flip chip with an integrated ground plane and magnetic shielding against electromagnetic interference.

Another aspect of the invention is a process for fabricating an electronic package substrate including the steps of fabricating an adhesive bonding member and a circuitized member, aligning the members with respect to each other, sandwiching the members together, and bonding the members, together with heat and pressure.

Another aspect of the invention is a process for fabricating an electronic package substrate for a thermally enhanced electronic package for a wire bonded chip or a tab bond chip including the steps of fabricating a thermally conductive support member, an adhesive bonding member, and a circuitized member; sandwiching the members together; bonding adhesively the members together with heat and pressure.

Another aspect of the invention is a process for fabricating an electronic package for a wire bonded chip or a tab bonded chip including the steps of fabricating a thermally conductive support member, an adhesive bonding member, and a circuitized member; sandwiching the members together, forming a cavity therein; bonding adhesively the members together with heat and pressure; bonding adhesively a chip to the support member within the cavity; and electrically connecting the chip to the circuitized member.

Another aspect of the invention is a process for fabricating an electronic package for a flip chip including the steps of fabricating a flip chip with solder bumps attached, an adhesive bonding member, and a circuitized member, sandwiching the members together, bonding the members together with heat and pressure, and connecting the flip chip to the circuitized member.

In a preferred aspect of the invention the flip chip is connected to the flip chip package substrate by melting the solder bumps using magnetic induction to melt the solder bumps.

Other aspects and advantages of the invention will become apparent from the following detailed description of the preferred embodiments, taken in conjunction with the accompanying drawings, illustrating by way of example the principles of the invention.

DETAILED DESCRIPTION OF PREFERRED EMBODIMENTS

Figure 1:
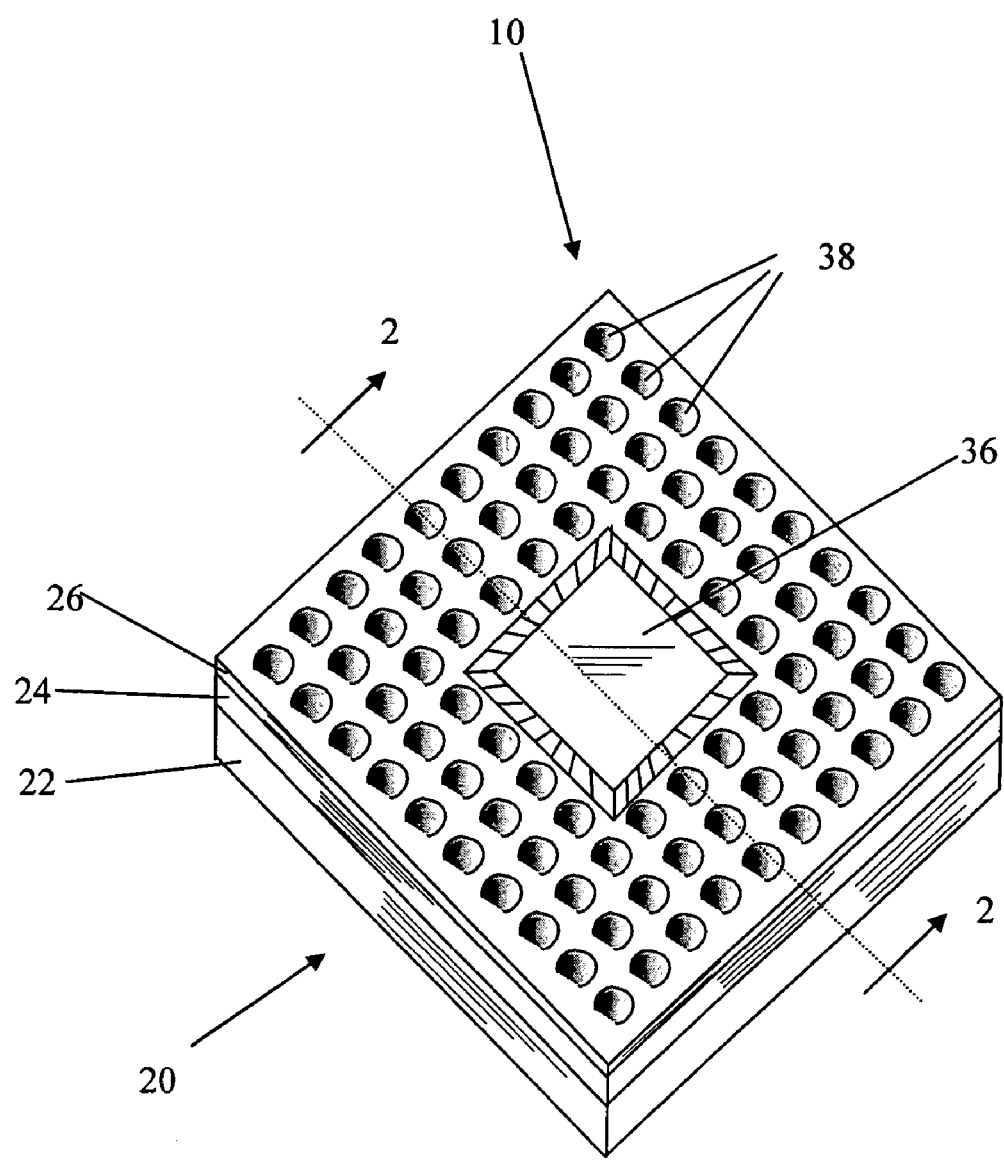
FIG. 1 is a perspective view of a thermally enhanced ball grid array (BGA) electronic package for a wire-bonded chip, embodying the principles of the invention.

As shown in the drawings for purposes of illustration, the invention is embodied in an electronic package that is manifested in two principal embodiments and the processes for making these embodiments. The first principal embodiment is an electronic package for wire bonded chips or tab bonded chips—sometimes called herein, a wire bonded electronic package. FIGS. 1-11 illustrate different aspects and embodiments of a wire bonded electronic package and processes for making wire bonded electronic packages, according to the present invention. The second principal embodiment is an electronic package for flip chips—sometimes called herein, a flip chip electronic package. FIGS. 12-26 illustrate different aspects and embodiments of a flip chip electronic package and processes for making flip chip electronic packages, according to the present invention. The structural elements and their functions that are common to both wire bonded electronic packages and flip chip electronic packages, the steps in the processes for making electronic package substrates and electronic packages that are common to both principal embodiments, and the common advancements and benefits achieved by both principal embodiments and their respective variations are apparent in the accompanying figures and the detailed description below.

As shown in the drawings for the purposes of illustration, the invention is embodied in an improved thermally enhanced ball grid array electronic package, which incorporates a chip, and is designed for connection to another device, such as a PC board, and in the method for manufacturing the electronic package.

The thermally enhanced ball grid array electronic package embodying and made in accordance with the description herein is a relatively simple structure, made from fewer components, and with fewer process steps than BGA electronic packages made according to the current teachings in the art. Yet the thermally enhanced ball grid array electronic package embodying and made in accordance with the description herein provides high reliability, excellent thermal conduction away from the embedded chip, superior electrical performance, and it is well adapted for chips that have a high circuit density, chips that operate at high speeds, and chips that have a high number of inputs and outputs. The simplicity of the design and the ease of manufacturing this electronic package results in a cost effective, reliable, high performance electronic package.

Figure 2:
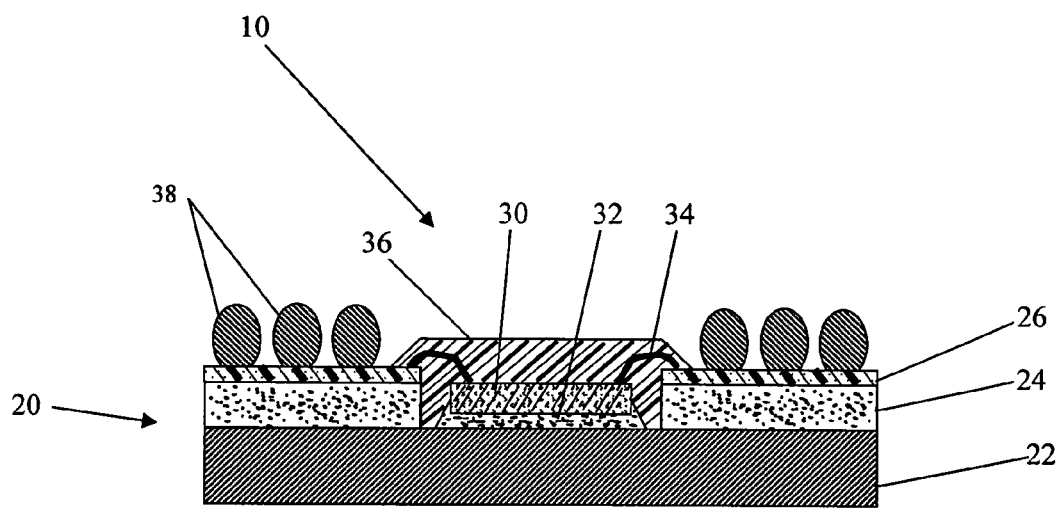
FIG. 2 is a cross-sectional view taken along line 2-2 of FIG. 1, of the thermally enhanced BGA electronic package in FIG. 1.
Figure 4:
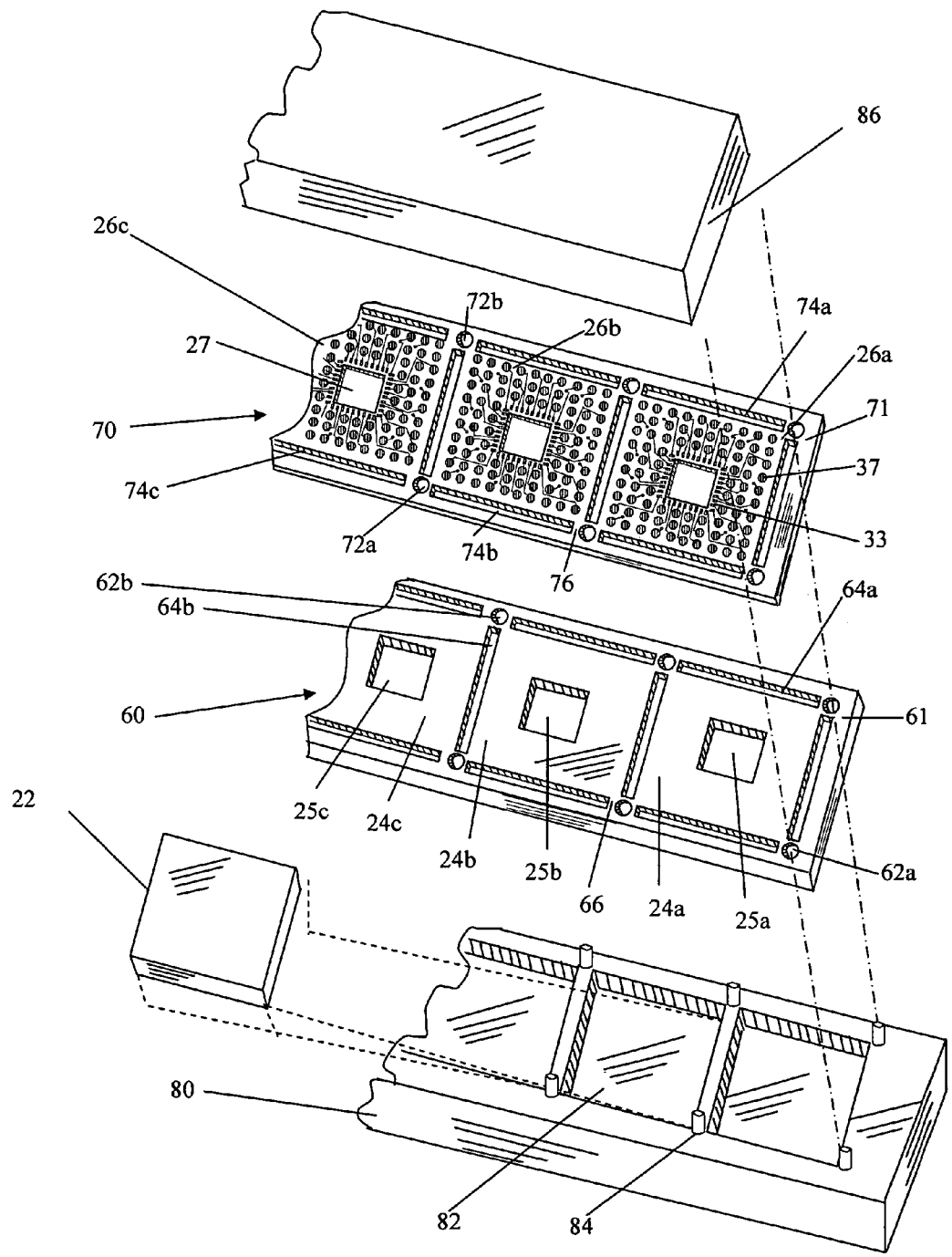
FIG. 4 is an exploded view of a support member, a partial strip of framed multiple bonding members, and a partial strip of framed multiple circuitized members that will be assembled to make multiple thermally enhanced electronic package substrates, together with a partial top and a partial bottom of the fixture used in the process of making multiple electronic package substrates in accordance with the process set forth in FIG. 3.

Referring to FIG. 1 and FIG. 2, reference numeral 10 generally indicates a ball grid array electronic package. Electronic package 10 is designed for mounting on, and electrically coupling to, an electronic structure such as a printed circuit board (not shown). Electronic package 10 has an electronic package substrate generally indicated by reference numeral 20. Electronic package substrate 20 is a laminated structure, comprising a support member 22, a bonding member 24, and a circuitized member 26. Referring to FIG. 4, which shows in perspective a partial view of a set of bonding members 24 and a partial view of a set of circuitized members 26, there is a rectangular opening or orifice 25 in bonding member 24 and a rectangular opening or orifice 27 in circuitized member 26. As shown in FIG. 2, the opening in circuitized member 26 and the opening in bonding member 24 are aligned with one another. These openings or orifices, together with the support member 22, FIG. 2, which has no opening, form a cavity for chip 30. The size and shape of the openings in bonding member 24 and circuitized member 26 correspond to the size and shape of chip 30. The openings or orifices are slightly larger than chip 30 to provide sufficient clearance so that chip 30 can be inserted into the cavity using automated chip-placing equipment. Chip 30 is bonded to support member 22 with die attach adhesive 32. The contacts for inputs/outputs of chip 30 are electrically connected to contacts on circuitized member 26 with wire bonds 34. Chip 30 and wire bonds 34 are enclosed or encapsulated by encapsulant 36. Referring to FIG. 1 and FIG. 2, ball contacts 38, connected to circuitized member 26, enable electronic package 10 to be connected to a printed circuit board (not shown).

Support member 22, which forms the base of electronic package substrate 20, is a rigid, substantially flat or planar, and substantially rectangular member. The material for support member 22 is selected to provide good thermal transfer qualities so that support member 22 can function as a heat sink for a chip. Support member 22 is preferably made of metal, such as copper or aluminum; however, other thermally conductive materials can be used. The top or contacting surface of support member 22, i.e. the surface that will be bonded to bonding member 24 and chip 30, can be treated to improve the adhesion between support member 22 and bonding member 24 and between support member 22 and chip 30. One treatment that improves chemical bonding, particularly of a copper support member 22, is to form an oxide layer, commonly known as black oxide, by exposing the contact surface of a sheet of copper from which support member 22 will be made to a chemical oxidant. Another treatment to improve the chemical bonding is to apply a chemical coating, e.g. plate the copper sheet with a thin nickel layer. Additionally, there are various techniques to improve the mechanical bonding attributes of support member 22 involving the roughening or texturing of the contacting surface. Support member 22 may vary in size and shape to correspond to the sizes and shapes (typically rectangular) specified for BGA packages in industry standards. For example, the standard size for a BGA package with 256 contacts for input/output is approximately 27 mm×27 mm. The thickness of support member 22 can vary; however, it must be thick enough to function as a stiffener and have enough thermal mass to function as a heat sink for chip 30. Generally, a copper support member in the range of about 0.7 mm to about 1.0 mm will provide adequate stiffness and thermal conductivity for most chips; in some applications a thickness of 0.5 mm may be adequate. Support members are preferably cut from a sheet of copper in sizes corresponding with conventional sizes of BGA packages. Stamping is the most economical method of cutting; however, sawing and cutting are reasonable alternatives.

The heat dissipation characteristics of electronic package substrate 20 can be enhanced further, to accommodate chips that produce substantial heat, by making support member 22 with groves and ridges in the surface of support member 22 opposite the surface to which chip 30 will be attached. The grooves and ridges increase the effective surface area of support member 22. Such improvements may allow sufficient heat dissipation for chips that produce significant heat and render it unnecessary to use an additional heat sink. Preferably the ridges and grooves are made in the sheet from which support members 22 are stamped or cut out.

Bonding member 24 bonds support member 22 to circuitized member 26 to form the laminated electronic package substrate 20. Bonding member 24 preferably is a glass-fiber-reinforced/filled epoxy adhesive, although other adhesives and other fillers may work satisfactorily. The adhesive is a "no-flow" adhesive, i.e. an adhesive that will not flow substantially under a given set of temperature, pressure and time conditions, during its curing. The adhesive preferably is reinforced or filled with glass fibers, silica spheres or other particles to control the co-efficient of thermal expansion of the adhesive. A raw material commonly used to manufacture circuit boards, known in the industry as FR4, has the right properties and is a suitable material from which to make bonding members 24. (The acronym FR is short for fire resistant.) Another material that can be used to make bonding member 24 is known in the industry as BT resin or merely BT. BT resin is supplied by Mitsubishi Corporation of Japan. The glass fiber reinforced/filled epoxy adhesive initially is introduced into the process of making electronic package substrate 20, as a solid sheet, or as a laminate of multiple thinner solid sheets, of the adhesive in a partially cured or "B-stage" cured condition. The glass fiber reinforced/filled epoxy adhesive, such as FR4, in a B-stage cured condition, is relatively stiff, not sticky, relatively stable, and relatively easy to handle. In the bonding and curing process, the glass fiber reinforced/ filled epoxy adhesive flows sufficiently under higher temperatures and pressures to fill in gaps, forms mechanical and chemical bonds with support member 22 and circuitized member 26, and forms additional cross linkages in the adhesive making it more rigid and more stable for long term reliability. Although FR4 has been used in making electronic packages before, the adhesive properties of FR4 have not been generally appreciated, and the ability of FR4 or other glass fiber reinforced/filled epoxy adhesives to be used as the actual bonding agent to bond a circuitized structure to a support structure or to a heat sink has been given little or no recognition.

In the prior art, the adhesive that is used to bond the metal heat sink or a stiffener to a circuitized member is applied as a thin layer of a viscous, but flowable or deformable paste that is applied to the metal heat sink. The adhesive then is cured to form a rigid bond. A relatively thin layer of adhesive, as used in the prior art, is not as effective in absorbing the energy and stresses or accommodating the strains to which an electronic package is subjected, as well as a solid sheet of adhesive, which is essentially a thick layer of adhesive. The solid sheet of glass fiber reinforced/filled epoxy adhesive used in making electronic package substrate 20 can absorb greater stresses and energy and accommodate larger strains thereby providing greater reliability and integrity to the electronic package. Bonding member 24 functions as both an adhesive and as a structural member of electronic package substrate 20. In addition to functioning as an adhesive, bonding member 24 provides a structure and form to electronic package substrate 20.

The thickness of bonding member 24 may vary from one electronic package to another and is governed by the thickness of circuitized member 26, the thickness of chip 30, and the thickness of die attach adhesive 32 used to bond chip 30 to support member 22. In the preferred embodiment, bonding member 24 is of sufficient thickness such that the sum of the thickness of bonding member 24 plus the thickness of circuitized member 26 is slightly greater than the sum of the thickness of chip 30 and the thickness of die attach adhesive 32. By so adjusting the thickness of bonding member 24, the top surface of chip 30 will be slightly below the top surface of circuitized member 26. This arrangement minimizes the overall length of wire bonds 34 in a conventional wire bonding operation and allows wire bonds 34 to be fully encapsulated, while keeping the surface of encapsulant 36 from extending beyond the top of ball contacts 38. It is important that encapsulant 36 not extend beyond the top of the ball contacts 38, lest encapsulant 36 touch the surface of the circuit board to which electronic package 10 ultimately will be attached and interfere with the mechanical and electrical connections between ball contacts 38 and their corresponding solder pads on a circuit board (not shown). There should be sufficient space between the top of encapsulant 36 and the circuit board to permit cleaning between electrical package 10 and the circuit board after electrical package 10 is mounted onto the circuit board. Chips currently range in thickness from 170 microns to 560 microns. The thickness of die attach adhesive used to bond chips to support member 22 may range from about 25 microns to about 75 microns. Hence the combined thickness of bonding member 24 and circuitized member 26 may range from about 195 microns to greater than about 635 microns.

Circuitized member 26 preferably is a circuit on a flexible tape, preferably comprised of a polyimide substrate with conductive traces provided for interconnecting the input and output terminals of the chip to the external terminals of the package. Typically and preferably the conductive traces are photolithographically developed on the polyimide substrate. Alternatively, circuitized member 26 is made using a multi-layered polyimide substrate. Alternatively, the substrate for circuitized member 26 is a single or multilayered organic material, such as FR4 or BT resin or similar material. Conductive traces preferably are photolithographically developed on such alternative substrates. Circuitized member 26 is designed and fabricated to conform to the size, form factor, and the number and arrangement of input/output terminals on chip 30. Referring to FIG. 4, there is a generally rectangular opening or orifice 27 in circuitized member 26, corresponding to the size and shape of opening 25 in bonding member 24, and providing sufficient clearance so that chip 30 can be inserted into the cavity, formed in part by opening or orifice 27 in circuitized member 26. Again referring to FIG. 4, there are wire bond pads 33 on the topside of circuitized member 26, surrounding opening 27, for connecting wire bonds 34 to corresponding wire bond pads (not shown) on chip 30. Wire bond pads 33 are connected to or form a part of the conductive traces that run outwardly from opening 27. Circuitized member 26 can have conductive traces on one or both sides of the polyimide or alternative substrate. These conductive traces are part of the electrical pathways for connecting chip 30 to an external component. If there are traces on both sides of the substrate, electrical vias through the substrate will connect the conductive traces on the bottom side to pads or traces on the top side. Referring again to FIG. 4, there also are ball contact pads 37, which are connected to or form part of the conductive traces, on the topside of circuitized member 26, onto which ball contacts 38, FIG. 2, can be attached. Since ball contacts 38 typically, and in the preferred embodiment, are solder balls, ball contact pads 37, FIG. 4, on circuitized member 26 are frequently called solder ball pads. In a preferred embodiment, a thin insulative layer, often called a solder mask, not shown, covers the conductive traces on the top side of circuitized member 26, with openings or holes in the solder mask in the locations where there are wire bond pads 33 or ball contact pads 37, enabling mechanical and electrical connections to be made to these pads while protecting and insulating the rest of the traces. If there are conductive traces on the bottom of circuitized member 26, a second thin insulative layer, or solder mask, covers these conductive traces as well.

Chip 30, FIG. 2, can be any chip with contact pads for inputs/outputs on the chip. Electronic package 10 is particularly well suited for chips that operate at high frequencies, chips with high circuit density, and any chips that generate substantial heat during operation that must be dissipated for reliable operation. Electronic package substrate 20 and electronic package 10 can be used to package a plurality of chips.

Referring to FIG. 2, chip 30 is secured to support member 22 of electronic package substrate 20, electrically connected to circuitized member 26, and protected from the environment, using conventional materials. Die attach adhesive 32, used to attach chip 30 to support member 22 of electronic package substrate 20, is a thermally conductive, dielectric adhesive, preferably a thermally conductive, dielectric epoxy. Wire bonds 34, which connect chip 30 to circuitized member 26, are electrical conductors, preferably gold wires. Encapsulant 36, which covers or encapsulates chip 30 and wire bonds 34, is preferably an epoxy resin compound; however any non-reactive, non-conductive material that provides mechanical integrity would be satisfactory.

Ball contacts 38, shown in an array in FIG. 1 and FIG. 2, are used to connect electronic package 10, both mechanically and electrically to an array of pads on a circuit board, not shown, to electrically integrate the chip with or into other circuitry on the circuit board. Solder balls are the preferred ball contacts 38. The use of an array of solder balls for connecting an electronic package to a circuit board gives rise to the term, ball grid array or BGA package, associated with electronic package 10. FIG. 1 depicts an array of only 84 solder balls, for ease of illustration; many BGA packages have arrays containing several hundreds of solder ball connections.

Figure 3:
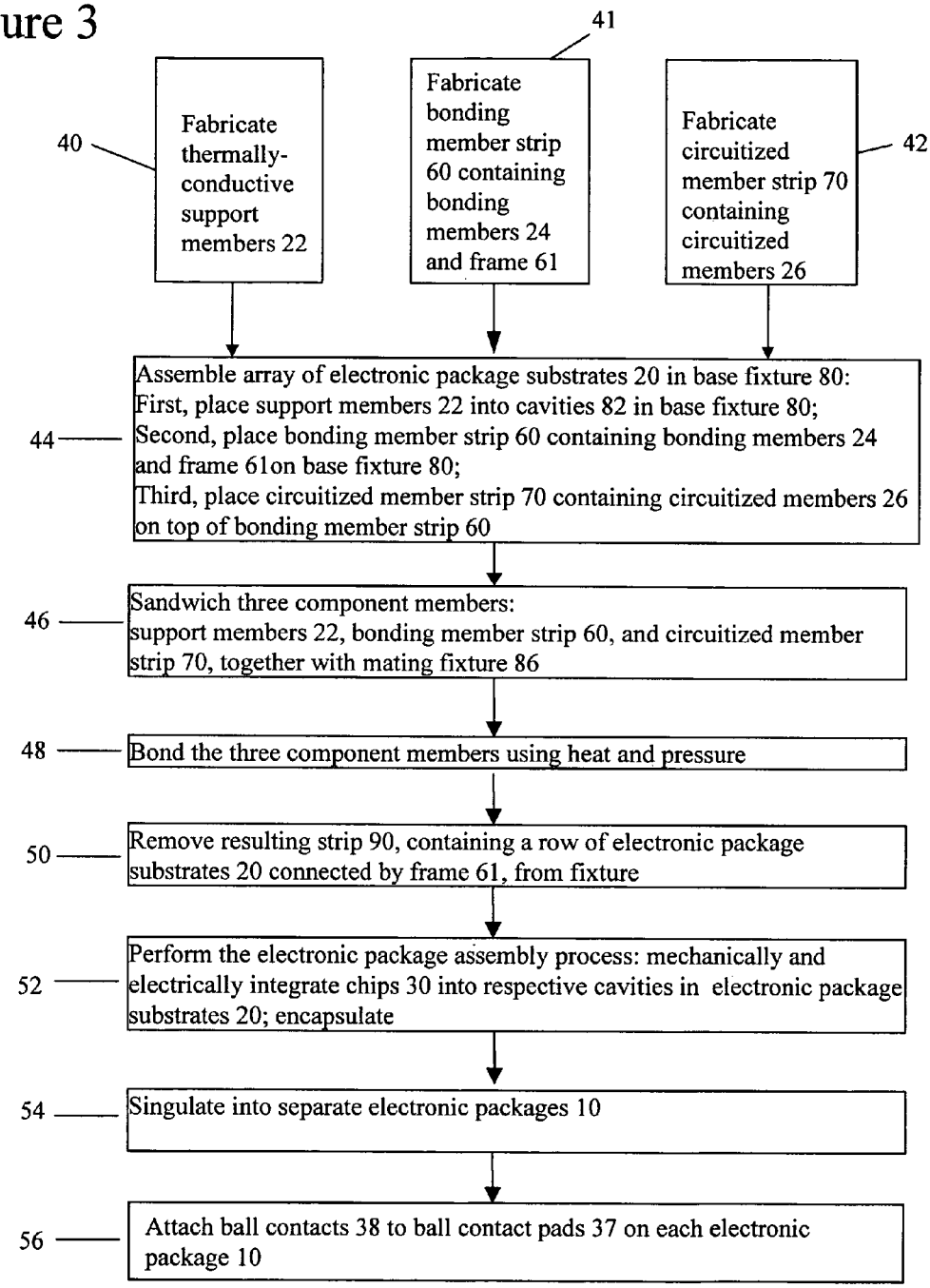
FIG. 3 is a flow diagram of a process for making thermally enhanced BGA electronic packages for wire-bonded chips in accordance with the present invention.

FIG. 3 shows a process flow diagram for making electronic package 10. In FIG. 3, reference numerals 40 through 50 identify the operations for making electronic package substrates 20 in batches. References 52 through 56 identify the package assembly process for making electronic package 10 in batches after electronic package substrate 20 has been fabricated. FIG. 4 shows an exploded view of the components of electronic package substrate 20, together with a fixture used in the method of fabricating electronic package substrate 20 recited in FIG. 3.

Referring to FIG. 3, in fabricating electronic package substrates 20, thermally conductive support members 22 are fabricated in a separate operation, indicated by reference numeral 40. Thermally-conductive support members 22, in the preferred method, are formed as flat pieces or slugs from a copper sheet by stamping, using conventional dies, to produce sizes corresponding to the sizes for the BGA packages desired, for example 27 mm×27 mm for electronic packages with a nominal solder ball count of 256. Starting with a copper sheet that is approximately 1.0 mm thick will generally ensure that the copper slugs, which will become support members 22, will provide adequate stiffness in electronic package substrates 20. It will be necessary to use a thicker sheet if the particular chip, for which electronic package substrate 20 is being fabricated, generates more heat than can be dissipated by a 1.0 mm copper slug.

As presented in FIG. 3, bonding members 24 are fabricated in a separate operation, indicated by reference numeral 41. Although bonding member 24 ultimately is used in the length and width shown in FIG. 1 and FIG. 2, i.e. the same length and width as support member 22, and can be fabricated into these sizes for making a single electronic package substrate 20, it is preferable to begin the fabrication of electronic package substrates 20 and electronic packages 10 with the material for bonding member 24 in a size much larger than support member 22, preferably in a strip that is fabricated to include not only multiple bonding members 24, but also a frame connecting the bonding members. The incorporation of a frame and the fabrication of a set of multiple bonding members 24 connected by the frame in a single strip of material facilitates assembling multiple electronic packages simultaneously, in the electronic package assembly operation. The properties of the adhesive material used to form bonding member 24 enable a relatively easy and very cost effective method for fabricating strips of electronic package substrates 20 in batches and for assembling strips of electronic packages 10 in batches. There is a significant cost reduction in being able to assemble more than one electronic package 10 at a time, as well as a cost reduction in being able to fabricate more than one electronic package substrate 20 at a time.

In fabricating bonding member 24 as single units or, as preferred, in fabricating bonding member 24 in strips, or even multiple strips, each of which contains multiple bonding members 24, the process begins preferably with a sheet of a glass-fiber-filled epoxy adhesive, such as FR4, that is in a B-stage or partially cured condition. This raw material is generally commercially available in various thicknesses in rolls or in sheets. If a single sheet of the commercially available adhesive material does not provide the proper thickness for bonding member 24, multiple layers of the adhesive material can be laminated to produce a sheet of the required or desired thickness. The required thickness of the sheet is determined primarily by the thickness of the chip for which the electronic package substrates 20 are being fabricated. The sheet should be of a thickness such that the sum of the thickness of the sheet, which will become bonding member 24, plus the thickness of circuitized member 26 is slightly greater than the sum of the thickness of chip 30 and the thickness of die attach adhesive 32. Although individual bonding members 24 can be cut or punched from the sheet, it is preferable to divide the sheet into multiple strips, and layout, on each of these strips, a row of multiple individual bonding members 24, surrounded by a frame, with holes for aligning the frame and the individual bonding members 24 in a fixture, and with slots between adjacent individual bonding members 24 and slots between the individual bonding members 24 and the frame, for later singulating the individual electronic package substrates 20 from the framed row. The holes and slots can be punched out from the adhesive sheet or the adhesive strips. FIG. 4 shows, inter alia, a perspective view of a portion of bonding member strip 60, a strip of adhesive material containing multiple bonding members 24 (e.g., 24a, 24b, and 24c) and frame 61, surrounding bonding members 24. Frame 61 is the adhesive material surrounding the individual bonding members 24. Frame 61 holds the individual bonding members 24 together in a row while the electronic package substrates 20 are fabricated and holds the electronic package substrates 20 together in a row while the electronic packages 10 are assembled. Frame 61 is discarded when the individual electronic package substrates 20 are singulated—generally after the row of multiple electronic packages 10 have been assembled. FIG. 4 shows opening 25a in bonding member 24a, opening 25b in bonding member 24b, and opening 25c in bonding member 24c. FIG. 4 also shows the several alignment holes 62 and slots 64 that demarcate the edges of bonding members 24. In fabricating bonding member strip 60, opening 25 for each bonding member 24, alignment holes 62 for the framed row (e.g. 62a and 62b) and slots 64 for the framed row (e.g. 64a and 64b) are punched out or routed out either in the sheet of glass-fiber-filled epoxy adhesive before it is cut into strips or after the sheet is cut into strips. Slots 64 facilitate singulating separate electronic packages from the framed row after the electronic packages 10 have been assembled. The sheet of glass-fiber-filled epoxy adhesive can be punched or sawn to form bonding member strips 60 in the appropriate length of strips that can be accommodated in the fixture for laminating electronic package substrates 20 or the fixtures used in the electronic package assembly process.

As presented in FIG. 3, circuitized members 26 are fabricated in a separate operation, indicated by reference numeral 42. Although circuitized member 26 ultimately is used in sizes appropriate for electrically connecting chips in an individual package, and can be fabricated into these sizes for making a single electronic package substrate 20, the more common practice is to make circuitized members 26 in a strip form, for example as a circuitized member strip, containing multiple, identical circuitized members 26. FIG. 4 shows, inter alia, a perspective view of a portion of circuitized member strip 70, a polyimide tape containing multiple circuitized members (e.g. 26a, 26b, and 26c) and frame 71, surrounding circuitized members 26. Frame 71 is the polyimide material surrounding the individual circuitized members 26. Frame 71 holds the individual circuitized members 26 together in a row while the electronic package substrates 20 are fabricated and augments frame 61 in holding the electronic package substrates 20 together in a row while the electronic packages 10 are assembled. Frame 71 is discarded when the individual electronic package substrates 20 are singulated—generally after the row of multiple electronic packages 10 have been assembled. FIG. 4 also shows alignment holes 72 (e.g. 72a and 72b) and slots 74 (e.g. 74a, 74b, and 74c) surrounding each circuitized member 26. Opening 27 in circuitized member 26 corresponds in size and shape with opening 25 in bonding member 24. Slots 74 facilitate singulating individual electronic packages 10 after the package assembly process.

Referring to FIG. 4, slots 64 and alignment holes 62 in bonding member strip 60 and slots 74 and alignment holes 72 in circuitized member strip 70 essentially define the edges of bonding members 24 and circuitized members 26 respectively. These slots and holes are located and can be punched or routed to make the ultimate size and shape of bonding members 24 and circuitized members 26 the same as the size and shape of support members 22.

Referring to FIG. 3, the operations designated by reference numerals 40, 41, and 42 can be performed in any sequence, but necessarily precede the operation in which the members fabricated in the operations designated by reference numerals 40, 41, and 42 are combined and assembled to form electronic package substrate 20. Reference numeral 44 refers to the process of assembling support members 22, bonding members 24, and circuitized members 26. To assemble these components a special fixture is used to sandwich the components. FIG. 4 shows a perspective view of a portion of base fixture 80, showing cavities 82 and alignment pins 84. Base fixture 80 preferably is made of steel or aluminum. Base fixture 80 can have an arbitrary number of cavities 82. Base fixture 80 is shown, for ease of illustration, in FIG. 4, as having a single row of cavities; however, a fixture having a two dimensional array of cavities, accommodating multiple bonding member strips 60 and multiple circuitized member strip s 70 may be used. As indicated at reference numeral 44, FIG. 3, and as shown in FIG. 4, support members 22 are inserted into cavities 82 of base fixture 80. Typically the depth of cavities 82 in base fixture 80 is the same as the thickness of support members 22, so that cavities 82 fully engage support members 22. After cavities 82 are filled with support members 22, bonding member strip 60 is placed on base fixture 80 such that alignment holes 62 of bonding member strip 60 slide over alignment pins 84 in base fixture 80. Next, circuitized member strip 70 is placed on top of bonding member strip 60, with alignment holes 72, in circuitized member strip 70, sliding over alignment pins 84, in base fixture 80. As indicated by reference numeral 46, FIG. 3, and FIG. 4, mating fixture 86 is placed on top of circuitized member strip 70, thereby sandwiching support members 22, bonding member strip 60, containing bonding members 24 connected by frame 61, and circuitized member strip 70, containing circuitized members 26 connected by frame 71, between base fixture 80 and mating fixture 86. Mating fixture 86 has receiving alignment holes in its mating surface (not shown) that engage alignment pins 84 in base fixture 80. Alignment pins 84 in base fixture 80, alignment holes 62 in bonding member strip 60, and alignment holes 72 in circuitized member strip 70 insure that support members 22, bonding members 24, and circuitized members 26 are properly aligned and especially that opening 25 in each bonding member 24 and opening 27 in each circuitized member 26 are aligned. Pressure is applied to base fixture 80 and mating fixture 86, thereby compressing support members 22, bonding member strip 60, containing bonding members 24 and frame 61, and circuitized member strip 70 containing circuitized members 26 and frame 71. The assemblage is then heated under pressure causing bonding members 24 to bond to support members 22 and bonding member strip 60 to bond to circuitized member strip 70, as indicated in reference numeral 48, FIG. 3. Under the appropriate temperature and pressure the glass fiber reinforced/filled epoxy adhesive comprising bonding member strip 60 will flow or deform sufficiently to increase the bonding between support member 22 and bonding member 24; however, the material will not flow or deform so as to substantially change or distort opening 25 in bonding member 24. Under the appropriate temperature and pressure the glass fiber reinforced/filled epoxy adhesive comprising bonding member strip 60 forms additional cross links and cures, becoming stiff and fairly rigid when cooled. Although the ideal set of temperature, pressure, and time may vary for different adhesive chemistries, heating the assemblage to a temperature of 170° C., at a pressure of 150 psi, for 30 minutes generally produces satisfactory results with epoxy-type adhesive chemistries.

After support members 22, bonding member strip 60, containing a set of bonding members 24 connected by frame 61, and circuitized member strip 70, containing a set of circuitized members 26 connected by frame 71, have bonded and bonding member strip 60 has cured, what is then a row of fully formed electronic package substrates 20, surrounded and connected by frame 61 (which is now laminated to frame 71), is removed from the fixture, as indicated by reference numeral 50. Since frame 61, to which frame 71 is laminated, is stiff and fairly non-deformable, frame 61 facilitates handling and transporting the set of electronic package substrates 20. The orifice or opening 25 in bonding member 24 and the orifice or opening 27 in circuitized member 26, together with the top or contacting surface of support member 22, which is now bonded to bonding member 24, form a cavity, into which chip 30 is bonded during the package assembly process.

Figure 5:
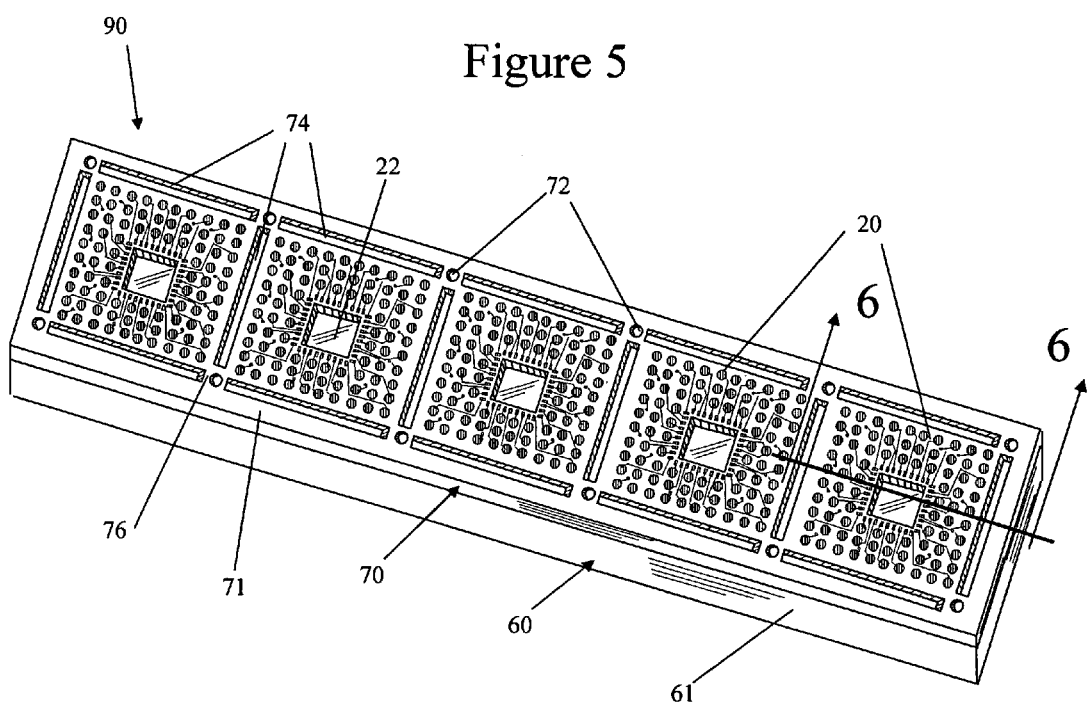
FIG. 5 is a perspective view of a strip of electronic package substrates, resulting from the manufacturing process set forth in FIG. 3, after support members, bonding members, and circuitized members have been bonded together.

Referring to FIG. 5, reference numeral 90 generally refers to a strip of electronic package substrates 20, as they appear when removed from the fixture. Strip 90 is essentially a lamination of circuitized member strip 70, containing a set of circuitized members, bonded on top of bonding member strip 60, which contains a set of bonding members (only partially visible in FIG. 5), and with a set of support members (only partially visible in FIG. 5) bonded underneath bonding member strip 60. In this depiction, strip 90 contains a set of five electronic package substrates 20, connected and supported by frame 61 (only the edge is visible in FIG. 5), to which frame 71 is laminated. Alignment holes 72 and slots 74 in circuitized member strip 70 are in registration with alignment holes 62 (not visible in FIG. 5) and slots 64 (not visible in FIG. 5) in bonding member strip 60. Support member 22 is shown forming the base of the cavity below the walls of the orifice or opening of each circuitized member and the orifice or opening of each bonding member. In this view the only portion of each bonding member that is visible is the edge surrounding the opening or orifice in the bonding member, which forms part of the walls of each cavity.

Figure 6:
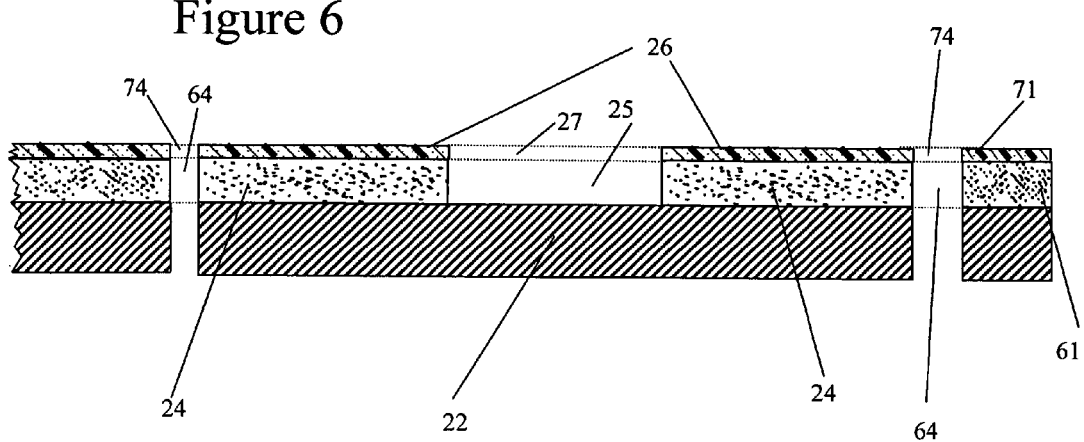
FIG. 6 is a cross-sectional view, taken along line 6-6 of FIG. 5, of the strip of electronic package substrates of FIG. 5.

FIG. 6 shows a cross section through a portion of strip 90, FIG. 5, including one electronic package substrate 20; slots 74 and 64, in circuitized member strip 70 and bonding member strip 60 respectively, on each side of electronic package substrate 20; and frames 71 and 61, which form the right hand edge of strip 90 as depicted in FIG. 5. FIG. 6 also shows more clearly opening 25 in bonding member 24 and opening 27 in circuitized member 26, which openings, in conjunction with support member 22, provide the cavity for chip 30 (not shown in either FIG. 5 or FIG. 6).

In the prior art, the usual process to fabricate a strip or row of electronic package substrates was to fabricate a metal lead frame; mill, stamp, or etch cavities in the lead frame; then apply a thin layer of an adhesive paste to the lead frame; then put a flexible tape or circuitized member on top of the adhesive paste; and then laminate the structure. FIG. 3 and FIG. 4 show a much simpler process for fabricating a strip of electronic package substrates 20, such as strip 90 in FIG. 5. Not only is the process much simpler, but there is less waste and less toxic byproducts employed in the processes shown in FIG. 3 and FIG. 4 compared to prior processes. Resulting strip 90 of electronic package substrates 20, conveniently joined and easily handled by a laminated frame comprised of frame 61, which is composed of the same material as bonding members 24 and is essentially an extension of bonding members 24, and frame 71, which is composed of the same material as the substrate used in circuitized members 26, is a far simpler and far more cost-effective strip of electronic package substrates than available in the prior art.

Reference numeral 52, FIG. 3, refers to the package assembly process. Strip 90, FIG. 5, is placed in an appropriate fixture. Thermally conducting die attach adhesive 32, FIG. 2, is applied to support member 22, which forms the base or bottom wall of the cavity in electronic package substrate 20. Chip 30 is then placed and pressed into the cavity. Because circuitized member 26 and bonding member 24 have openings that are aligned with one another and that correspond to the size of chip 30, for which electronic package substrate 20 has been fabricated, chip 30 is easily inserted through the openings in circuitized member 26 and bonding member 24, so that the back side (or the bottom) of the chip can be bonded to support member 22. Because support member 22 provides excellent planarity along the entire base of the cavity; and because there are perpendicular intersections—rather than rounded transitions—where support member 22 meets the opening 25 of bonding member 24; and because opening 25 in bonding member 24 has perpendicular walls forming the sides of the cavity, the cavity in electronic package substrate 20 can be made with closer tolerances for chip 30 than cavities typically are made in prior art electronic package substrates. Because of the superior planarity of support member 22, compared to the base or bottom wall in the cavities in prior art electronic package substrates, chip 30 can be attached more securely to support member 22, than is often the case in attaching chips to the bases or bottom walls of cavities in prior art electronic package substrates. After die attach adhesive 32 cures and bonds chip 30 to support member 22, chip 30 is electrically connected to circuitized member 26, using techniques, such as wire bonding, as shown in FIG. 2. Because chip 30 can be positioned much closer to the walls of opening 25 in bonding member 24 and opening 27 in circuitized member 26, wire bonds 34 that connect chip 30 to circuitized member 26 can be made shorter than is typically the case in wire-bonding chips to prior art electronic package substrates with stamped or etched cavities. The shorter wire bonds enable higher electrical performance of electronic package 10 over electronic packages using prior art electronic package substrates. In prior art etched cavities the length of the rounded bottom from the edge of the wall to the point where it becomes planar with the base of the cavity is, as a rule of thumb, half the depth of the etched cavity. For a typical etched cavity the depth may be approximately 450 microns, therefore the length of the rounded bottoms at the base of the etched copper stiffener is approximately 225 microns. The depth of the cavity is a sum of the thickness of the die attach, chip and height of wirebonds from the surface of the chip surface to the surface of the circuitized member. Because of the rounded bottom, the chip has to be placed at least 225 microns away from the edge of the cavity wall, otherwise the chip may tilt and thereby cause wire bonding and reliability issues. Placing the chip 225 microns from the wall of the copper stiffener causes an increase in the wire bond length by at least 225 microns. The average length of wire bonds range from 1000 microns to 2500 microns. Therefore, the current method of constructing the electronic package substrate has the potential of decreasing the length of the wirebond by approximately 225 microns. A decrease of 225 microns in the length of the wirebond, translates to about 9% to 22.5% of the current range of lengths of wirebonds and can result in a significant improvement in the electrical performance.

Chip 30 and wire bonds 34 are encapsulated with a polymeric compound, preferably an epoxy resin. Encapsulant 36 protects chip 30 and wire bonds 34, providing additional mechanical integrity and protection from the environment.

After chips 30 are mounted in and electrically connected to electronic package substrates 20 and encapsulated, there are two remaining steps in the package assembly process: singulating the strip of electronic packages into separate electronic packages 10, indicated by reference numeral 54, FIG. 3, and attaching ball contacts 38, FIG. 1 and FIG. 2, to ball contact pads on each electronic package 10, indicated by reference numeral 56, FIG. 3. These steps can be performed in either order, depending upon the equipment in the package assembly facility. Ball contacts 38 are attached to the ball contact pads 37 on circuitized member 26 using standard pick and place equipment and heating ball contacts 38 until the solder melts and fuses to the pads.

The strip of electronic packages can be singulated by sawing or punching. Slots 64 and 74, FIG. 4, facilitate punching and sawing. The small tabs 66 and 76, shown on FIG. 4 and FIG. 5, between slots 64 (and 74) and alignment holes 62 (and 72) are easily sawed or punched out, freeing the individual electronic packages 10 from frame 61 and frame 71, which were laminated in the bonding step, reference numeral 48, FIG. 3. Frame 61 and frame 71 are discarded, leaving individual electronic packages 10.

Using a solid glass-fiber-reinforced/filled epoxy adhesive as both a bonding member 24 that bonds circuitized member 26 to support member 22, and as a frame 61 for strip 90 of electronic package substrates 20 has several advantages over the use of a metal lead frame, as taught in the prior art. Singulating electronic packages 10 from strip 90 by punching out the tabs 66 and 76 is faster and more easily adapted to a high volume production, with resulting lower cost of production. Electronic packages can be punched from a frame made from a glass fiber reinforced/filled epoxy adhesive without significant risk to the electronic packages. If electronic packages are punched from a metal lead frame, there is a risk that the metal will bend and put stresses on the electronic packages. Sawing requires more time than punching and is not as easily adapted to high volume production.

By making a frame from the solid sheet of adhesive from which the bonding members are fabricated, instead of using a metal lead frame with a relatively thinner layer of viscous, paste adhesive—used merely to bond the lead frame to a flexible tape, the cost of the frame for connecting and supporting the row of electronic package substrates is reduced significantly. The prior art has taught using an adhesive in a thin layer to merely bond a flexible tape or circuitized member to a metal support member or metal lead frame. In electronic package 10, the solid adhesive bonding member strip 60 serves (1) as a means to bond circuitized members 26 to metal support members 22, (2) as a structural member becoming the walls of the cavity in which the chip is placed, (3) as a height-adjusting member to adjust the height or depth of the cavity in which a chip is placed and bonded to achieve the optimum depth of the cavity for optimizing the length of the wire bonds and the amount of encapsulant used, and (4) as a frame, in lieu of a separate and more expensive metal frame, for connecting and transporting the row of electronic package substrates. Electronic packages made in accordance with these teachings are simpler and more economical to make and have many advantages over electronic packages made in accordance with the teachings of the prior art.

Figure 7:
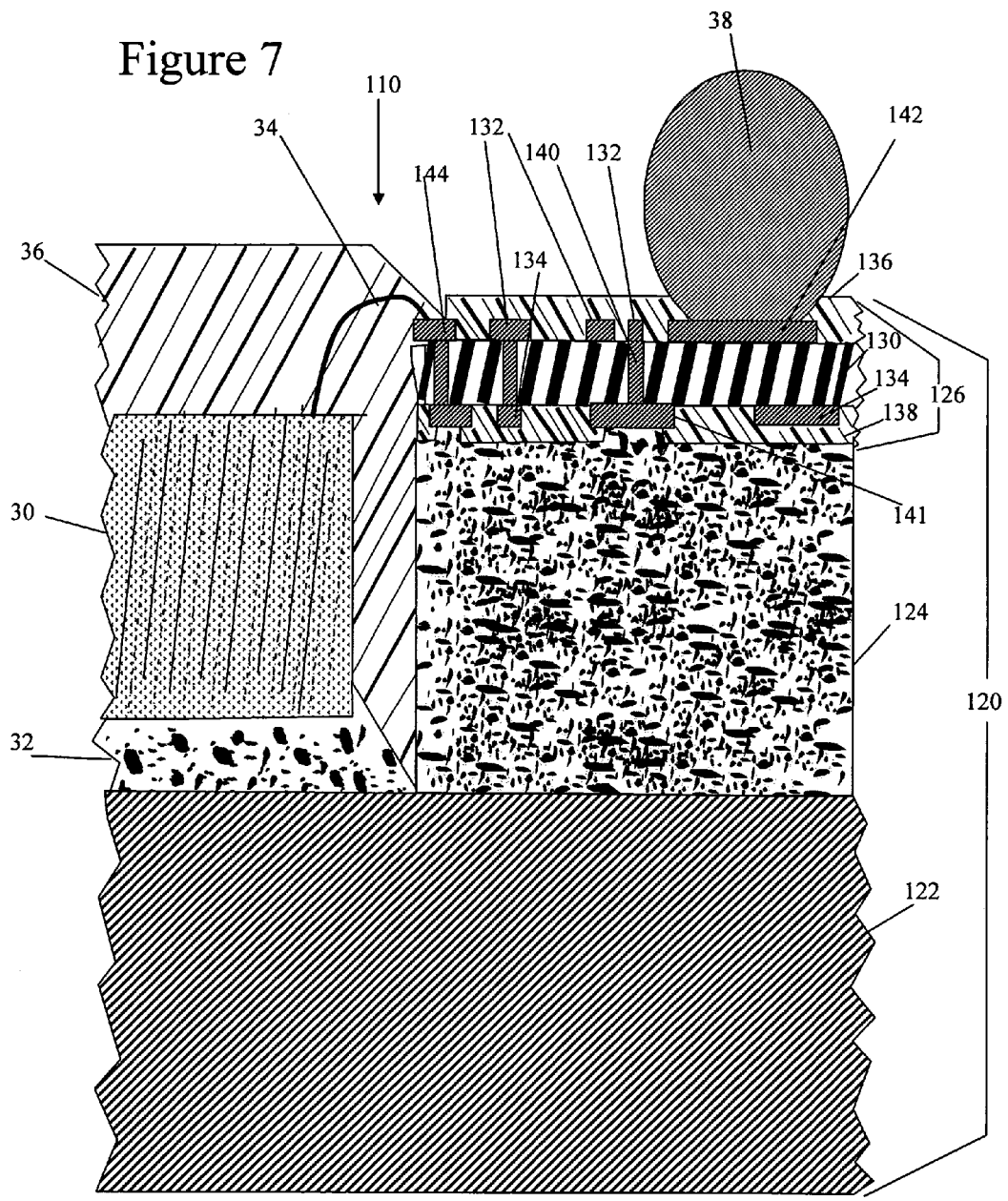
FIG. 7 is a much enlarged, cross-sectional view of a first alternative embodiment of a thermally enhanced BGA wire bonded electronic package in accordance with the present invention.

Because the adhesive used to bond support member 22 to circuitized member 26 is not merely a thin layer of adhesive, but also a structural member, which forms the walls of the cavity in which a chip is placed, it is possible to fabricate alternative specialized embodiments of electronic package 10 with additional new features. FIG. 7 shows a partial cross section of a first alternative embodiment of the electronic package for a wire bonded chip in which the bonding member is made from an adhesive that is electrically conductive, and the support member is both thermally conductive and electrically conductive, allowing the support member and the bonding member to act as a very large, integrated ground plane. This integrated ground plane enables making ground connection from the ground plane to ground terminals on the chip without requiring a separate electrical path and a corresponding solder ball connection to the PC Board for every ground terminal on the chip. This enables the electronic package to handle more chip I/Os than solder balls on the electronic package. This integrated ground plane also will provide shielding against electromagnetic interference (EMI) on five sides of the enclosed chip. Preferably the inner array of ball contacts or solder balls—the rows and columns closest to the chip—are connected to ground, thereby providing a grounded skirt adjacent to the chip cavity at the base of the electronic package. Preferably there is a ground plane in the PC board underneath the area where the chip will be located when the electronic package is attached to the PC board. Then there will be in essence a Faraday cage surrounding the chip. The electrically conductive support member forms the top of the cage; the electrically conductive bonding member forms the four sides of the cage; the array of grounded solder balls forms an extension of the four walls of the cage; the ground plane in the PC board forms the base of the cage. Thus this innovative electronic package, in collaboration with an accommodating PC board, provides shielding against EMI equivalent to a Faraday cage, without the high cost of constructing a separate Faraday cage, and without the extra space required for a separate Faraday cage.

Referring to FIG. 7, reference numeral 110 generally indicates a first alternative embodiment of a thermally enhanced BGA electronic package for a wire bonded chip. Like electronic package 10, electronic package 110 includes an electronic package substrate, indicated generally by reference numeral 120. Like electronic package substrate 20 of electronic package 10, electronic package substrate 120 of electronic package 110, is a laminated structure comprising a support member 122, a bonding member 124, and a circuitized member 126.

Support member 122, FIG. 7, which forms the base of electronic package substrate 120, is a rigid, substantially flat or planar, and substantially rectangular member. The material for support member 122 is selected to provide good thermal transfer qualities so that support member 122 can function as a heat sink for a chip. The material for support member 122 also must be a good electrical conductor. Support member 122 preferably is made of copper; however, support member 122 can be made of aluminum or other thermally and electrically conductive material. The top or contacting surface of support member 122, i.e. the surface that will be bonded to bonding member 124 and chip 30, can be treated to improve the adhesion between support member 122 and bonding member 124 and between support member 122 and chip 30. One treatment of a metallic surface, particularly of a copper, that improves its chemical bonding with an adhesive is to apply an electrically and thermally conductive chemical coating, e.g. plate the copper sheet with a thin nickel layer. Additionally, there are various techniques to improve the mechanical bonding attributes of a metal, involving the roughening or texturing of the contacting surface. These techniques include mechanical, electrical, and chemical processes that are employed in the metal processing arts. Certain treatments, such as forming an oxide coating, that can be used in making support member 22, FIG. 2, cannot be used in making support member 122. Only those processes or coatings that will leave the contacting surface of support member 122 electrically conductive can be employed. Any techniques that would leave an electrically insulative layer on support member 122 must be avoided.

Support member 122 may vary in size and shape to correspond to the sizes and shapes (typically rectangular) specified for BGA packages in industry standards. For example, the standard size for a BGA package with 256 contacts for input/output is approximately 27 mm×27 mm. The thickness of support member 122 can vary; however, it must be thick enough to function as a stiffener and have enough thermal mass to function as a heat sink for chip 30. Generally, a copper support member 122 in the range of about 0.7 mm to about 1.0 mm will provide adequate stiffness and thermal conductivity for most chips; in some applications a thickness of 0.5 mm or less may be adequate. Support members are preferably stamped or cut out from a sheet of copper in sizes corresponding with conventional sizes of BGA packages.

The heat dissipation characteristics of electronic package substrate 120 can be enhanced further, to accommodate chips that produce substantial heat, by making support member 122 with groves or ridges in the surface of support member 122 opposite the surface to which chip 30 will be attached. The grooves or ridges increase the effective surface area of support member 122. Such improvements may allow sufficient heat dissipation for chips that produce significant heat and render it unnecessary to use an additional heat sink. Preferably the ridges or grooves are made in the sheet from which support members 122 are stamped.

The essential difference between support member 122, FIG. 7, and support member 22, FIG. 2, used in electronic package substrate 20, is that support member 122, FIG. 7, including its contacting surface, must be electrically conductive, as well as thermally conductive. Support member 22, FIG. 2, must be thermally conductive, and it can be, but need not be, electrically conductive.

Bonding member 124, FIG. 7, differs in its material composition from the composition of bonding member 24, FIG. 2, enabling bonding member 124 to have additional qualities and provide additional functions, as well as the functions provided by bonding member 24. Bonding member 124, FIG. 7, is made from an electrically conductive adhesive. An adhesive can be made electrically conductive by filling the adhesive with electrically conductive particles, fibers, flakes, or wires. The electrically conductive fillers typically are metallic. Dispersing silver particles throughout an adhesive provides good electrical conduction effectively throughout the adhesive. Electrically conductive adhesives generally are made of epoxy adhesives filled with silver particles. The silver particles typically are several microns thick by tens of microns long and occupy about 50% of the volume of the adhesive and provide about 80% of the weight of the adhesive. The multitudinous tiny particles form numerous electrical paths throughout the adhesive during the curing process, making the adhesive an isotropic electrically conductive adhesive when cured. Electrically conductive adhesives generally are not filled or reinforced with glass fiber. In addition to providing electrical conduction, silver particles dispersed throughout the adhesive can be used to regulate the coefficient of thermal expansion. Silver filled epoxy adhesives are not as stiff as glass fiber reinforced epoxy adhesives, but generally are of sufficient stiffness when partially cured to a B-stage to allow handling during the fabrication of electronic package substrate 120. Electrically conductive adhesives in tape or sheet form are available from Ablestik Laboratories, a National Starch and Chemical Company, Rancho Dominguez, Calif. Another source is TechFilm Services, Inc. of Billerica, Mass. In other respects bonding member 124 functions like bonding member 24. Bonding members 124 are fabricated from sheets or laminations of sheets of electrically conductive adhesive in the thickness to provide the appropriate depth of the cavities in electronic package substrate 120 for the particular chip 30 for which electronic package substrate 120 is designed, using the same principles for determining the thickness that are used to determine the thickness of bonding member 24 in electronic package substrate 20 and using the same techniques that are used to fabricate bonding member 24 in electronic package substrate 20. Like bonding member 24, FIG. 2 and FIG. 4, bonding member 124, FIG. 7, has a rectangular opening or orifice (not specifically identified, but apparent in FIG. 7) like rectangular opening or orifice 25, FIG. 4.

Circuitized member 126, FIG. 7, like circuitized member 26, FIG. 2, preferably is a circuit or a plurality of circuits on a flexible tape, sometimes called a flexible circuit, comprised of a polyimide substrate with photolithographically developed conductive traces on both sides of the polyimide substrate. Alternatively, circuitized member 126 can be made using a single or multilayered organic material, such as FR4, BT resin, or similar material as the substrate, with photolithographically developed conductive traces on both sides of the substrate. Circuitized member 126 is designed and fabricated to conform to the size, form factor, and the number and arrangement of input/output terminals on chip 30. There is a generally rectangular opening or orifice in circuitized member 126, corresponding to the size and shape of chip 30, providing sufficient clearance so that chip 30 can be inserted into the cavity, formed in part by the orifice or opening in circuitized member 126. The generally rectangular opening or orifice in circuitized member 126 is not specifically shown, but is readily apparent in FIG. 7; the generally rectangular opening or orifice in circuitized member 126 is substantially like the rectangular opening or orifice 27 in circuitized member 28, FIG. 4. Referring again to FIG. 7, the structure of circuitized member 126 includes a substrate 130; photolithographically developed conductive traces on top of the polyimide substrate—upper conductive traces 132; photolithographically developed conductive traces on the bottom of the polyimide substrate—lower conductive traces 134; an upper solder mask 136 covering the upper conductive traces 132; a lower solder mask 138 covering the lower conductive traces 134; one or more vias 140 through polyimide substrate 130; one or more electrically conductive pads 141; multiple ball contact pads 142; and multiple wire bond pads 144. Both upper conductive traces 132 and lower conductive traces 134 are designed to provide electrical paths to facilitate connections between a specific chip 30 and contacts on a circuit board. Conductive traces are the principal pathways for providing electrical power to specific contacts on chip 30, for transmitting signals to and from specific contacts on chip 30, and providing grounding to specific contacts on chip 30. Conductive traces also may be used to provide ground paths to ground planes, such as an electrically conductive pad 141, or to solder contact pads 142, and solder balls 38, without direct connections to chip 30. Via 140 can connect an upper conductive trace on the top of substrate 130 to (a) a lower conductive trace 134, (b) an electrically conductive pad 141 on the bottom of substrate 130, or (c) both a lower conductive trace 134 and an electrically conductive pad 141 on the bottom of substrate 130. Electrically conductive pad 141 can be a circular pad connected to only one via 140. Alternatively, electrically conductive pad 141 can be a larger plane to which multiple vias 140 are connected. There can be more than one electrically conductive pads 141. Each electrically conductive pad 141 is the terminus of one or more vias 140. Electrically conductive pad 141 typically functions as a ground plane for circuitized member 126. There is a hole in lower solder mask 138 below each electrically conductive pad 141 that is intended to function as a ground plane.

Wire bond pads 144, on the topside of circuitized member 126, surround the opening of circuitized member 126, and connect to or form part of upper conductive traces 132. Wire bond pads 144 are used for connecting wire bonds 34 to corresponding wire bond pads (not shown) on chip 30 during the package assembly process. Ball contact pads 142 are arranged typically in an array on the topside of circuitized member 126. Solder balls or ball contacts 38 can be attached to ball contact pads 142 during the package assembly process. There are openings in upper solder mask 136, in the locations where there are wire bond pads 144 or solder ball pads 142, enabling mechanical and electrical connections to be made to these pads. Upper solder mask 136 insulates the rest of the upper traces 132.

Bonding member 124 extends into the hole(s) in lower solder mask 138 below electrically conductive pad(s) 141 and is mechanically bonded and electrically connected to electrically conductive pad(s) 141. Bonding member 124 also is mechanically and electrically bonded to support member 122. Thus there is (are) one or more continuous electrical paths or conductors from electrically conductive support member 122, through electrically conductive bonding member 124, through electrically conductive pad(s) 141 and via(s) 140, to one or more of upper conductive traces 132, which in turn are connected to one or more ball contact pads 142.

Like electronic package 10, FIG. 2, electronic package 110, FIG. 7, includes chip 30, die attach adhesive 32 for bonding chip 30 to support member 122 of electronic package substrate 120, means such as wire bonds 34 for connecting pads (not shown) on chip 30 to wire bond pads 144 on circuitized member 126 and encapsulant 36 to protect chip 30 and wire bonds 34.

Electronic package 110 provides one or more continuous electrical paths or conductors from one or more selected ball contacts 38 to electrically conductive support member 122. Each electrical conductor starts from a selected ball contact 38 and proceeds through ball contact pad 142, to which such ball contact 38 is connected; through upper conductive trace 132, to which such ball contact pad 142 is connected; through via 140, to which such upper conductive trace is connected; through electrically conductive pad 141, to which such via 140 is connected; through electrically conductive bonding member 124, which is electrically connected to all electrically conductive pads 141, because of the holes or openings in lower solder mask 138 beneath such electrically conductive pads 141; to electrically conductive support member 122, which is electrically connected to electrically conductive bonding member 124 throughout the contact surfaces. Each of these electrical paths or conductors are intended to be connected, through corresponding ball contact(s) 38 to corresponding ground contact(s) (not shown) on a circuit board (not shown), which ground contact(s) in turn is (are) connected through circuitry on the circuit board to ground. Thus, when electronic package 110 is connected to a circuit board, and the circuit board is properly connected to ground, there will be one or more electrical paths connecting support member 122 and bonding member 124 to ground. Making more than one such electrical paths improves the reliability of the grounding connection. When operating with these electrical paths, support member 122 and bonding member 124 will surround chip 30 on the bottom and sides of chip 30 with a grounded enclosure. The ball contacts 38, the ball contact pads 37, and the upper conductive traces that are part of these ground paths provide additional grounded shielding for chip 30. If the inner ring or array of ball contacts and ball contact pads are connected to ground, the ground shielding will extend all around chip 30 to the PC board. If there is a ground plane in the PC board underneath chip 30, chip 30 will be entirely surrounded by grounded shielding, with the electronic package providing, in cooperation with the PC board, a Faraday cage around chip 30.

Electronic package 110 also provides one or more continuous electrical paths from one or more grounding wire bond pads (not shown) of chip 30 to electrically conductive support member 122. Each electrical path starts from a selected ground wire bond pad (not shown) on chip 30 and proceeds through a wire bond 34, which is bonded to such ground pad on chip 30 and which is also bonded to a selected corresponding wire bond pad 144 on circuitized member 126. The electrical path continues from such wire bond pad 144 through upper conductive trace 132, to which such wire bond pad 144 is connected; through a selected via 140, to which such upper conductive trace is connected to electrically conductive pad 141 to which such via 140 is connected; through electrically conductive pad 141; through electrically conductive bonding member 124, which is electrically connected to electrically conductive pad 141, because of the hole or opening in lower solder mask 138 beneath such electrically conductive pad 141; to electrically conductive support member 122, which is electrically connected to electrically conductive bonding member 124 throughout the contact surfaces. Thus, all grounding wire bond pads on chip 30 (not shown) will be electrically connected to a common ground plane, namely support member 122, which in turn is connected to an external ground, when electronic package 110 is attached to a circuit board, which has ground connections.

Some grounding wire bond pads on chip 30 (not shown) may have alternative or additional paths to ground. As described above there is an electrical path from each grounding wire bond pad on chip 30 through an upper conductive trace 132 and through a via 140 to an electrically conductive pad 141. There can be paths from a grounding ball contact 38 through an upper conductive trace to a via 140 that connects to the same electrically conductive pad 141. If both via 140 that is electrically connected to grounding wire bond pad on chip 30 and via 140 that is electrically connected to grounding ball contact 38 are connected to the same electrically conductive pad 141, such grounding wire bond pad will have electrical connections to the grounding ball contact 38 directly through electrically conductive pad 141, as well as through support member 122, which functions as a common ground plane.

Because of the grounding paths through circuitized member 126, when ball contact 38 in one or more of such grounding conductors is connected to an external electrical ground, bonding member 124 and support member 122 become electrically grounded. In this situation, support member 122 not only is a mechanical support and a heat sink for chip 30, but also is a ground plane shielding chip 30 from external electrical fields. When electronic package 110 is connected to a circuit board, chip 30 will be surrounded by support member 122, bonding member 124, and an array or ring of grounded ball contact pads 142 and ball contacts 38, providing electrical shielding similar to what is provided by a Faraday cage, without the expense of a separate piece of hardware and the extra space required to attach a separate piece of hardware to act as a Faraday cage.

Aside from the limitations on the types of material from which support member 122 is fabricated, the requirement that the surface of support member 122 be electrically conductive, the more specialized material used to construct bonding member 124, and the specialized circuitry in circuitized member 126, electronic package substrate 120 and electronic package 110 are fabricated in the same way as electronic package substrate 20 and electronic package 10 in accordance with the processes identified in FIG. 3.

In the fabrication process, generally described in FIG. 3, it should be noted that when a circuitized member strip, corresponding to circuitized member strip 70, FIG. 4, but containing multiple circuitized members 126, is placed on top of an bonding member strip, corresponding to bonding member strip 60, FIG. 4, but containing multiple bonding members 124, there is a gap in circuitized member 126 wherever there is a hole or an opening in lower solder mask 138 beneath an electrically conductive pad 141. There will be multiple gaps if there are multiple electrically conductive pads 141. The thickness of this gap is equivalent to the thickness of lower solder mask 138, which is approximately 10-20 microns. As bonding member 124 is heated and compressed during the bonding of the three component members, indicated by reference numeral 48, FIG. 3, bonding member 124 essentially fills in such gap(s) and bonds mechanically and electrically with electrically conductive pad(s) 141.

Figure 8:
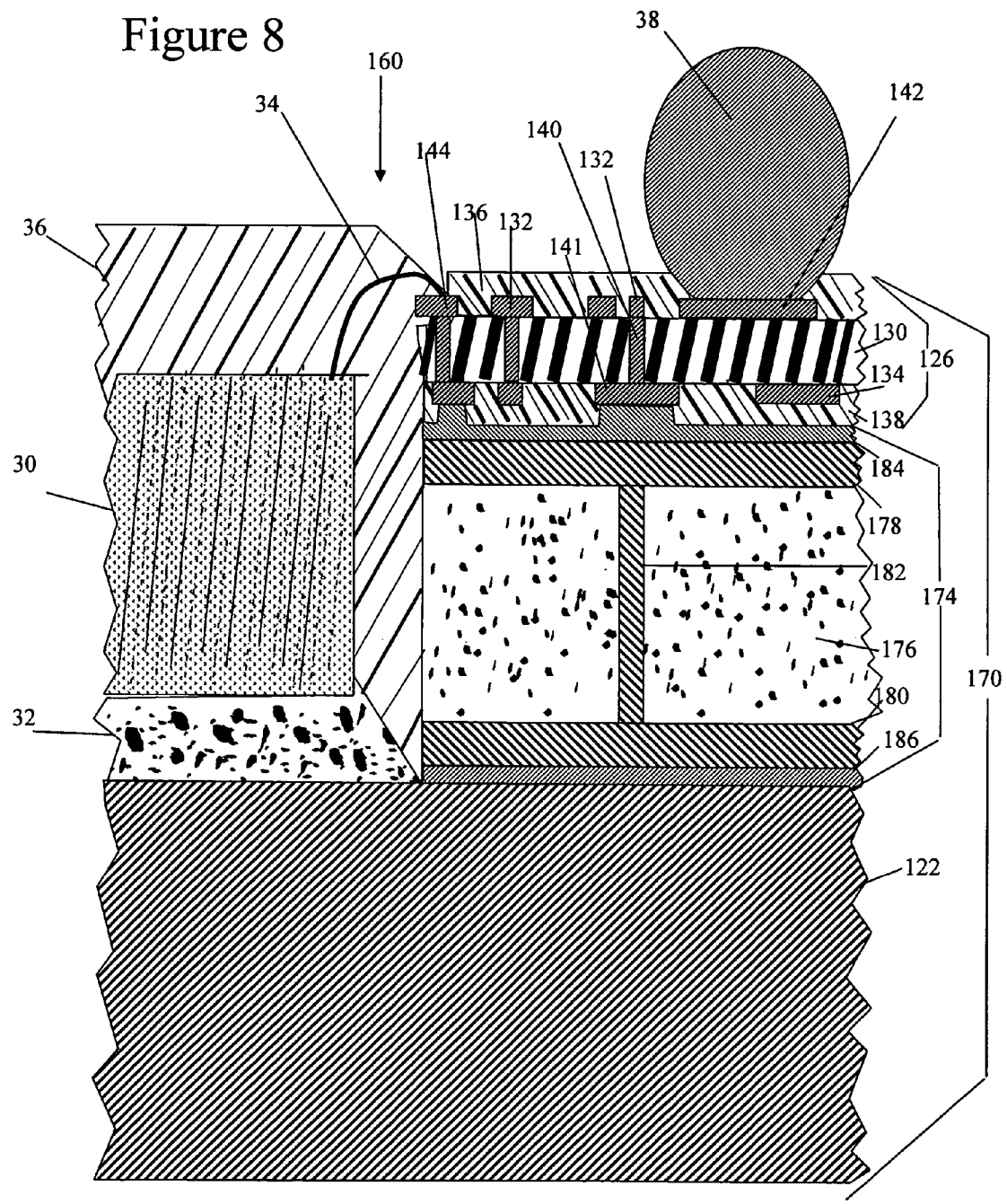
FIG. 8 is a much enlarged, cross-sectional view of a second alternative embodiment of a thermally enhanced BGA wire bonded electronic package in accordance with the present invention.

FIG. 8 shows a second alternative embodiment of a thermally enhanced BGA electronic package for a wire bonded chip 160. As should be apparent from the use of the common reference numerals, chip 30, die attach material 32, wire bonds 34, encapsulant 36, and ball contacts 38 in electronic package 160 are the same structures and are fabricated and assembled in the same way as the counterparts in electronic package 10, FIG. 2, and electronic package 110, FIG. 7. Likewise, support member 122 and circuitized member 126 in FIG. 8, as well as the individual components and structures of circuitized member 126 in FIG. 8, including substrate 130 of circuitized member 126, upper conductive traces 132, lower conductive traces 134, upper solder mask 136, lower solder mask 138, via(s) 140 through substrate 130, electrically conductive pad(s) 141, ball contact pads 142, and wire bond pads 144, are the same in electronic package 160 as in electronic package 110, FIG. 7, and they are fabricated and assembled in the same way as their counterparts in electronic package 110.

Referring again to FIG. 8, reference numeral 170 generally indicates the electronic package substrate, which comprises support member 122, bonding member 174, and circuitized member 126. Electronic package substrate 170 differs from electronic package substrate 120, FIG. 7, only in the structure and features of the respective bonding members. Bonding member 174, FIG. 8, is made from a laminated structure of multiple elements, rather than from a single solid sheet or multiple-layered sheet of a relatively uniform electrically conductive adhesive material from which bonding member 124 is made.

Referring to FIG. 8, core 176 of bonding member 174 preferably is made from FR4 or BT resin—the same material used to make circuit boards. Core 176 is clad with an electrically conductive upper cladding 178 and an electrically conductive lower cladding 180. Copper is the preferred cladding. At least one electrically conductive via 182 connects upper cladding 178 and lower cladding 180. Preferably multiple conductive vias 182 connect upper cladding 178 and lower cladding 180. Using multiple electrically conductive vias 182 not only enhances the reliability of the electrical connection but also enhances shielding against EMI when the vias 182, as well as the cladding and other parts of the electronic package are grounded. Circuit board material with copper cladding on both sides, with electrically conductive vias connecting the copper cladding, can be readily fabricated using current PC board technology or procured from PC board fabricators.

Core 176, with upper cladding 178 and lower cladding 180, is sandwiched between two bonding layers, made from thin sheets of electrically conductive adhesive, covering an upper surface and a lower surface of the copper clad core. Upper bonding layer 184 bonds circuitized member 126 to upper cladding 178. Lower bonding layer 186 bonds support member 122 to lower cladding 180. Upper bonding layer 184 and lower bonding layer 186 can be made from a sheet of the same electrically conductive adhesive used in making bonding member 124, FIG. 7. Preferably, upper bonding layer 184 and lower bonding layer 186 are made from a sheet of an electrically conductive adhesive, such as a silver-filled epoxy adhesive, that is approximately 75 microns thick.

Like bonding member 24, FIG. 2 and FIG. 4, bonding member 174, FIG. 8, has a rectangular opening or orifice (not specifically identified, but apparent in FIG. 8) like rectangular opening or orifice 25, FIG. 4. Each component of bonding member 174, including upper bonding layer 184, core 176, with upper cladding 178 and lower cladding 180, and lower bonding layer 186, has a rectangular opening or orifice (not specifically identified, but apparent in FIG. 8) like rectangular opening or orifice 25, FIG. 4.

Bonding member 174, and more particularly upper bonding layer 184, which is the top outermost element of bonding member 174, extends into the hole(s) in lower solder mask 138 below electrically conductive pad(s) 141 and is mechanically bonded and electrically connected to electrically conductive pad(s) 141. Bonding member 174, and more particularly lower bonding layer 186, which is the bottom outermost element of bonding member 174, is mechanically and electrically bonded to support member 122. Thus there is (are) one or more continuous electrical paths from electrically conductive support member 122, through electrically conductive bonding member 174, through electrically conductive pad(s) 141 and via(s) 140, to one or more of upper conductive traces 132, which in turn are connected to one or more ball contact pads 142.

Bonding member 174, FIG. 8, comprising a thin upper bonding layer 184, core 176, clad with an upper cladding 178 and a lower cladding 180, with one or more electrically conductive vias 182, connecting upper cladding 178 and lower cladding 180, and a thin lower bonding layer 186, is relatively complex when compared to bonding member 124, FIG. 7, which is made from a laminate of sheets of a single material. However, bonding member 174 is a less expensive component than bonding member 124, and bonding member 174 may be an attractive substitute for bonding member 124 for use in low cost electronic packages. Core 176, which is made from a relatively inexpensive material, such as FR4, with copper cladding and vias connecting the copper cladding, is significantly less expensive than silver-filled epoxy adhesive. Using a copper clad core of FR4 as the interior of a bonding member, in lieu of an interior portion of electrically conductive adhesive in a bonding member, can enable cost reductions in the cost of an electronic package substrate.

Referring to FIG. 8, electronic package 160 provides a continuous electrically conductive path from one or more selected ball contacts 38 to support member 122: Selected ball contact(s) (solder ball(s)) 38 connects to ball contact pad(s) 142, which is (are) connected to upper conductive trace(s) 132 that is (are) connected to via(s) 140; via(s) 140, in circuitized member 126, is (are) connected to electrically conductive pad(s) 141. Preferably there are multiple vias 140, connecting upper conductive traces 132 to one or more electrically conductive pads 141. Each electrically conductive pad 141 is in contact with bonding member 174 and forms an electrical connection with bonding member 174, and more particularly with upper bonding layer 184. Upper bonding layer 184 is bonded to and provides an intimate electrical connection with upper cladding 178, which is bonded to core 176. At least one electrically conductive via 182 goes through core 176 and connects upper cladding 178 with lower cladding 180, which is bonded to core 176. Preferably there are multiple vias 182, providing multiple electrical paths between upper cladding 178 and lower cladding 180. Lower bonding layer 186 not only bonds, but also electrically connects support member 122 to lower cladding 180, completing the electrical path from a selected ball contact 38 to support member 122.

Electronic package 160 also provides one or more continuous electrical paths from one or more grounding wire bond pads (not shown) of chip 30 to electrically conductive support member 122. Each electrical path starts from a selected ground wire bond pad (not shown) on chip 30 and proceeds through a wire bond 34, which is bonded to such ground pad on chip 30 and which is also bonded to a selected corresponding wire bond pad 144 on circuitized member 126. The electrical path continues from such wire bond pad 144 through upper conductive trace 132, to which such wire bond pad 144 is connected; through a selected via 140, to which such upper conductive trace is connected to electrically conductive pad 141 to which such via 140 is connected; through electrically conductive pad 141; through bonding member 174, and more particularly through upper bonding layer 184, which bonds to and is electrically connected with electrically conductive pad 141, because of the hole or opening in lower solder mask 138 beneath such electrically conductive pad 141; through upper cladding 178, through via 182, through lower cladding 180, through lower bonding layer 186 to electrically conductive support member 122, which is electrically connected to electrically conductive bonding member 174, and more particularly to lower bonding layer 186, throughout the contact surfaces. Thus, all grounding wire bond pads on chip 30 (not shown) will be electrically connected to a common ground plane, namely support member 122, which in turn is connected to an external ground, when electronic package 160 is attached to a circuit board (not shown), which has ground connections.

Because of the continuous electrically conductive path(s) from one or more selected ball contact(s) 38 to support member 122, and because of the continuous electrically conductive path(s) from one or more ground wire bond pad(s) to support member 122, connecting such ball contact(s) 38 to electrical ground will cause all of the following elements to become grounded: ball contact pad(s) 142, connected to such selected ball contact(s) 38; upper conductive trace(s) 132, connected to such ball contact pad(s); via(s) 140, connected to such upper conductive trace(s); electrically conductive pad (s) 141, connected to such via(s) 140; selected grounding wire bond pad(s) 144; upper conductive trace(s) 132, connected to such grounding wire bond pad(s); via(s) 140, connected to such upper conductive trace(s) and connected to electrically conductive pad(s) 141; upper bonding layer 184; upper cladding 178, which is bonded to core 176; vias 182; lower cladding 180, which that is bonded to core 176; lower bonding layer 186; and support member 122. In this situation, support member 122 not only is a support and a heat sink for chip 30, but together with the other grounded elements identified above, forms a ground plane and a grounded shield, shielding chip 30 against EMI from external sources and shielding other components from EMI generated by chip 30. When electronic package 160 is connected to a multilayer circuit board that has a ground plane underneath chip 30, chip 30 will be essentially surrounded and effectively enclosed by grounded members, providing electrical shielding against EMI similar to what is provided by a Faraday cage, without the expense of and the extra space required for an extra piece of hardware.

Electronic package substrates 170 can be fabricated according to essentially the same method outlined in FIG. 3 using the same fixture shown in FIG. 4 or a similar fixture, with variations in the process identified by reference numeral 41, FIG. 3, and the process or step identified by reference numeral 44, FIG. 3, to accommodate the unique features of bonding member 174.

The process for making a strip or row of bonding members 174, connected in a frame, is analogous to the process identified by reference numeral 41, FIG. 3. The thickness of bonding member 174 is determined according to the same principles used to determine the thickness of bonding member 24 and the thickness of bonding member 124. Preferably bonding member 174 is of sufficient thickness such that the sum of the thickness of bonding member 174 plus the thickness of circuitized member 126 is slightly greater than the sum of the thickness of chip 30 and the thickness of die attach adhesive 32. Since bonding member 174 is a laminate, the thicknesses of any combination of the layers or constituents can be varied to yield desired thickness. Because electrically conductive adhesive is the most expensive constituent of bonding member 174, it is preferable and more economical to set the thickness of upper bonding layer 184 and lower bonding layer 186 at or near the minimum thickness required to allow these sheets of adhesive to be handled and fabricated, as well as to form proper bonds. This thickness is approximately 75 microns. Copper is the next most expensive constituent of bonding member 174. Accordingly it is preferable and more economical to choose as the thickness of the copper cladding the thickness that typically is provided by PC board fabricators. The preferable constituent to vary is core 176. The material used to make core 176, e.g. FR4, is relatively inexpensive, and it is easy to vary the thickness of core 176, since core 176 can be fabricated as a laminate of several sheets of FR4 of different thicknesses.

The fabrication of a strip or row of bonding members 174 starts with a sheet of circuit board material, such as FR4, of the proper thickness, with copper cladding on both sides, and preferably with vias connecting the two copper clads distributed in a pattern throughout the sheet, surrounding the areas where there will be openings or orifices which will form the side walls of the cavities, and avoiding the locations where the openings or orifices, slots and holes are to be punched. The sheet is drilled to create the vias and the vias are plated with an electrically conductive material. The laminated sheet, i.e. core 176 with upper cladding 178 and lower cladding 180, is punched out to provide a strip of essentially rectangular openings or orifices corresponding to the size and shape of the chip for which electronic package substrate 170 is being fabricated, and an array, of slots and alignment holes around each such rectangular opening or orifice. The orifices or openings for the chip, provide sufficient clearance to accommodate variations in the size of the chip and tolerances for the automated chip placement equipment. Two thin sheets of electrically conductive adhesive, preferably a silver filled epoxy adhesive, in a semi-cured stage, are punched out with corresponding orifices or openings for the chip and slots and alignment holes around such orifices or openings.

In the fabrication of electronic package substrate 170, in the step corresponding to reference numeral 44, FIG. 3, after support members 122 are placed into cavities 82 in base fixture 80, a first or lower thin strip of electrically conductive adhesive, comprising a row of lower bonding layers 186, connected by a thin frame of the same electrically conductive adhesive, is placed on base fixture 80, with the alignment holes going over the alignment pins 84. Then the copper clad strip of circuit board material, comprising a row of lower cladding 180, core 176, and upper cladding 178, connected by a frame of the same copper clad circuit board material, is placed on top of the first thin strip of electrically conductive adhesive, with the alignment holes going over the alignment pins 84. Then a second or upper strip of electrically conductive adhesive, comprising a row of upper bonding layers 184, connected by a thin frame of the same electrically conductive adhesive, is placed on top of the copper clad strip of circuit board material, with the alignment holes going over the alignment pins 84. Then a circuitized member strip, containing circuitized members 126, is placed on top of the upper strip of electrically conductive adhesive. The remaining steps 46 through 56 of FIG. 3 are carried out in the same manner as in fabricating electronic package 10, FIG. 1 and FIG. 2, and electronic package 110, FIG. 7.

As was noted in discussing the fabrication of electronic package substrate 120, when a circuitized member strip, corresponding to circuitized member strip 70, FIG. 4, containing multiple circuitized members 126, is placed on top of upper bonding layer 184, there is a gap in circuitized member 126 wherever there is a hole or an opening in lower solder mask 138 beneath an electrically conductive pad 141. There will be multiple gaps if there are multiple electrically conductive pads 141. The thickness of this gap is equivalent to the thickness of lower solder mask 138, which is approximately 10-20 microns. As bonding member 174 is heated and compressed, and more particularly as upper bonding layer 184 is heated and compressed, during the bonding of the three component members, indicated by reference numeral 48, FIG. 3, upper bonding layer 184, which is the top layer of bonding member 174, fills in such gap(s) and bonds mechanically and electrically with electrically conductive pad(s) 141.

The laminated materials used to make bonding member 174 provide a stiff frame surrounding the row of bonding members 174 and enables easy handling of the strip of electronic package substrates 170 after the strip of substrates is removed from the fixture in the step described in reference numeral 50, FIG. 3.

Figure 9:
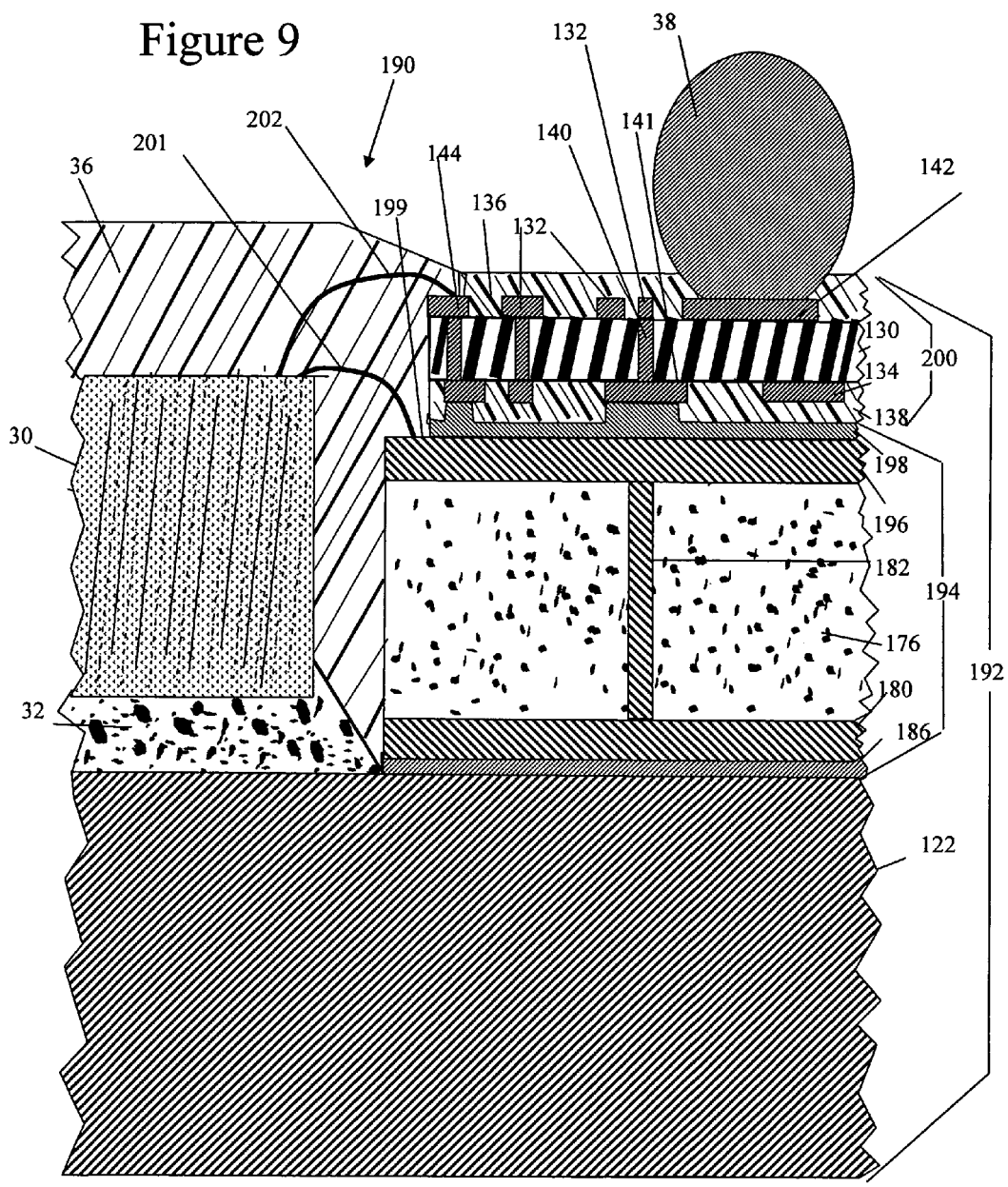
FIG. 9 is a much enlarged, cross-sectional view of a third alternative embodiment of a thermally enhanced BGA wire bonded electronic package in accordance with the present invention.

Referring to FIG. 9, reference numeral 190 generally indicates a third alternative embodiment of a thermally enhanced BGA electronic package for a wire bonded chip. Electronic package 190 includes an electronic package substrate 192, chip 30, die attach adhesive 32, down wire bonds 201, wire bonds 202, and encapsulant 36. Electronic package substrate 192 comprises support member 122, bonding member 194, and circuitized member 200.

Support member 122 in electronic package substrate 192 is the same structure, is fabricated in the same way, and has the same purposes and functions as support member 122 in electronic package substrate 120, FIG. 7, and support member 122 in electronic package substrate 170, FIG. 8.

Bonding member 194, in electronic package substrate 192 FIG. 9, is similar to bonding member 174 in electronic package substrate 170, FIG. 8. Both bonding members are laminated structures comprising a central core 176, preferably made from the same material from which circuit boards are fabricated, such as FR4, with cladding on both sides, sandwiched between two bonding layers of electrically conductive adhesive. The principal difference between bonding member 194, FIG. 9, and bonding member 174, FIG. 8, is in the selection of materials, treatment, and fabrication of upper cladding 196. Upper cladding 196, FIG. 9, preferably is made from a sheet of copper that has a metallized layer of nickel and a metallized layer of gold plated on the base layer of coppers. The purpose of the metallized layers is to enable wire bonds to bond to upper cladding 196. Lower cladding 180, FIG. 9, like lower cladding 180, FIG. 8, and upper cladding 178, FIG. 8, can be made from sheets of copper that are typically used to clad circuit boards.

The other difference between bonding member 194, FIG. 9, and bonding member 174, FIG. 8, is that upper bonding layer 198, FIG. 9, has a larger opening or orifice punched in it, so that bonding layer 198 will leave a portion of upper cladding 196 exposed. The exposed portion of upper cladding 196, creates a ledge 199, to which wire bonds can be attached. The depth of ledge 199 will depend upon the diameter of the wire used in the automated wire bonding equipment and the precision, accuracy, and tolerances of the automated wire bonding equipment. Generally the ledge will be in the range of 100-200 microns, or 0.1-0.2 mm.

Like bonding member 174, FIG. 8, bonding member 194, FIG. 9, also incorporates one or more vias 182 connecting lower cladding 180 and upper cladding 196, and a lower bonding layer 186.

Like electronic package 160, FIG. 8, electronic package 190, FIG. 9, provides one or more continuous electrical paths from one or more selected ball contacts 38 to support member 122. Since upper cladding 196 is part of the electrical path, upper cladding 196, including ledge 199, will be grounded when electronic package 190 is appropriately connected to a circuit board. Since ledge 199 is plated to enable wire bonding, wire bonds from chip 30 can be bonded to ledge 199, allowing multiple ground paths from ledge 199 to chip 30.

Aside from the use of a gold or nickel plated upper cladding 196 and the punching of a larger orifice or opening in upper bonding layer 198, bonding member 194 is fabricated using the same processes used to fabricate bonding member 174, FIG. 8.

Circuitized member 200, FIG. 9, has the same elements, is made of the same material, and is fabricated in the same way as circuitized member 126, FIG. 7, and circuitized member 126, FIG. 8. The only differences between circuitized member 200 and circuitized member 126, is that circuitized member 200 has a larger opening or orifice than circuitized member 126, and the circuit elements, such as wire bond pads, 144, upper conductive traces 132, lower conductive traces 134, and electrically conductive pads 141, are laid out to accommodate the larger opening. The larger opening in circuitized member 200 leaves ledge 199 of upper cladding 199 exposed so that wire bonds can be bonded to ledge 199.

Electronic package substrates 192 are fabricated substantially the same way that electronic package substrates 170, FIG. 8 are fabricated. The differences are that (1) larger openings or orifices are punched in the strip of electrically conductive adhesive from which a row of upper bonding layers 198, connected by a frame are fabricated, and (2) larger openings are punched in the flexible tape from which a circuitized member strip containing a row of circuitized members 200 is fabricated. As is generally described by reference numeral 44, FIG. 3, after support members 122 are placed in the cavities in fixture 80, FIG. 4, the constituents comprising a composite strip of bonding members 194, including (1) a strip of electrically conductive adhesive containing a row of lower bonding layers 186, (2) a laminated strip of material containing a corresponding row of (a) core 176 with (b) lower cladding 180 and (c) upper cladding 196, and (3) a strip of electrically conductive adhesive containing a row of upper bonding layers 198, all connected by their respective frames of the same materials from which the constituents are made, are placed sequentially on fixture 80, with the alignment holes aligning with alignment pins 84. Then a circuitized member strip containing a row of circuitized members 200 is placed on top of the constituents comprising the strip of bonding members 194. Finally mating fixture 86, FIG. 4, is placed on top of the circuitized member strip. As the members are compressed and heated, in the step identified by reference numeral 48, FIG. 3, upper bonding layer 198 fills in gaps in circuitized member 200 wherever there are holes in lower solder mask 138 below electrically conductive pads 141.

The electronic package assembly process, reference numeral 52, FIG. 3, includes a step of bonding wire bonds 201 to ledge 199. Because ledge 199 is below the surface of chip 30, wire bonds 201 are generally called down bonds or down wire bonds. Down wire bonds 201 are used to connect wire bond contacts (not shown) on chip 30 that are designed to be grounded, to ledge 199, which is part of upper cladding 196, which is electrically connected to support member 122, which serves as a ground plane and which is connected through at least one, and generally through several electrical paths, to grounding ball contacts 38, which can be connected to external ground when electronic package 190 is connected to a circuit board (not shown).

Because electronic package 190 has a grounded ledge 199, all contacts on chip 30 that need to be grounded can be bonded by down wire bonds 201 to ledge 199. By diverting all grounding connections between chip 30 and electronic package substrate 192 to ledge 199, all wire bond pads 144 are available for conducting power or electrical signals between chip 30 and electronic package substrate 192. This enables electronic package 190 to accommodate chips with more total inputs/outputs.

Figure 10:
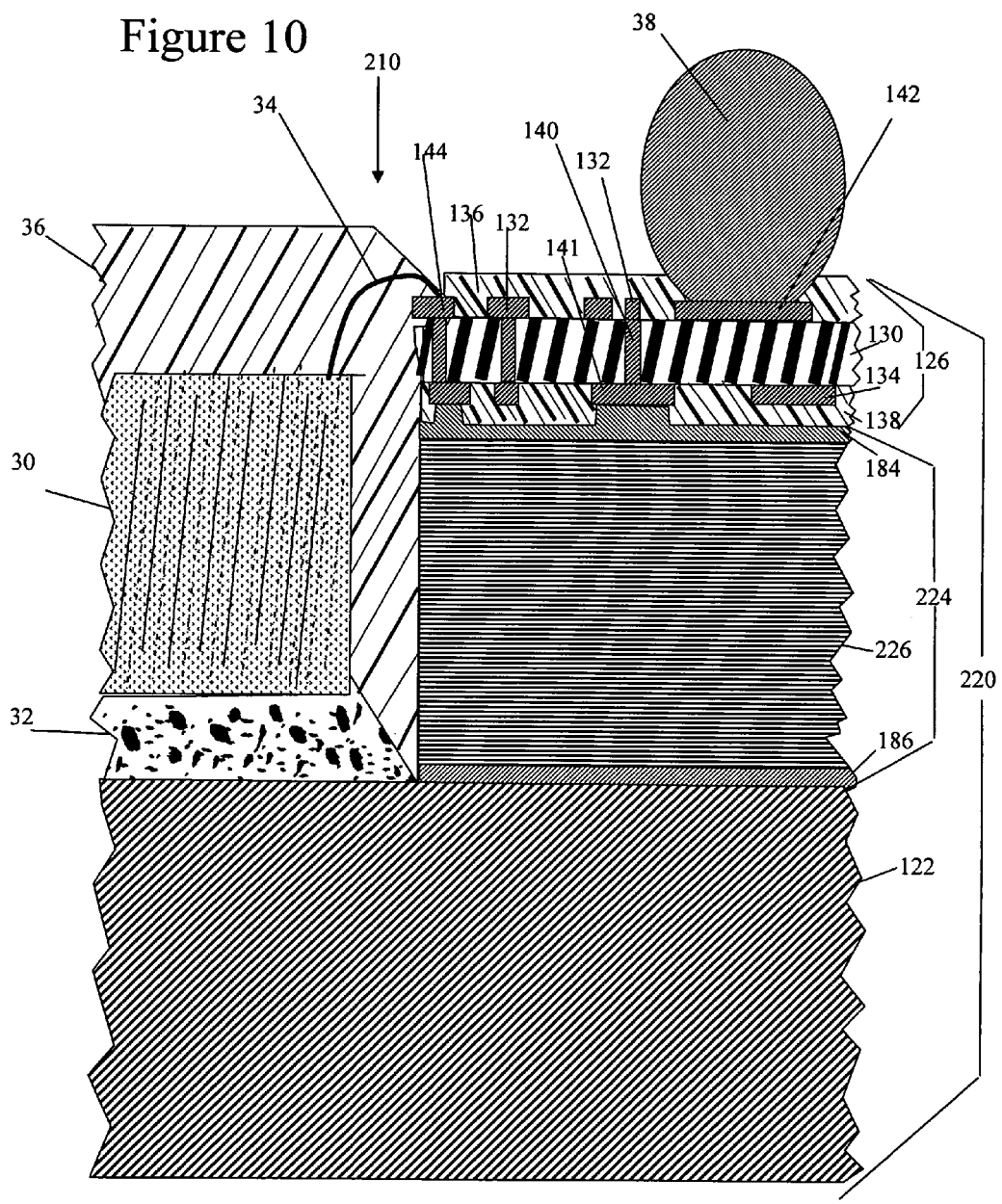
FIG. 10 is a much enlarged, cross-sectional view of a fourth alternative embodiment of a thermally enhanced BGA wire bonded electronic package in accordance with the present invention.

FIG. 10 shows a greatly enlarged cross-sectional view of a portion of a fourth alternative embodiment of a thermally enhanced BGA electronic package for a wire bonded chip in which a metallic strip is incorporated into the fabrication of a strip containing an array or row of electronic package substrates to provide a metallic stiffener in each electronic package substrate and a metallic frame to facilitate the handling of the strip containing electronic package substrates. Referring to FIG. 10, reference numeral 210 generally indicates a fourth alternative embodiment of a thermally enhanced BGA electronic package for a wire bonded chip. Electronic package 210 includes an electronic package substrate 220, chip 30, die attach adhesive 32, wire bonds 34, encapsulant 36, and ball contacts 38. Electronic package substrate 220 comprises support member 122, bonding member 224, and circuitized member 126.

Referring to FIG. 10, support member 122 in electronic package substrate 220 is the same structure, is fabricated in the same way, and has the same purposes and functions as support member 122 in electronic package substrate 120, FIG. 7, in electronic package substrate 170, FIG. 8, and in electronic package substrate 192, FIG. 9.

Referring to FIG. 10, circuitized member 126 in electronic package substrate 220, including all its components, is the same structure, is fabricated in the same way, and has the same purposes and functions as circuitized member 126, FIG. 7, and circuitized member 126, FIG. 8.

Referring to FIG. 10, bonding member 224 comprises a stiffening member 226, sandwiched between an upper bonding layer 184 and a lower bonding layer 186. Stiffening member 226 is metallic, preferably made of copper. The surfaces of stiffening member 226 preferably are treated to improve adhesion and electrical conduction, using conventional techniques. Stiffening member 226 has a central opening or orifice 228 (not specifically identified, but is apparent in FIG. 10). Central opening or orifice 228 is viewed more readily in FIG. 11, which shows a partial view of a strip 230 of multiple stiffening members 226, with the central opening or orifice 228 in each stiffening member 226 readily identified. Stiffening member 226 preferably is fabricated in rows or arrays of a multiple stiffening members 226 as indicated by strip 230. Strip 230 contains a row of stiffening members 226, frame 231, multiple alignment holes 232, and multiple slots 234. Slots 234 and alignment holes 232 demarcate each stiffening member 226. Frame 231 surrounds the array of stiffening members 226 and is essentially the entire portion of strip 230 outside the stiffening members 226.

Figure 11:
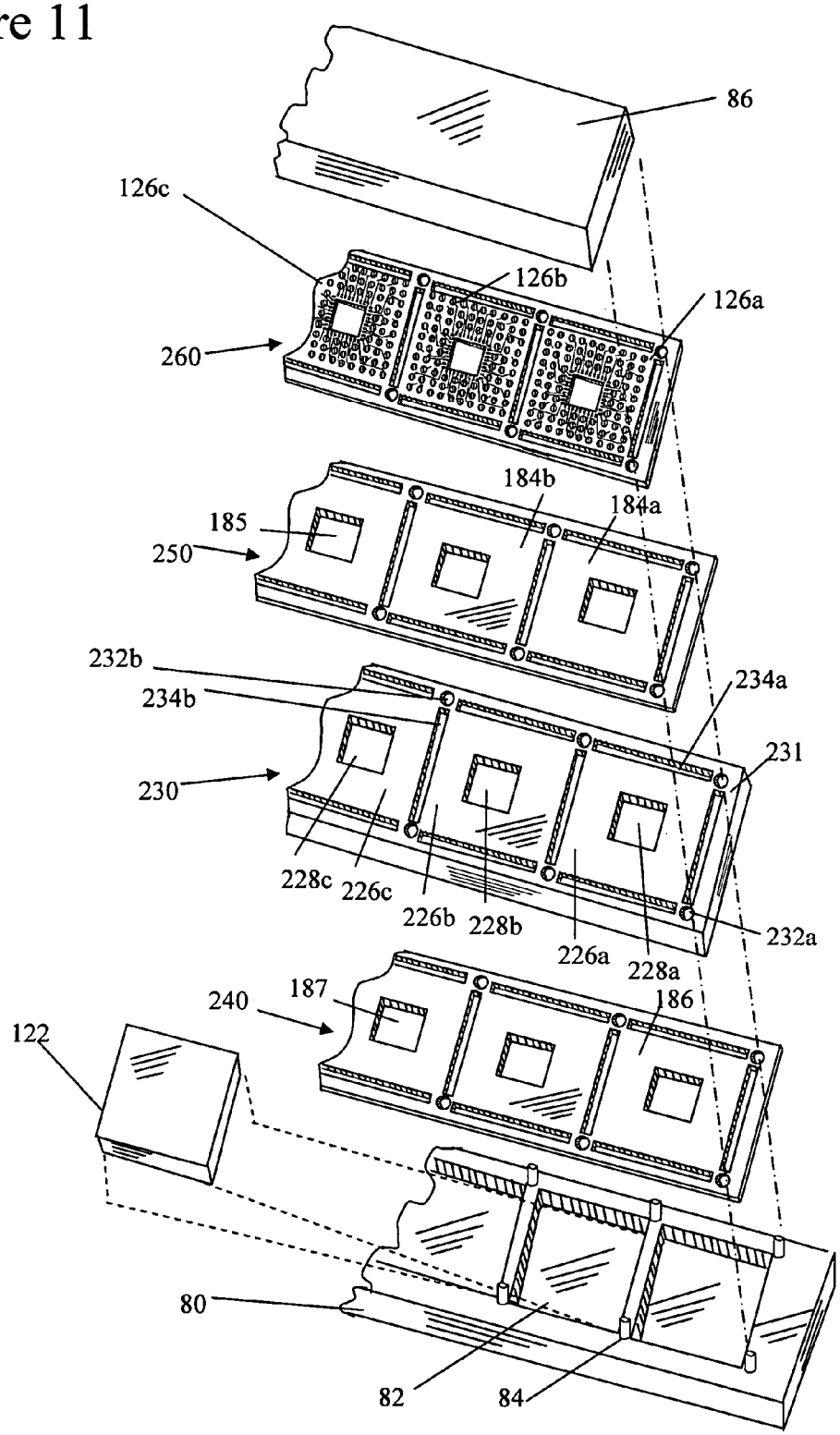
FIG. 11 is an exploded view of a support member, a partial strip of framed multiple lower bonding layers, a partial strip of framed multiple stiffening members, a partial strip of framed multiple upper bonding layers, and a partial strip of framed multiple circuitized members that will be assembled to make multiple thermally enhanced electronic package substrates for the electronic package of FIG. 10, together with a partial top and a partial bottom of the fixture used in the process of making multiple electronic package substrates.

Upper bonding layer 184 and lower bonding layer 186 in bonding member 224 are made from the same material and fabricated in the same way, and have the same purposes and functions as upper bonding layer 184 and a lower bonding layer 186 in bonding member 174, FIG. 8, and bonding member 194, FIG. 9. Like bonding member 24, FIG. 2 and FIG. 4, upper bonding layer 184, FIG. 10, and lower bonding layer 186 have a rectangular opening or orifice (not specifically identified, but apparent in FIG. 10) like rectangular opening or orifice 25, FIG. 4. Central opening or orifice 185 in upper bonding layer 184 and central opening or orifice 187 in lower bonding layer 186 are shown in FIG. 11, which shows a partial view of a strip 250 of multiple upper bonding layers 184 and a partial view of a strip 240 of multiple lower bonding layers 186. Strip 240 has slots and alignment holes that demarcate the lower bonding layers 186. Likewise strip 250 has slots and alignment holes that demarcate the upper bonding layers 184.

The thickness of bonding member 224, FIG. 10, is determined according to the same principles used to determine the thickness of bonding member 24, FIG. 2, the thickness of bonding member 124, FIG. 7, and the thickness of bonding member 174, FIG. 8. Preferably bonding member 224 is of sufficient thickness such that the sum of the thickness of bonding member 224 plus the thickness of circuitized member 126 is slightly greater than the sum of the thickness of chip 30 and the thickness of die attach adhesive 32. Since bonding member 224 is a composite of upper bonding layer 184, stiffening member 226, and lower bonding layer 186, the thicknesses of any combination of the layers or constituents can be varied to yield the desired thickness. Because electrically conductive adhesive is the most expensive constituent of bonding member 224, it is preferable and more economical to set the thickness of upper bonding layer 184 and lower bonding layer 186 at or near the minimum thickness required to allow strips 240 and 250 containing the rows of bonding layers to be handled and fabricated efficiently. This thickness is approximately 75 microns. The preferable constituent to vary is stiffening member 226. Compared to electrically conductive adhesive, copper—even copper with treated surfaces—is relatively inexpensive. Copper can be obtained in a range of thicknesses to provide the desired thickness of stiffening member 226 and the desired ultimate thickness of bonding member 224.

FIG. 11 shows an exploded view of support member 122, a partial strip of framed multiple lower bonding layers 186, a partial strip of framed multiple stiffening members 226, a partial strip of framed multiple upper bonding layers 184, and a partial strip of framed multiple circuitized members 126 that will be assembled to make multiple thermally enhanced electronic package substrates 220, together with a partial top and a partial bottom of the fixture used in the process of making multiple electronic package substrates 220. As can be appreciated in comparing FIG. 11 with FIG. 4, the process for making multiple electronic package substrates 220 is substantially like the process for making multiple electronic package substrates 20, FIG. 2 and FIG. 5 and tracks the process set out in FIG. 3 and the related description of FIG. 3. The process for making multiple electronic package substrates 220 can be described best by referring to FIG. 11. The steps include: placing thermally conductive and electrically conductive support members 122 into cavities 82 of base fixture 80; placing strip 240 containing a row of lower bonding layers 186 on top of base fixture 80, with the alignment holes aligned with alignment pins 84; placing strip 230 containing a row of stiffening members 226 connected by frame 231 on top of strip 240 with alignment holes 232 aligned with and going over alignment pins 84; placing strip 250 containing a row of upper bonding layers 184 on top of strip 230 with alignment holes aligned with and going over alignment pins 84; placing strip 260 containing a row of circuitized members 126 on top of strip 250 with alignment holes aligned with and going over alignment pins 84; placing mating fixture 86 on top of strip 260, engaging alignment pins 84 in receiving alignment holes (not shown) in mating fixture 86; applying pressure of about 150 psi to base fixture 80 and mating fixture 86, thereby compressing the components between the base fixture 80 and the mating fixture 86; applying heat to raise the temperature of the components and fixture to about 170° C. for about 30 minutes; and then removing a strip containing a row of electronic package substrates 220 connected by a laminated frame, the principal member of which is frame 231.

A strip of electronic packages 210 connected by a laminated frame, the principal member of which is frame 231, is made from the strip containing a row of electronic package substrates 220 connected by a laminated frame, the principal member of which is frame 231, in the electronic package assembly process by carrying out steps indicated by reference numerals 52, 54, and 56, FIG. 3, and the related description.

Although electronic package 210 has more components than electronic package 110 and is somewhat more complicated to fabricate, electronic package 210 is less costly to produce than electronic package 110. Until the cost of electrically conductive adhesive sheets declines substantially, bonding member 224 made up as a composite of upper bonding layer 184, stiffening member 226, and lower bonding layer 186 will be less expensive than bonding member made entirely from a solid electrically conductive adhesive sheet.

As shown in the drawings for the purpose of illustration, the invention also is embodied in a flip chip electronic package and a method for making a flip chip electronic package. A flip chip electronic package comprises a flip chip and a flip chip package substrate. The flip chip package substrate comprises a relatively thin, flexible circuitized member bonded to a relatively thicker, substantially rigid bonding member. The flip chip is attached to the circuitized member, through an opening in the bonding member, by electrical connectors—typically solder bumps that are parts of or attached to the flip chip.

The novel construction of the flip chip package substrate enables the incorporation of additional innovative features and benefits into the flip chip electronic package. Because the primary bonding member in the flip chip package substrate is not merely a thin layer of adhesive, but is a structural member of the flip chip package substrate and forms the walls of the cavity into which a flip chip is placed, the adhesive material used in fabricating the primary bonding member can be modified to fabricate alternative specialized embodiments of the flip chip electronic package with new enhanced features.

The flip chip electronic package generally includes an underfill encapsulant, sometimes called just an underfill, that fills in the gap between the flip chip and the circuitized member around the solder bumps and out to the periphery of the flip chip. The flip chip electronic package includes a set of electrical connectors for connecting the flip chip electronic package to the next level of integration, such as a PC board or a card. The set of electrical connectors in the preferred embodiments illustrated and described herein is called a ball grid array. A grid array of solder balls comprising the ball grid array provides a fairly dense foot print on the next level of integration and provides an efficient set of electrical connections between the flip chip electronic package and the next level of integration. The array of solder balls is attached to the circuitized member on the side opposite the side to which the flip chip is attached. As illustrated and described herein, the solder balls will be considered to be attached to the bottom of the circuitized member, while the flip chip will be considered to be attached to the top side of the circuitized member.

The construction of the basic version of the flip chip electronic package enables the construction of alternative versions of the flip chip electronic package with additional components or alternative construction materials to provide additional or enhanced features. The flip chip electronic package optionally may include a heat sink or heat spreader for dissipating heat generated by the operation of the flip chip. The heat sink, as used in a preferred alternative embodiment of the flip chip electronic package, is attached to the top of the flip chip and the top of a primary bonding member by a relatively thin, thermally conductive secondary bonding member.

The flip chip package substrate may include an optional stiffening member, which facilitates the fabrication of flip chip package substrates strips and facilitates the efficient assembly and fabrication of flip chip electronic packages.

In other alternative embodiments of the flip chip electronic package, the bonding member is fabricated from an electrically conductive adhesive or an electrically conductive adhesive is combined with a metallic stiffening member to provide electrical shielding forming 5 of the 6 sides of a Faraday cage for the flip chip. The ground plane in a circuit board provides the $6^{th}$ side of the Faraday cage.

Figure 12:
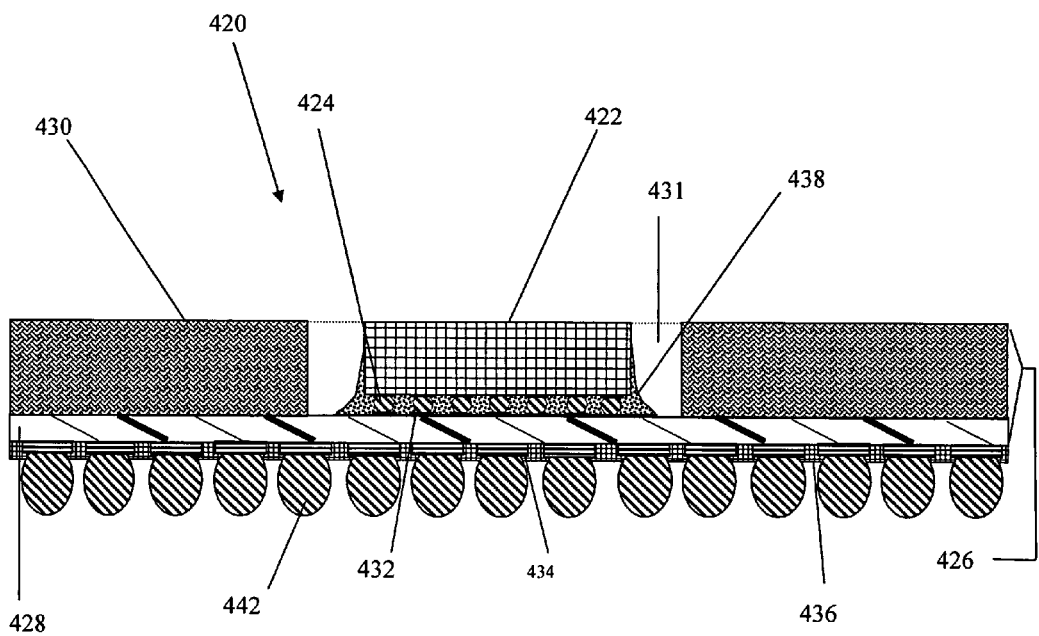
FIG. 12 is a cross-sectional view in side elevation of a first embodiment of a flip chip electronic package, according to the present invention.

FIG. 12 shows a cross-section of a flip chip electronic package, indicated by reference numeral 420. Reference numeral 422 indicates a flip chip at the heart or approximate center of flip chip electronic package 420. Flip chip 422 is a semiconductor chip that has an array of electrical contacts or pads (not shown) on the bottom surface of the chip for power, ground, input signal, or output signal. Typically the chip manufacturer or a separate processor attaches a solder bump 424 to each of the electrical contacts or pads on the bottom surface of the chip, thereby providing an array of solder bumps 424 on the bottom surface of flip chip 422, before flip chip 422 is delivered to an electrical package assembler.

Solder bump 424 in a preferred embodiment is made from any of several different chemistries of solder that melts at a temperature in the range of about 215° C. to about 260° C. Solder bumps 424 alternatively are made from electrically conductive polymers. Although solder bumps 424 made from the various metallic solders have superior electrical and mechanical properties for bonding, solder bumps or electrical connectors made from electrically conductive polymers generally contain no lead and are more environmentally friendly. Solder bumps made from electrically conductive polymers may become more prevalent if restrictions on the use of lead in new products are legislated.

Flip chip electronic package 420, FIG. 12, incorporates a flip chip package substrate 426 to support flip chip 422 and to provide the electrical interconnections between flip chip 422, which is on the inside of flip chip electronic package 420, and electrical terminals on the outside of flip chip electronic package 420. Flip chip package substrate 426 comprises circuitized member 428 and primary bonding member 430, which are bonded together in the process of fabricating flip chip package substrate 426.

Circuitized member 428, FIG. 12, in a preferred embodiment is a flexible circuit,. preferably comprised of a polyimide substrate, about 3-6 mils thick, with very thin conductive traces (not shown) provided for interconnecting solder bumps pads 432 (and ultimately solder bumps 424, which are the input and output terminals of flip chip 422) to solder ball pads 434 (and ultimately solder balls 442, which are the external terminals of the flip chip electronic package). Typically and preferably the conductive traces, solder bump pads 432, and solder ball pads 434 are photolithographically developed on the polyimide substrate. Alternatively, circuitized member 428 is made using a multilayered polyimide substrate, with conductive traces on one or more of the layers of the substrate. The conductive traces typically are about 1 mil-2 mils wide and about 18 microns thick (high); typically traces are spaced about 1 mil-2 mils apart—generally having a separation distance that is roughly equal to the width of the trace. Circuitized member 428 has an array of solder bump pads 432 on the top side of the substrate. Solder bump pad 432 is essentially a termination of a conductive trace. Typically solder bump pad 432 is circular and has a diameter that is about the same size or slightly smaller than the diameter of solder bump 424 or about 100 microns (or about 4 mils); the thickness (or height) of solder bump pad 432 typically is about the same as the thickness (or height) of the conductive trace, or about 18 microns. The array of solder bump pads 432 corresponds to and is designed to accommodate the array of solder bumps 424 on the specific flip chip 422 for which the circuitized member 428 is designed. Circuitized member 428 has an array of solder ball pads 434 on the bottom of the polyimide substrate. Solder ball pads 434 are essentially terminals of conductive traces. Solder ball pads 434 typically are about 18 microns thick (high) and typically occupy a circular area about 20-40 mils in diameter or slightly less than the diameter of a solder ball. Circuitized member 428 can have conductive traces (not shown) on one or both sides of the polyimide substrate. The purpose of the conductive traces is to form electrical pathways that connect each solder bump pad 432 in the array of solder bump pads 432 to a solder ball pad 434 in the array of solder ball pads 434. There are tiny electrical vias (not shown) through the polyimide substrate that connect either the solder bump pads 432 or the conductive traces (not shown) that fan out from solder bump pads 432 on the top side of circuitized member 428 to the solder ball pads 434 or to the conductive traces (not shown) connected to the solder ball pads 434 on the bottom side of circuitized member 428. Often there may be traces from several different solder bump pads 432 to one solder ball pad 434 to accommodate several connections on a flip chip for ground or for power, each of which may be served though only one solder ball connection. In a preferred embodiment, a thin, insulative solder mask 436 covers the conductive traces on the bottom side of circuitized member 428, with openings or holes in solder mask 436 in the locations where there are solder ball pads 434, enabling mechanical and electrical connections to be made to these solder ball pads 434 while protecting and insulating the rest of the conductive traces. Solder mask 436 typically is about 15 microns-30 microns thick (high). In a preferred embodiment there also is a thin, insulative solder mask (not shown) on the top side of circuitized member 428 covering any conductive traces on the top of circuitized member 428, with small holes or openings at each solder bump pad 432.

Circuitized members 420, in the preferred embodiment as flexible circuits are commercially available from suppliers, such as Compass, Hong Kong; Sumitomo, Japan; and Hitachi Cable, Japan. Typically suppliers will design and fabricate flexible circuits or circuitized members 428 based upon the specifications of the specific flip chip and the specifications of the flip chip electronic package. The configuration of the solder bumps 424 on the specific flip chip for which a flip chip package substrate is designed determines the configuration of the solder bump pads 432. The size and configuration of the footprint for the flip chip electronic package, i.e. the size and configuration of the array of solder ball pads 434 and solder balls 442 are typically determined by industry standards. Preferably an array of such circuits is fabricated on a polyimide sheet. Suppliers typically make flexible circuits or circuitized members 428 on polyimide sheets and can readily supply them in the preferred form as a strip of polyimide containing a row or 1×N array of circuitized members 428.

Referring to FIG. 12, primary bonding member 430 preferably is made from a glass-fiber-reinforced/filled epoxy adhesive, although other adhesives and other fillers may work satisfactorily. The preferred adhesive is a "no-flow" adhesive, i.e. an adhesive that will not flow substantially under a given set of temperature, pressure and time conditions, during its curing. The adhesive preferably is reinforced or filled with glass fibers, silica spheres or other particles to control the co-efficient of thermal expansion of the adhesive. A raw material commonly used to manufacture circuit boards, known in the industry as FR4 or sometimes called FR4 laminate, has the right properties and is a suitable material from which to make primary bonding members 430. (The acronym FR is short for fire resistant.) Another material that is used to make primary bonding member 430 is known in the industry as BT resin or merely BT. Both FR4 and BT resin are readily available from many vendors who supply materials to PC board fabricators, and both are relatively inexpensive. The glass fiber reinforced/filled epoxy adhesive initially is introduced into the process of making flip chip package substrates 426, as a solid sheet, or as a laminate of multiple thinner solid sheets, of the adhesive in a partially cured or "B-stage" cured condition. These sheets are cut easily into strips of appropriate width for fabricating primary bonding members 430. The glass fiber reinforced/filled epoxy adhesive, such as FR4, in a B-stage cured condition, is relatively stiff, not sticky, relatively stable, and relatively easy to handle. In the bonding and curing process, the glass fiber reinforced/filled epoxy adhesive flows sufficiently under higher temperatures and pressures to fill in gaps, forms mechanical and chemical bonds with circuitized member 428, and forms additional cross linkages in the adhesive itself, making the glass fiber reinforced/filled epoxy adhesive more rigid and more stable for long term reliability.

Primary bonding member 430, FIG. 12, has an orifice or central opening 431 slightly larger than the size of the flip chip 422 for which flip chip package substrate 426 is designed to accommodate. (Central opening 431 can be viewed and appreciated more easily in FIG. 13.) Central opening 431 is aligned with the array of solder bump pads on the top of circuitized member 428. Primary bonding member 430 is bonded to the top of circuitized member 428 providing a cavity in flip chip package substrate 426, with the array of solder bump pads in the center of the cavity. Flip chip 422 is mechanically and electrically bonded to circuitized member 428 by the array of solder bumps 424. The thickness of primary bonding member 430 and the resulting depth of the cavity in flip chip package substrate 426, into which flip chip 422 is placed, is about equal to the thickness of flip chip 422, including the height of solder bumps 424. A typical primary bonding member for a typical flip chip is about 18 mils thick.

In summary, the functions of primary bonding member 430 are to provide mechanical support to circuitized member 428, to be a support and to serve as a stiffener for flip chip package substrate 426, and to provide a cavity for flip chip 422.

The sheet of the glass fiber reinforced/filled epoxy adhesive from which primary bonding members 430 are made preferably is cut into strips that are wider than the length (or width) of primary bonding member 430 and longer than a multiple of the width (or length) of primary bonding member 430, so that a strip of the glass fiber reinforced/filled epoxy adhesive can function not only as the material from which multiple primary bonding members 430—preferably in a row or 1×N array—are fabricated, but also as a stiff frame for a row of primary bonding members 430 and as a stiff frame for a flip chip package substrate strip containing a row of flip chip package substrates 426 during the fabrication of a row flip chip electronic packages 420.

Still referring to FIG. 12, the gap between flip chip 422 and circuitized member 428, including the space around the solder bumps 424 is filled with an underfill encapsulant 438. Underfill encapsulant 438 preferably is an epoxy resin compound; however any non-reactive, non-conductive material that provides mechanical integrity would be satisfactory. Preferably underfill encapsulant 438 will extend slightly beyond the periphery of flip chip 422

A solder ball 442, FIG. 12, is attached to each solder ball pad 434, producing an array of solder balls 442. The use of an array of solder balls for connecting an electronic package, such as flip chip electronic package 420, to a circuit board gives rise to the term, ball grid array or BGA package. Solder ball 442 preferably is made from solder with a melting temperature of less than about 200° C., so that flip chip electronic package 420 can be connected to a PC board using a reflow process in which the peak temperature in the reflow process—which may be about 40° C. higher than the melting temperature of the solder balls—will not cause solder bumps 424 to melt. Solder balls made from eutectic lead-tin solder are readily available and work well. If solder balls 442 are required to be lead free, other solder chemistries that produce a solder that has a melting temperature at least about 20° C. and preferably about 40° C. lower than the melting temperature of solder bumps 424 may perform satisfactorily.

Flip chip package substrates currently used in the electronic packaging industry comprise electrical traces bonded to a ceramic substrate or electrical traces bonded to a laminate of multiple layers of epoxy or PTFE. Using a material, such as FR4, as both a bonding agent and as a structural member in bonding member 430 with a very thin flexible circuit on a polyimide substrate as circuitized member 428 provides a significant advance in making flip chip substrates. Flip chip package substrate 426 is less costly to manufacture than a substrate made from a ceramic material. The polyimide material used to fabricate circuitized member 428 in flip chip package substrate 426 can withstand much higher temperatures than a laminate of multiple layers of epoxy. Solder bumps 424, which are made from a solder material that has a melting temperature above 225° C., are melted and fused to solder bump pads 432 on circuitized member 428 without damaging the polyimide substrate of circuitized member 428. Polyimide is stable at temperatures up to 450° C. Melting and fusing solder bumps that are made from a solder material that has a melting temperature above 225° C. to a laminate of multiple layers of epoxy might degrade the laminate of multiple layers of epoxy, especially if the solder bumps are melted and fused by the methods currently used in the industry.

Figure 13:
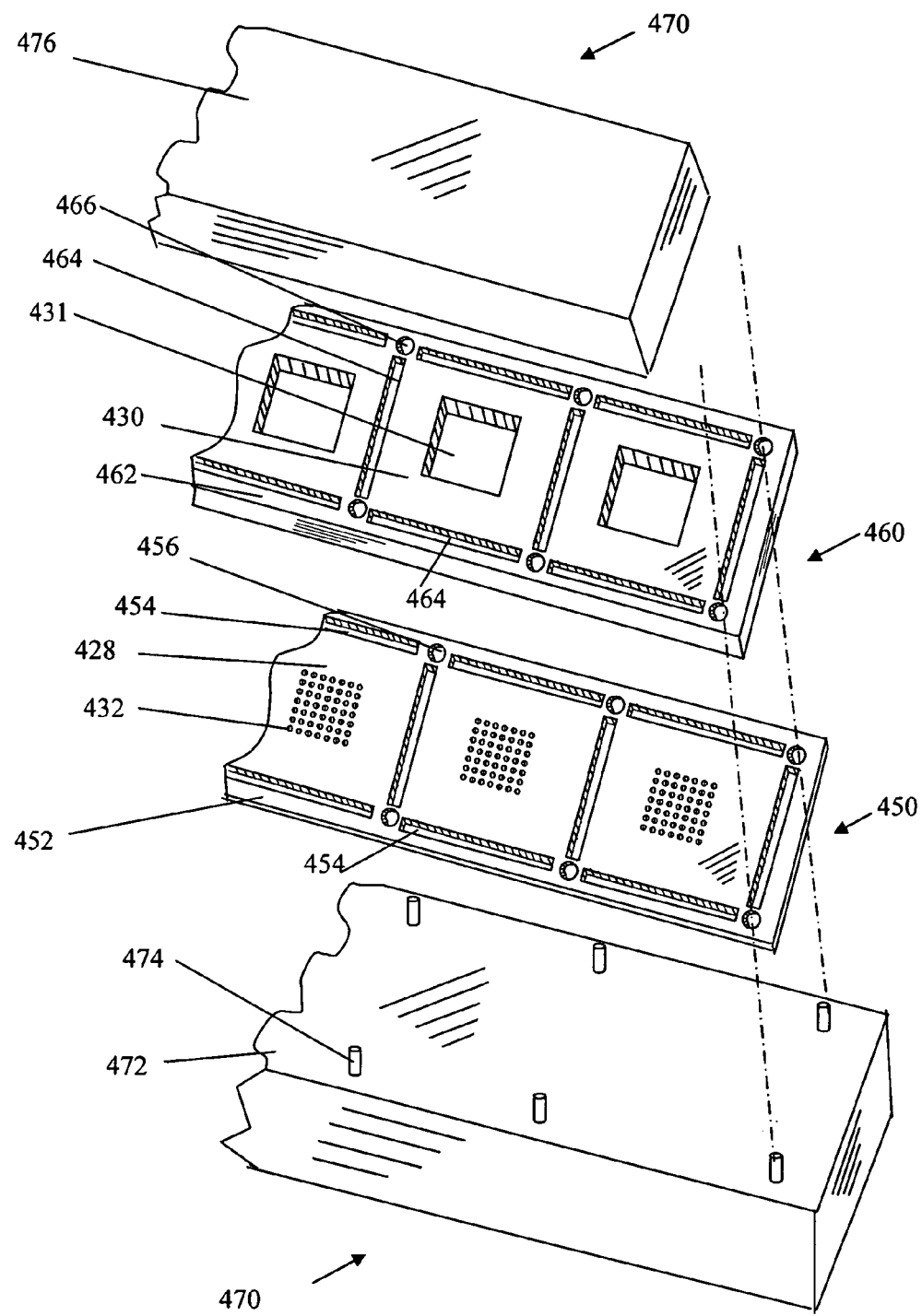
FIG. 13 is an exploded, perspective view cut away of the components for fabricating a row of flip chip package substrates for the flip chip electronic package of FIG. 12 in a flip chip package substrate strip and the fixture used in fabricating them.

FIG. 13 illustrates how the flip chip package substrate 426 of FIG. 12 is made efficiently in multiple quantities. Referring to FIG. 13, reference numeral 450 generally indicates a circuit strip containing a row of circuitized members 428 surrounded by a circuit frame 452. Slots 454 and alignment holes 456 in circuit strip 450 essentially demarcate each circuitized member 428 and separate circuitized members 428 from the circuit frame 452. Slots 454 facilitate the singulation of individual flip chip electronic packages; the edge of slot 454 becomes part of the edge of the individual flip chip electronic package. At the stage in the assembly and fabrication process illustrated in FIG. 13, circuit strip 450 preferably is a polyimide sheet with circuits appropriate for the target flip chip and for the desired footprint. Slots 454 and alignment holes 456 have been previously punched, drilled, routed, or otherwise formed in circuit strip 450.

Still referring to FIG. 13, reference numeral 460 generally indicates an adhesive strip containing a row of primary bonding members 430 surrounded by a primary bonding frame 462. There is a central opening 431 in each primary bonding member 430. Slots 464 and alignment holes 466 essentially demarcate each primary bonding member 430 and separate primary bonding members 430 from primary bonding frame 462. Slots 464 facilitate the singulation of individual flip chip electronic packages; the inner edge of slot 464 becomes part of the edge of the individual flip chip electronic package. At the stage in the assembly and fabrication process illustrated in FIG. 13, adhesive strip 460 preferably is a strip (or a laminate of strips) of glass-fiber-reinforced/filled epoxy adhesive, such as FR-4, in a B-stage or partially cured condition, of the desired thickness for the flip chip substrate. Central openings 431, slots 464 and alignment holes 466 have been previously punched, drilled, routed, or drilled or otherwise formed in adhesive strip 460.

Still referring to FIG. 13, a fixture 470, comprising base plate 472, alignment pins 474, and top plate 476, is used to align and assemble circuit strip 450 and adhesive strip 460 to fabricate a strip of flip chip package substrates. Fixture 470 is made from steel or aluminum. The alignment pins preferably are made of steel. Circuit strip 450 is placed upon base plate 472 with alignment pins 474 going through alignment holes 456. Adhesive strip 460 is then placed upon the top of circuit strip 450 with alignment pins 474 passing through alignment holes 466. Alignment holes 456, alignment holes 466, and alignment pins 474 enable central opening 431 in each primary bonding member 430 to be properly aligned with an array of solder bump pads 432 on the top side of each circuitized member 428.

After circuit strip 450 and adhesive strip 460 have been placed successively on top of base plate 472 and aligned using alignment pins 474, top plate 476 is placed on top of adhesive strip 460. Pressure is applied to base plate 472 and top plate 476, compressing circuit strip 450 and adhesive strip 460. Fixture 470 and the compressed, assembled components are then heated. The combination of pressure and heat causes a further curing of adhesive strip 460 and causes a very strong bond between circuit strip 450 and adhesive strip 460 to develop. As a result of this further curing and bonding, each of the circuitized members 428 in the row of circuitized members 428 contained in circuit strip 450 bonds to a corresponding primary bonding member 430 in the row of primary bonding members 430 contained in adhesive strip 460 thereby producing a strip containing multiple flip chip package substrates 426, FIG. 12. As another result of this curing, each of the primary bonding members 430 develops the necessary stiffness and stability to be a support for the flip chip package substrate 426. As a further result of the curing, primary bonding frame 462 develops the necessary stiffness and stability to be a stiff frame for any subsequent handling, transporting, and processing of the row of flip chip package substrates during the chip-to-substrate attachment process. The appropriate pressure, temperature and time for the bonding and curing process may vary depending upon the particular material chosen and the thickness of adhesive strip 460. Experiments indicated that when using FR4 about 18 mils thick to make adhesive strip 460, a pressure of 150 psi, a temperature of about 170° C., and a curing time of about 30 minutes gave good results.

Figure 14:
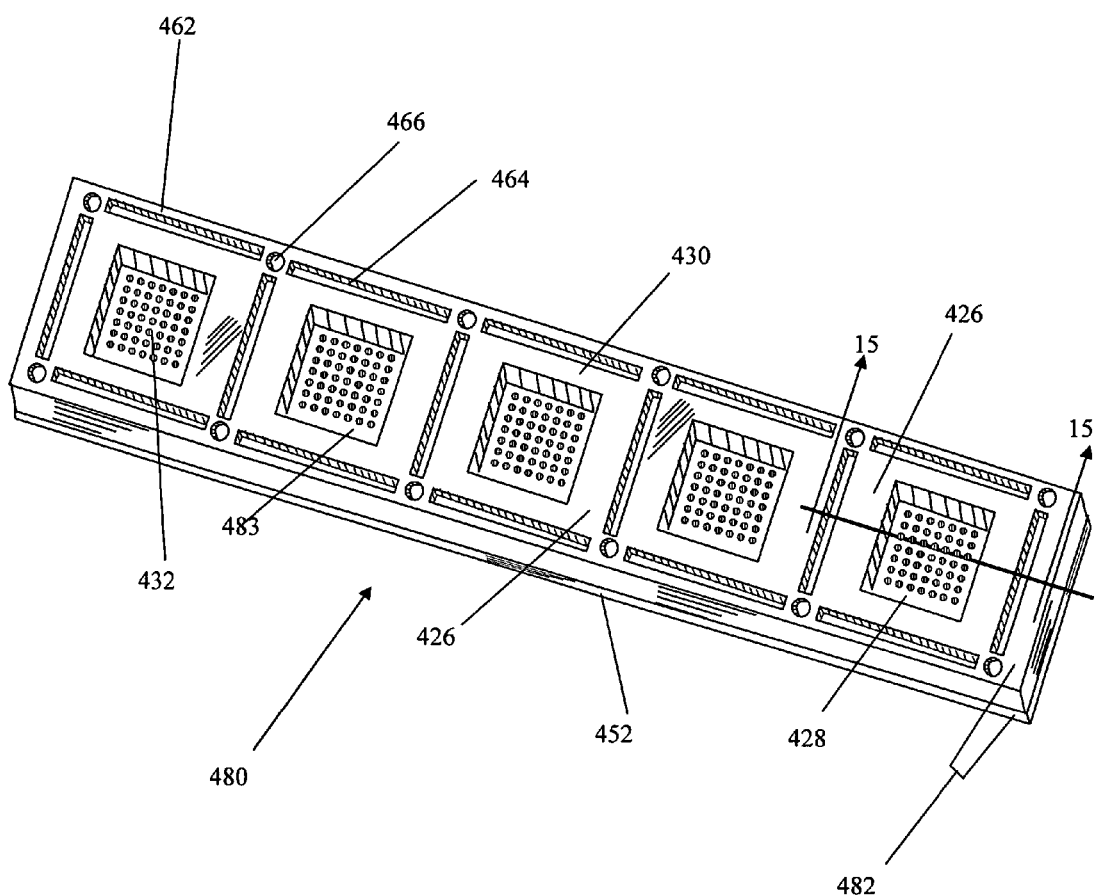
FIG. 14 is a perspective view of a row of flip chip package substrates for the flip chip electronic package of FIG. 12 in a flip chip package substrate strip, awaiting installation of the flip chips.

FIG. 14 shows a perspective view of a flip chip package substrate strip 480 that is produced in the flip ship package substrate assembly fixture 470 depicted in FIG. 13 when circuit strip 450 containing a row of five circuitized members 428 is bonded to adhesive strip 460 containing a row of five primary bonding members 430.

Figure 15:
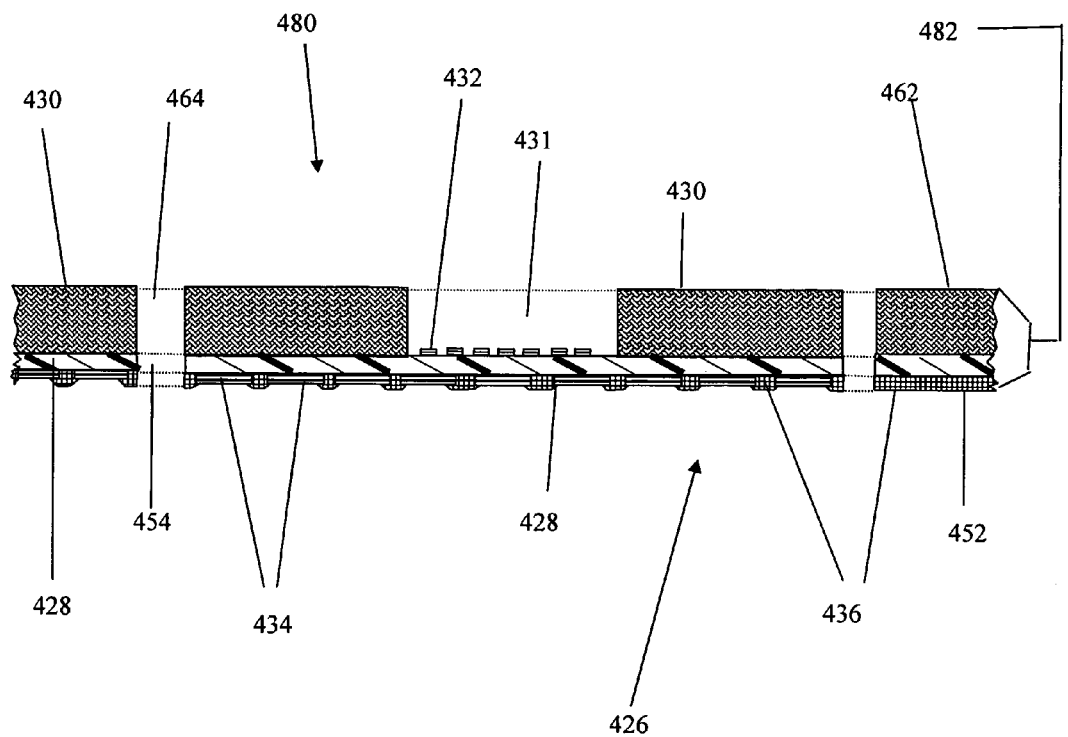
FIG. 15 is a cross-sectional view in side elevation of a portion of the flip chip package substrate strip taken along line 15-15 of FIG. 14.

FIG. 15 represents a cross section of a portion of flip chip package substrate strip 480, including one flip chip package substrate 426, together with a portion of an adjoining flip chip package substrate and slots 464 and 454 in adhesive strip 460 and circuit strip 450 respectively, on the left side of flip chip package substrate 426, and similar slots and flip chip package substrate frame 482, on the right side of flip chip package substrate 426.

Referring to FIG. 14 and FIG. 15, flip chip package substrate strip 480 contains a row of five flip chip package substrates 426 surrounded by flip chip package substrate frame 482. The number of flip chip package substrates shown is arbitrary and is chosen for ease of illustration. The preferred number will depend upon the size of the flip chip package substrates and the size of the fixture. Flip chip package substrate frame 482 is circuit frame 452 and primary bonding frame 462 bonded together. Each flip chip package substrate 426 is demarcated by slots 464 and alignment holes 466 in adhesive strip 460, which is the top layer of flip chip package substrate strip 480, and slots 454 and alignment holes 456 in circuit strip 50, which is the bottom layer of flip chip package substrate strip 480. The slots 454 and holes 456 in circuit strip 450 are barely visible, but not identified in FIG. 14. FIG. 14 and FIG. 15 show more clearly cavity 483 formed by the central portion of circuitized member 428, in which there is an array of solder bump pads 432, and the orifice or central opening 431 (more clearly shown in FIG. 13) in primary bonding member 430. It is in this cavity 483 where flip chip 422, FIG. 12, is placed during the chip-to-substrate attachment process.

Figure 16:
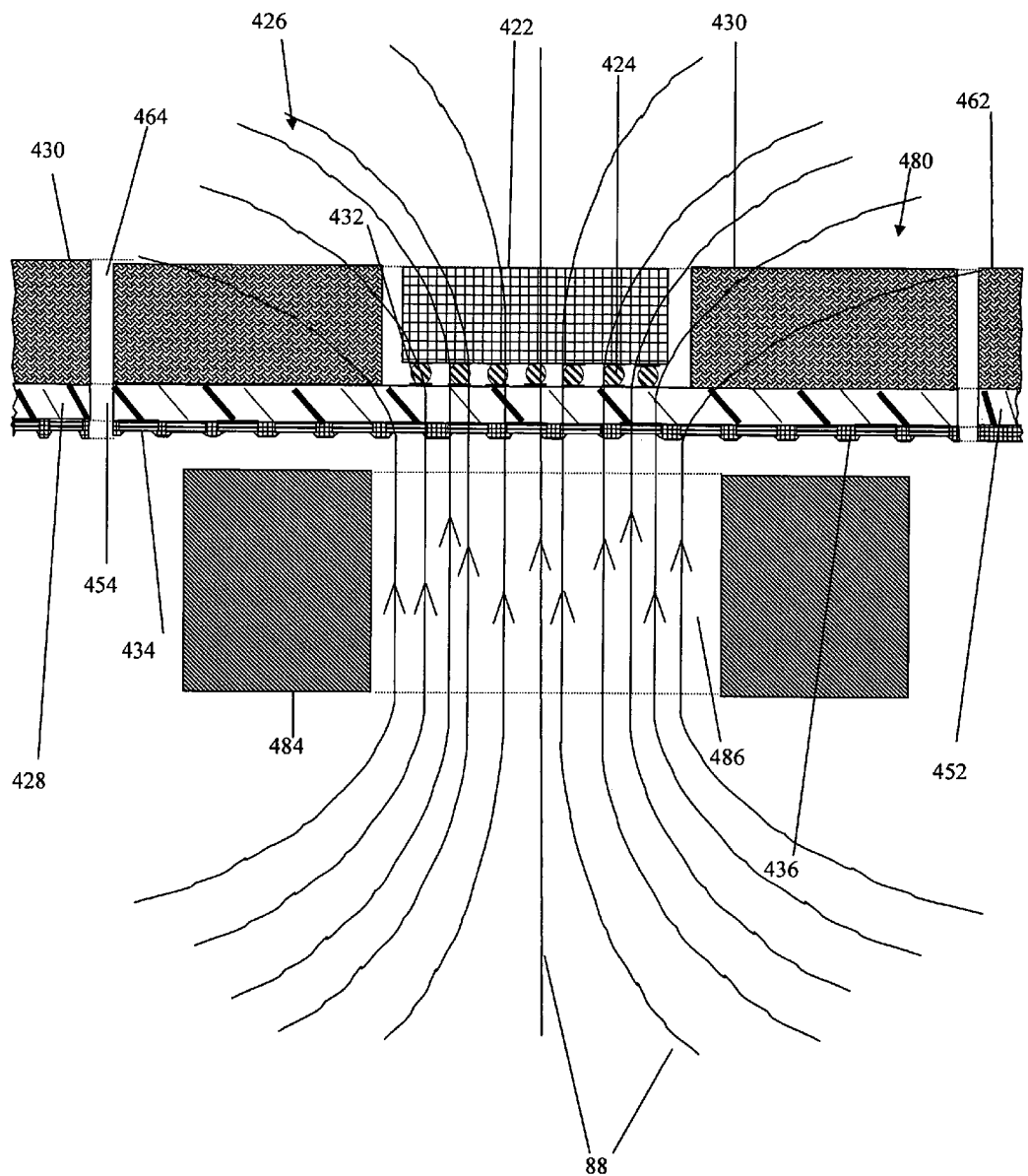
FIG. 16 is a cross-sectional view in side elevation of the portion of the flip chip package substrate strip of FIG. 15, with a flip chip installed in the cavity of the flip chip package substrate, a cross-sectional view in side elevation of an induction heating concentrator placed underneath the flip chip package substrate, and a diagrammatic representation of the lines of magnetic flux generated to melt the solder bumps during the attachment of the flip chip to the flip chip package substrate.
Figure 17:
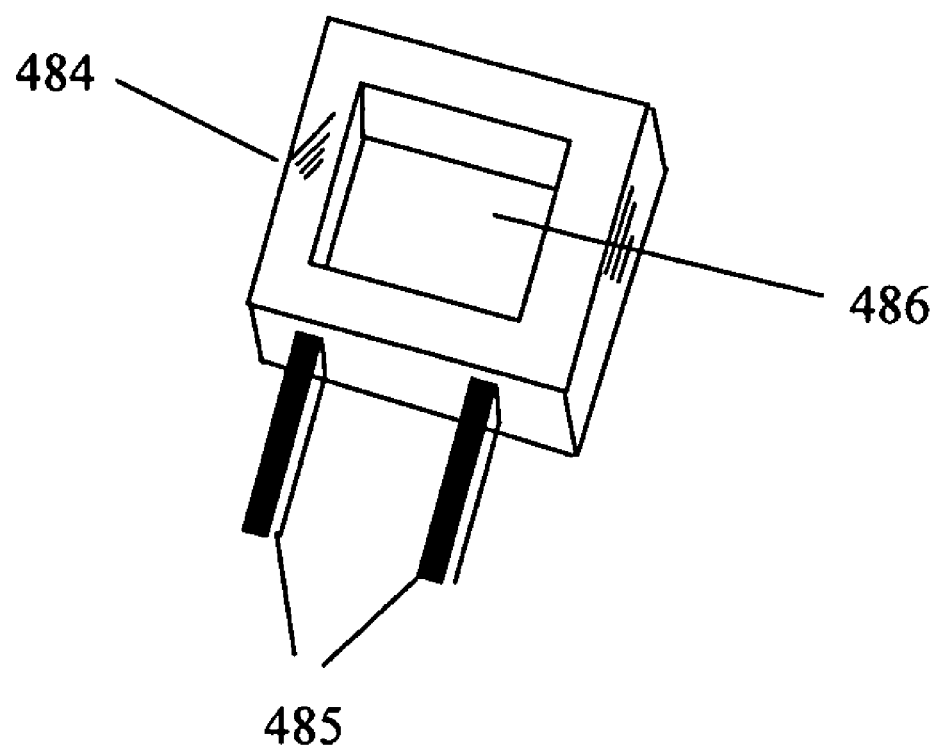
FIG. 17 is a perspective view of the induction heating concentrator of FIG. 16.

FIG. 16 illustrates a step in the chip-to-substrate attachment process. FIG. 16 shows a partial cross section of flip chip package substrates strip 480, with one flip chip package substrate 426 in the center and partial views of flip chip package substrates 426 on each side of the center flip chip package substrate 426, separated by the demarcating slots 464 and 454. Flip chip 422 is shown with its solder bumps 424 aligned with and resting upon solder bump pads 432, which are on the top side of circuitized member 428 and in cavity 483, FIG. 14, of flip chip package substrate 426. In the attachment process for attaching flip chip 422 to flip chip package substrate 426, a tacky solder flux is placed on either the solder bump pads 432 or on the solder bumps 424 before flip chip 422 is placed on flip chip package substrate 426 with the array of solder bumps 424 attached to flip chip 422 resting on the array of solder bump pads 432. FIG. 16 represents the flip chip package substrate 426 with solder flux (not shown) holding the array of solder bumps 424 on the array of solder bump pads 432 at the time that solder bumps 424, are to melted thereby bonding flip chip 422 to flip chip package substrate 426.

FIG. 16 shows a cross section of an induction heater concentrator 484 underneath flip chip package substrate 426. Induction heater concentrator 484 is also shown in better detail in a perspective view in FIG. 17. Induction heater concentrator 484 is connected by electrical conductors 485, shown cut away in FIG. 17, to an RF generator (not shown) that generates an RF current through induction heater concentrator 484. The RF generator and the induction heater concentrator 484 operate as an induction heater or induction heating system.

Induction heater concentrator 484 preferably is a rectangular piece of metal, about 3"×3"×0.35" thick, preferably copper, with a rectangular hole 486 in the center. The size and shape of hole 486, as well as the size and shape of induction heater concentrator 484, may vary based upon the size and shape of the specific flip chips, the location of the solder bumps on the flip chips that are to be attached to the flip chip package substrates, and the distance between induction heater concentrator 484 and flip chip package substrate 426. A toroidal concentrator also may be used. In general, hole 486 should extend beyond the footprint of the solder bumps on the flip chip. The most effective size and shape of hole 486, as well as the size and shape of concentrator 484, may need to be determined empirically.

In operation, the RF generator (not shown) generates an RF current that is transmitted via electrical conductors 485 to the induction heater concentrator 484. The RF current in induction heater concentrator 484 generates an RF magnetic field. The RF magnetic field, represented by lines of magnetic flux 488 in FIG. 16, are strongest in hole 486 and right above, as well as right below hole 486. Metallic media near hole 486, particularly along the axis of hole 486 appear to shape and concentrate the magnetic field within the metallic media. The depth and range of the magnetic field is shaped and controlled by the design of the induction heater concentrator. Because the magnetic field is strongest near hole 486 and on the axis of hole 486, it is preferable to position flip chip package substrate 426, with flip chip 422 and solder bumps 424 in proper alignment on solder bump pads 432, directly above hole 486 and close to induction heater concentrator 484.

When the RF generator was operated at about 450 kilohertz with an RF current of about 100 amperes through induction heater concentrator 484, the RF magnetic field generated by induction heater concentrator 484 generates eddy currents on the order of about a few milliamps in solder bumps 424 and solder bump pads 432. Because of the internal resistance in solder bumps 424 and solder bump pads 432, the eddy currents quickly heat solder bumps 424 and solder bump pads 432 causing solder bumps 424 to melt and bond with solder bump pads 432 within 5 to 10 seconds.

The induction heater—sometimes called an induction heating system (not shown) used in experiments to develop the chip-to-substrate attachment process was manufactured by Seven Associates, Sonora, Calif., and is commercially available. Induction heaters or induction heating systems are also manufactured by Ameritherm of Scottsville, N.Y. These firms also can provide concentrators in various sizes and shapes and thicknesses.

The process of fusing solder bumps 424 on flip chip 422 to solder bump pads 432 on circuitized member 428 at the bottom of the cavity 483 in flip chip package substrate 426 using induction heating provides many advantages. One current process for attaching flip chips to flip chip package substrates requires heating the entire flip chip package substrate or strip of flip chip package substrates to a temperature of about 20° C.-40° C. above the melting temperature of the solder bumps and holding that temperature for at least 15-20 seconds. The process precludes using FR4 or BT resin or other similar inexpensive organic materials as the material for the substrate when a flip chip has solder bumps that melt at temperatures much higher than about 200° C., because FR4 or BT resin or similar inexpensive organic materials cannot withstand such high temperatures for such period of time. The current process requires several minutes to heat the flip chip and flip chip package substrate, to allow time for the solder to melt and then to cool the flip chip and flip chip package substrate. Using an induction heater allows very selective and localized heating. Using an induction heater with an appropriate induction heater concentrator 484, solder bumps 424 and solder bump pads 432 are heated and solder bumps 424 are bonded to solder bump pads 432, typically in less than 10 seconds. Because the induction heater produces very localized heating, there is very little heating of the surrounding materials. Thus using an induction heater to attach flip chip 422 to flip chip package substrate 426, makes it possible to use organic materials, such as FR4 or BT-resin, in flip chip package substrate 426, without risk of damaging flip chip package substrate 426 during the attachment process.

RF heating/induction heating has been used extensively in heating solder for connecting cables or attaching connectors to cables. Cables are inserted and passed through the hole in the concentrator. The magnetic flux density is the greatest in the center of the hole. Connectors are soldered quickly to cables placed in the center of the hole. Typically the melting of solder bumps or solder balls in attaching flip chips to electronic packages or attaching electronic packages to PC boards has been carried out as a batch process in a reflow oven. Experiments carried out by the inventor have shown that the magnetic flux density above the concentrator is of sufficient strength to melt solder bumps. Experiments also have shown that organic materials, such as the polyimide substrate of circuitized member 428 and the glass fiber reinforced/filled epoxy adhesive, e.g. FR4, used to make primary bonding member 430, placed between induction heater concentrator 484 and solder bumps 424 neither are heated significantly by the magnetic flux nor prevent the magnetic flux from heating and melting solder bumps 424. These experiments have shown that it is not necessary to insert an electronic package substrate into the center of the concentrator to melt solder bumps to attach flip chips. These experiments have further shown that since an RF heating/induction heating system can melt solder bumps 424 on flip chip package substrate 426 placed above the induction heater concentrator in a few seconds, an RF heating/induction heating system or an induction heater can be used effectively and efficiently in an in-line process step for attaching flip chips 422 to flip chip package substrates 426.

Figure 18:
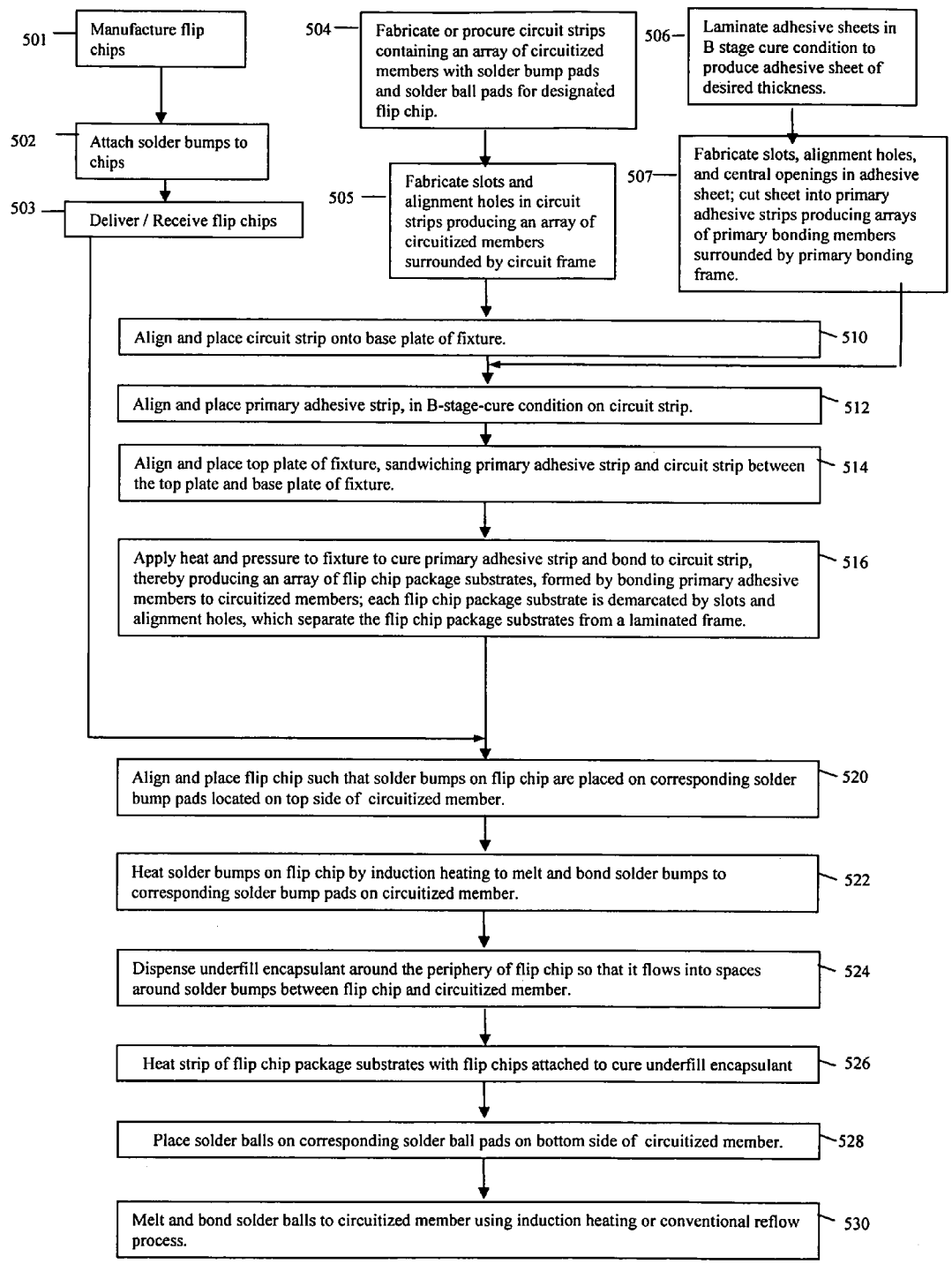
FIG. 18 is a flow diagram of a process for making multiple flip chip electronic packages according to the present invention.

FIG. 18 shows the various steps in the process for making multiple flip chip electronic packages. As indicated by reference numeral 501 in FIG. 18, the process begins with the manufacture of flip chip 422. The flip chip manufacturer typically attaches an array of solder bumps 424 to each flip chip 422, as indicated by reference numeral 502 or sends flip chips 422 to a processor who attaches solder bumps 424 to each flip chip 422. Flip chips 422 are then delivered to and received by the flip chip package assembler, as indicated by reference numeral 503. The flip chips may be still in wafer form or may be singulated.

Circuit strips 450 containing a 1×N array or a row of circuits on a polyimide tape corresponding to what will become circuitized members are fabricated or procured, as indicated by reference numeral 504. Slots 454 and alignment holes 456 are formed in each circuit strip, effectively defining a row of circuitized members 428 surrounded by circuit frame 52, as indicated by reference numeral 505. Circuit frame 452 essentially is the polyimide substrate that is not part of any circuitized member 428.

Continuing to refer to FIG. 18, as indicated by reference numeral 506, a vendor of sheets of glass-fiber-reinforced/filled epoxy resin adhesive, such as FR4 or BT resin, or a flip chip electronic package assembler laminates the required number of thin adhesive sheets, in a B-stage cure or semi-cured state, to make adhesive sheets of desired thickness. The vendor or the assembler fabricates central openings 431, slots 464, and alignment holes 466, in the adhesive sheet, creating an array of primary bonding members 430, and cuts the adhesive sheet into adhesive strips 460, as indicated by reference numeral 507. Each adhesive strip 460 has a row of primary bonding members 430, surrounded by primary bonding frame 462. Primary bonding frame 462 essentially is the remainder of adhesive strip 460 that is not part of any primary bonding member 430. Slots 464, alignment holes 466, and central openings 431 in each adhesive strip 460 are aligned with corresponding slots 454 and alignment holes 456 in circuit strip 450 and the array of solder bump pads 432 in each circuitized member 428.

Flip chips 422, circuit strips 50, and adhesive strips 460 are brought together for assembly. Flip chip package substrates are fabricated next. As shown in FIG. 13, and as previously described, circuit strip 450 is aligned and placed over alignment pins 474 on top of base plate 472, as indicated by reference numeral 510 in FIG. 18. Adhesive strip 460, still in a B-stage cure or semi-cured state, is placed over alignment pins 474 on top of circuit sheet 50, as indicated by reference numeral 512. Preferably fixture 470 is designed to accommodate more that one lamination of circuit strip 450 and adhesive strip 460, in which case, a separator (not shown) is placed over alignment pins 474 on top of adhesive strip 460, and successive layers of circuit strip 450 and adhesive strip 460 are stacked on top (not shown). Top plate 476 is placed on top of adhesive strip 460 (or the last adhesive strip 460, if there are multiple layers), as indicated by reference numeral 514.

As indicated by reference numeral 516, FIG. 18, pressure, of about 150 psi, is applied to base plate 472 and top plate 476 thereby compressing circuit strip 450 and adhesive strip 460. Fixture 470 holding the assembled and compressed circuit strip 450 and adhesive strip 460 is heated to about 170° C. and held at about that temperature for about 30 minutes. The optimum pressure, temperature, and time may vary depending upon the particular chemistry and the thickness of adhesive strip 460 and the number of strips being fabricated. As a result of the heat and pressure, adhesive strip 460 cures and becomes stiffer and circuit strip 450 and adhesive strip 460 bond together forming flip chip package substrate strip 480, FIG. 14, which is a row of flip chip package substrates 426, each of which is demarcated by slots and alignment holes, surrounded by flip chip package substrate frame 482, FIG. 14. Flip chip package substrate frame 482 is the laminated frame that results from the bonding of circuit frame 452 and primary bonding frame 462.

The attachment of flip chip 422 to flip chip package substrate 426 employs commercially available multi-tasking/pick-and-place equipment, not shown. Flip chip package substrate strip 480, illustrated in FIG. 14, is fed into the equipment. Flip chip package substrate strip 480 travels along guide rails inside the equipment. Flip chips 422, with solder bumps 424 attached, are also fed into the equipment. The equipment applies solder flux either onto solder bumps 424 or onto solder bump pads 432 in the cavity 483 of flip chip package substrate 426. The pick-and-place equipment aligns and places flip chip 422 into cavity 483 of flip chip package substrate 426, aligning solder bumps 424 with corresponding solder bump pads 432, as indicated by reference numeral 520. The pick-and-place equipment uses machine vision to obtain precise alignment. The equipment may have multiple heads that place flip chips 422 on each of the flip chip package substrates 426 in flip chip package substrate strip 480 simultaneously, or the equipment may have a single head that places flip chips 422, one at a time, onto successive flip chip package substrates 426. Since the solder flux is tacky, flip chip 422 is held in place while flip chip package substrate strip 480 is moved to the next position.

After flip chips 422 have been placed and aligned on all flip chip package substrates 426 in flip chip package substrate strip 480, flip chip package substrate strip 480 is advanced to the bonding station where the solder bumps 424 and solder bump pads 432 are heated by an induction heater as illustrated in FIG. 16, and solder bumps 424 are melted and bonded to solder bump pads 432, as indicated by reference numeral 522, FIG. 18. The bonding of flip chips 422 to the entire row of flip chip package substrates 426 in flip chip package substrate strip 480 are executed simultaneously with multiple induction heaters or sequentially with one induction heater.

After flip chips 422 are bonded to all flip chip package substrates 426 in flip chip package substrate strip 480, flip chip package substrate strip 480 is advanced along the rails of the equipment to the underfill encapsulating station where the equipment dispenses underfill encapsulant around the periphery of the flip chip so that the underfill encapsulant flows into the space around solder bumps 424 between flip chip 422 and circuitized member 428 and out to the periphery of flip chip 422, as indicated by reference numeral 524, FIG. 18.

Flip chip package substrate strip 480 then advances to a heating area or oven where flip chip package substrate strip 480 is heated to cure underfill encapsulant 438, as indicated by reference numeral 526, FIG. 18.

Flip chip package substrate strip 480 is then advanced to the next station where flux is applied to solder balls 442 or solder ball pads 434 and solder balls 442 are placed on corresponding solder ball pads 434 on the bottom side of circuitized member 428, as indicated by reference numeral 528, FIG. 18. It may be more convenient, and depending upon the equipment, it may be necessary to turn flip chip package substrate strip 480 over before placing solder balls 442 on solder ball pads 434.

After solder balls 442 have been placed on solder ball pads 434, flip chip package substrate strip 480 is advanced to the heating station. The flux holds solder balls 442 in place. Solder balls 442 and solder ball pads 434 are heated to melt solder balls 442 and bond them to their corresponding solder ball pads 434, using a conventional reflow process or induction heating, as indicated by reference numeral 530, FIG. 18. A strip of complete flip chip electronic packages 420 emerges from the heating station. Individual flip chip electronic packages 420 are singulated from the strip by either punching or sawing the material between the alignment holes and slots.

Figure 19:
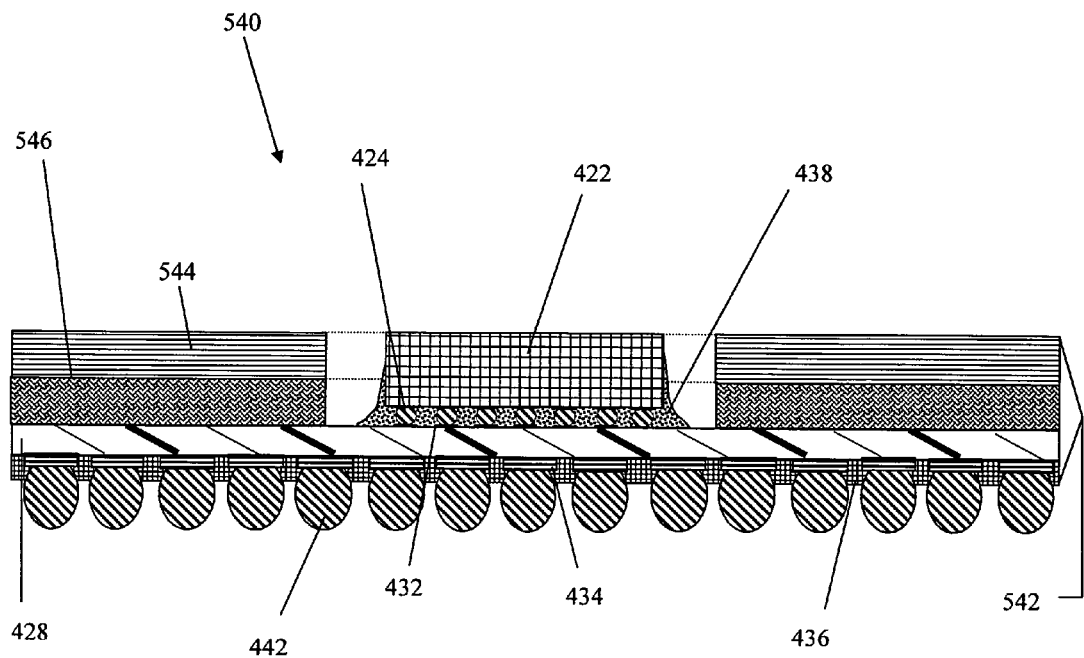
FIG. 19 is a cross-sectional view in side elevation of a second embodiment of a flip chip electronic package according to the present invention.

FIG. 19 shows a cross-section of a second embodiment of the flip chip electronic package. Flip chip electronic package 540 has a different flip chip package substrate from the flip chip package substrate in flip chip electronic package 420, FIG. 12. Flip chip package substrate 542 in flip chip electronic package 540 incorporates a stiffening member 544. Stiffening member 544 is metallic, preferably made of copper. In addition to the incorporation of stiffening member 544 into flip chip package substrate 542, primary bonding member 546 in flip chip package substrate 542 may be thinner than primary bonding member 430, compensating for the thickness of stiffening member 544. Aside from the difference in thickness, primary bonding member 546 is fabricated in the same way that primary bonding member 430 is fabricated.

Stiffening member 544 provides enhanced stiffness to flip chip package substrate 542 and flip chip electronic package 540.

Figure 20:
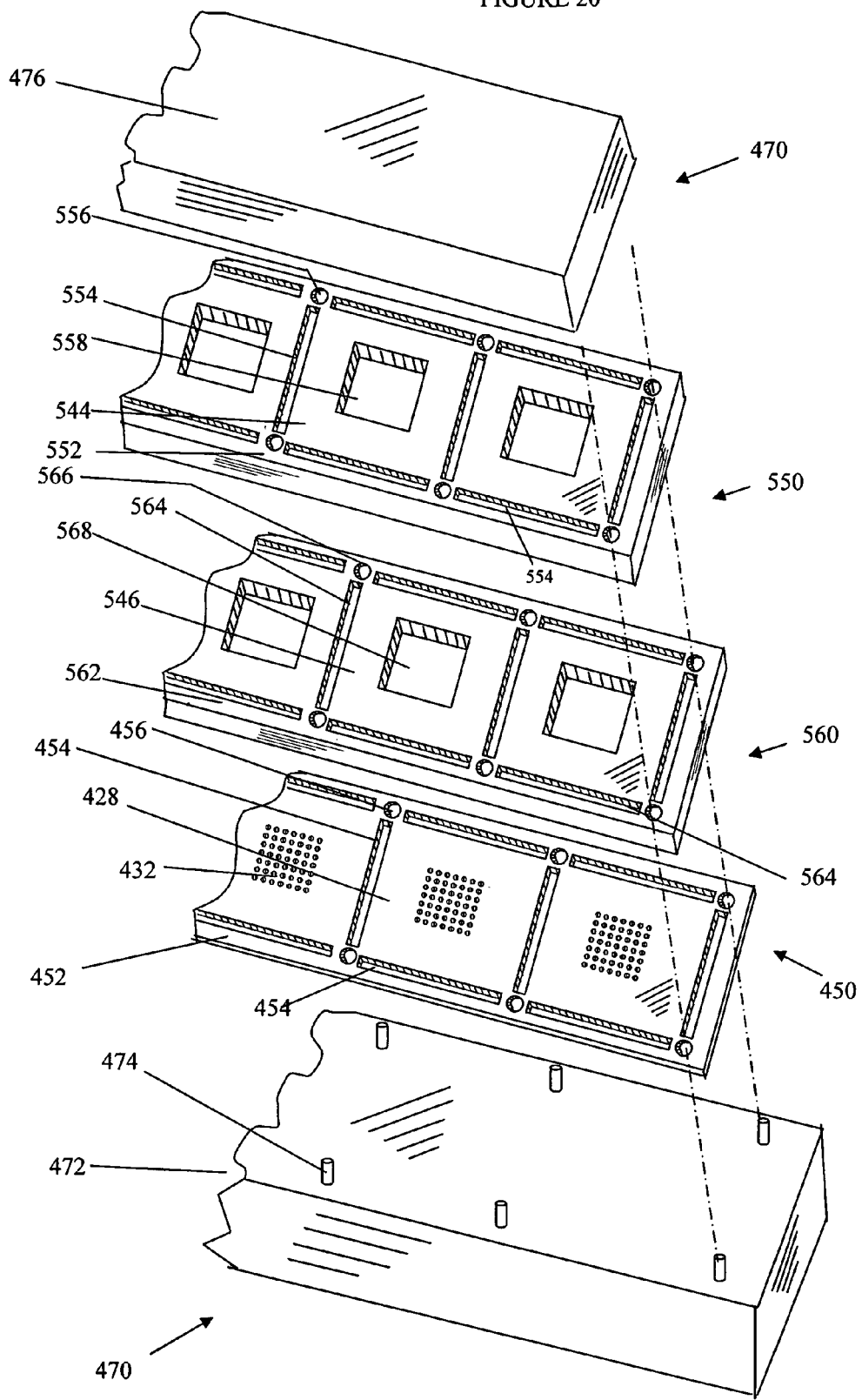
FIG. 20 is an exploded, perspective view cut away of the components for fabricating a row of flip chip package substrates for the flip chip electronic package of FIG. 19 in a flip chip package substrate strip and the fixture used in fabricating them.

FIG. 20 illustrates the assembly of flip chip package substrates 542 and shows in perspective view the components that are combined to make multiple units of flip chip package substrate 542. Reference numeral 550 refers generally to a metallic strip containing a row of stiffening members 544 surrounded by a stiffening frame 552. An array of slots 554 and alignment holes 556 essentially demarcates each stiffening member 544 and separates each stiffening member 544 from stiffening frame 552. There is an orifice or central opening 558 in each stiffening member 544. Reference numeral 560 refers generally to an adhesive strip, which preferably is made from the same materials used to make adhesive strip 460, FIG. 13, and is fabricated in the same manner as adhesive strip 460. As shown in FIG. 20, primary adhesive strip 560 has a row of primary bonding members 546 surrounded by a primary bonding frame 562. An array of slots 564 and alignment holes 566 essentially demarcates each primary bonding member 546 and separates each primary bonding member 546 from primary bonding frame 562. There is an orifice or central opening 568 in each primary bonding member 546. Slots 554 in metallic strip 550 and slots 564 in primary adhesive strip 560 are fabricated so that slots 554 and slots 564 align with slots 454 in circuit strip 450. Alignment holes 556 in metallic strip 550 and alignment holes 566 in primary adhesive strip 560 are fabricated similarly to align with alignment holes 456 in circuit strip 450. Central openings or orifices 568 in primary bonding member 546 and central openings or orifices 558 in stiffening member 544 are aligned with each other and aligned with the array of solder bump pads 432 on circuitized member 428, so that central opening 558 in each stiffening member 544 and central opening 568 in each corresponding primary bonding member 546 form the side walls of a cavity, the base of which is a corresponding circuitized member 428, with the array of solder bump pads 432 on circuitized member 428 at the approximate center of the base of the cavity to accommodate flip chip 422 and the alignment of solder bumps 424 on flip chip 422 with solder bump pads 432 on circuitized member 428.

Referring to FIG. 20, circuit strip 50, primary adhesive strip 560, metallic strip 550, and top plate 476 are mounted on base plate 472 and aligned using alignment pins 474. The assemblage is compressed and heated under pressure, in the same manner as described in the process for making flip chip package substrates 426 in FIG. 13, and as discussed in relation to FIG. 18.

The incorporation of metallic strip 550, FIG. 20, into the process for fabricating strips of flip chip package substrates 542, FIG. 19, gives the strip of flip chip package substrates 542 greater stiffness and makes it easier to handle and transport. Stiffening frame 552 facilitates handling the strips of flip chip package substrate 542 in the multi-tasking/pick-and-place equipment, not shown, in which flip chips 422 are bonded to flip chip package substrates 542.

Figure 21:
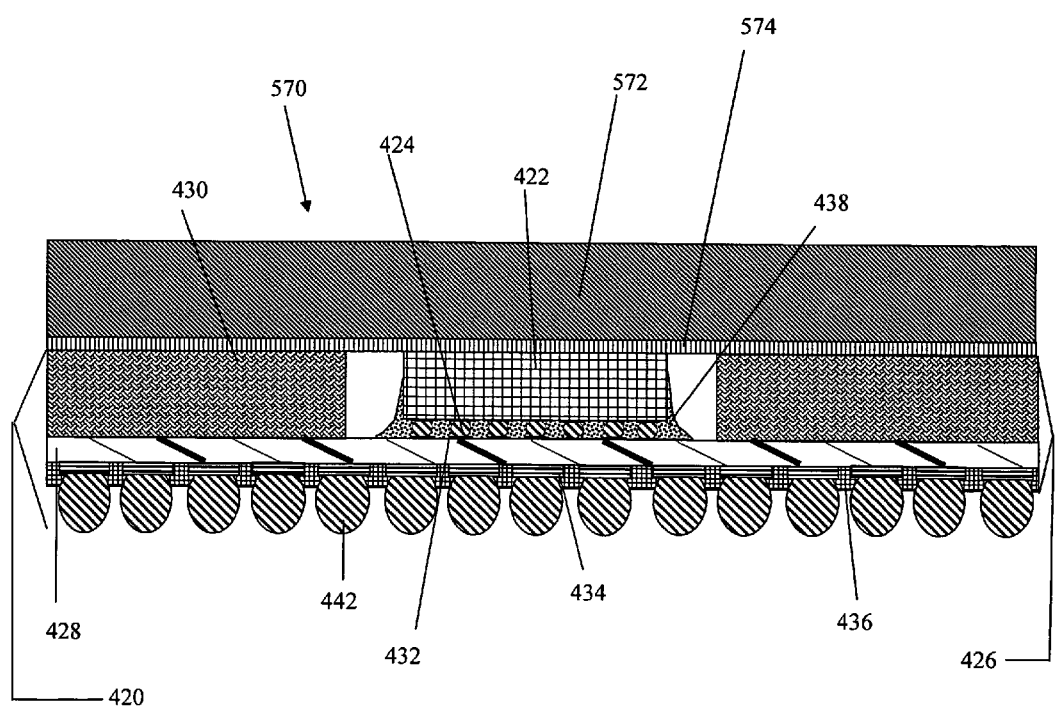
FIG. 21 is a cross-sectional view in side elevation of a third embodiment of a flip chip electronic package according to the present invention.

FIG. 21 shows a third embodiment of the flip chip electronic package. Flip chip electronic package 570 is the flip chip electronic package 420 described above with a heat sink 572 bonded to the top of flip chip electronic package 420 by a thermally conductive secondary bonding member 574. Flip chip electronic package 570 is particularly well suited for flip chips that generate substantial heat during operation that must be dissipated for reliable operation.

Heat sink 572 is a rigid, substantially flat or planar, and substantially rectangular member. The material for heat sink 572 is selected to provide good heat transfer qualities. Heat sink 572 is preferably made of metal, such as copper or aluminum; however, other thermally conductive materials can be used. The contacting surface of heat sink 572, i.e. the surface that will be bonded to secondary bonding member 574, preferably is treated to improve the adhesion. One treatment that improves chemical bonding, particularly of a copper heat sink 572, is to form an oxide layer, commonly known as black oxide, by exposing one surface, of a sheet of copper from which heat sink 572 will be made, to a chemical oxidant. Another treatment to improve the chemical bonding is to apply a chemical coating, e.g. plate the copper sheet with a thin nickel layer. Additionally, there are various techniques to improve the mechanical bonding attributes of heat sink 572 involving the roughening or texturing of the contacting surface. The thickness of heat sink 572 can vary; however, the thickness of heat sink 572 is prescribed to provide sufficient thermal mass to dissipate adequately the heat generated by flip chip 422. Generally, a copper heat sink having a thickness in the range of about 0.5 mm to about 1.0 mm provides adequate thermal conductivity for most flip chips. Heat sink 572 preferably is cut from a sheet of copper, in sizes corresponding with conventional sizes of BGA packages. Stamping is the most economical method of cutting; however, sawing and cutting are alternatives.

The heat dissipation characteristics of flip chip electronic package 570 is enhanced further to accommodate flip chips that produce very substantial amounts of heat by making heat sink 572 with groves and ridges (not shown) in the surface of heat sink 572 opposite to the surface to which flip chip 422 is attached. The grooves and ridges increase the effective surface area of heat sink 572 and allow sufficient heat dissipation for flip chips that operate at high frequencies and flip chips with high circuit density. Preferably the ridges and grooves are made in the sheet from which heat sinks 572 are stamped or cut out before the heat sinks 572 are stamped or cut out.

Figure 22:
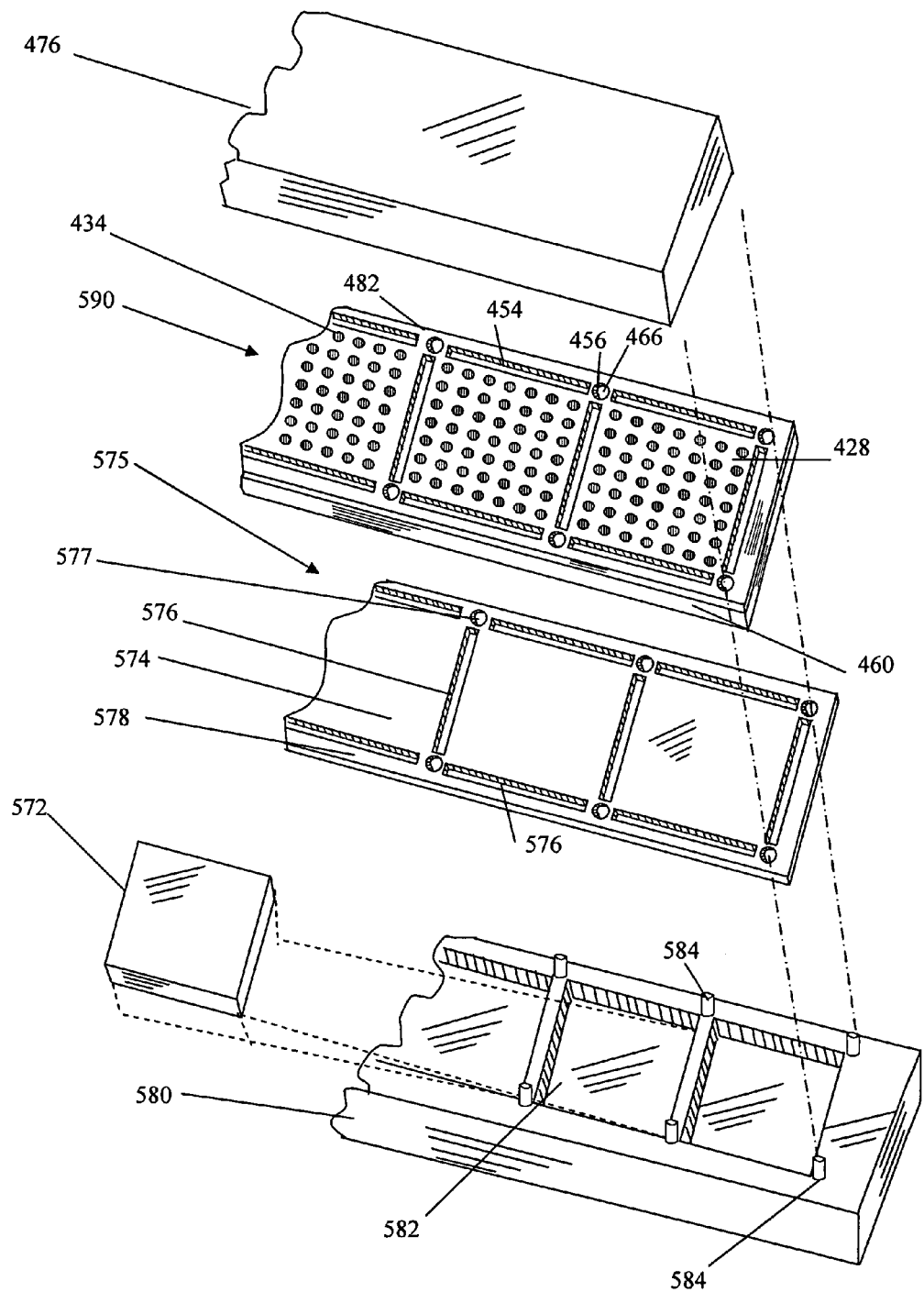
FIG. 22 is an exploded, perspective view cut away of the components for fabricating a row of the flip chip packages of FIG. 21 in a flip chip package substrate strip and the fixture used in fabricating them.

Secondary bonding member 574, FIG. 21, is made from a thermally conductive adhesive, preferably a silver-filled epoxy adhesive. Preferably secondary bonding member 574 is formed from a strip of such thermally conductive adhesive initially in a B-stage or partially cured state. Sheets and strips of such thermally conductive adhesive can be procured from TechFilm Services, Inc. of Billerica, Mass., or Ablestik Laboratories, Rancho Dominguez, Calif. Preferably the strip is about 3 mils thick or thicker, to facilitate handling and fabrication, and the same width as circuit strip 50, FIG. 13, and primary adhesive strip 460. Slots and alignment holes are fabricated in the thermally conductive adhesive strip, in the same manner as the slots and alignment holes are fabricated in circuit strip 50, FIG. 13, and primary adhesive strip 460, FIG. 13, described above. These slots and alignment holes are best seen in FIG. 22, which shows a partial view of a secondary adhesive strip 175 containing a row or a 1×N array of secondary bonding members 574, with an array of slots 576 and alignment holes 577 demarcating each secondary bonding member 574 and separating the secondary bonding members 574 from secondary bonding frame 578. The purpose of secondary bonding member 574 is to bond heat sink 572 to flip chip 422 and to the flip chip package substrate of the particular flip chip electronic package; e.g., in FIG. 21 and FIG. 22, secondary bonding member 574 bonds heat sink 572 to flip chip package substrate 426 of flip chip electronic package 420. Secondary bonding member 574 also bonds heat sink 572 to the flip chip package substrate of other flip chip electronic packages, as will be appreciated when viewing FIG. 23 and considering the description thereof set out below.

FIG. 22 shows the components and the fixture to align, sandwich, and bond the components in fabricating a row of thermally-enhanced flip chip electronic packages 570 in a strip. The components are heat sinks 572; secondary adhesive strip 175 containing a row of secondary bonding members 574 surrounded by secondary bonding frame 578; and electronic package strip 590 containing a row of flip chip electronic packages 420, without solder balls, surrounded by flip chip package substrate frame 482. Electronic package strip 590 is the row of flip chip electronic packages 420, FIG. 12, without solder balls 442, FIG. 12, surrounded by flip chip package substrate frame 482, FIG. 14, as flip chip package substrate strip 480, FIG. 14, would emerge from process step 526 in FIG. 18. That is to say, electronic package strip 590 is the strip of flip chip electronic packages 420, FIG. 12, prior to process steps 528 and 530, FIG. 18, attaching and bonding solder balls 442, FIG. 12, and prior to singulation. FIG. 22 shows electronic package strip 590 without solder balls 442, FIG. 12, and in a flipped-over position from the position shown in previous figures. The side of circuitized member 428 that has previously been deemed the bottom side is shown in FIG. 22 on top with solder ball pads 434, FIG. 12 and FIG. 22, exposed on top.

As shown in FIG. 22, base plate 580 has central cavities 582 and alignment pins 584. Central cavity 582 has about the same dimensions as heat sink 572 with slight tolerances so that heat sink 572 can be placed in cavity 582 and then removed after heat sink 572 has been attached. The depth of cavity 582 is about the same dimension as the thickness of heat sink 572. The purpose of base plate 580 is to hold the heat sinks 572 during the assembly and bonding of heat sinks 572 to secondary bonding members 574 and to cooperate in compressing and bonding processes.

Referring to FIG. 22, in assembling the components to make thermally enhanced flip chip electronic packages 570, heat sinks 572 are placed into cavities 582 in base plate 580. Next, secondary adhesive strip 175 containing a row of secondary bonding members 574 is placed on top of base plate 580 with alignment holes 577 going over alignment pins 584. Next, electronic package strip 590 is placed on top of secondary adhesive strip 175 with alignment holes 466, barely visible in FIG. 22 and better viewed in FIG. 13 and FIG. 14, and alignment holes 456 (also better viewed in FIG. 13) going over alignment pins 584. Top plate 476, which was used in the assembly of strips of flip chip package substrates 426, and which was shown in FIG. 13, is placed on top of electronic package strip 590.

The assemblage of base plate 580, with heat sinks 572 in cavities 582, secondary adhesive strip 175, electronic package strip 590, and top plate 476 undergo the same processing employed to bond circuit strip 50, FIG. 13, to adhesive strip 460, FIG. 13, to form flip chip package substrate strip 480, FIG. 14, as described above. Pressure is applied to the assemblage and the assemblage is heated to about 170° C. and held at that temperature for about 30 minutes. Under these conditions, the adhesive in secondary adhesive strip 175 flows into any surface irregularities on the surfaces of heat sinks 572 and forms strong bonds to these heat sinks 572; secondary adhesive strip 175 also bonds to adhesive strip 460, containing a row of primary bonding members 430 (not visible in FIG. 22), and to the tops of flip chips 422 (not visible in FIG. 22). After this curing process is finished and electronic package strip 590 is removed from the fixture, solder balls 442, FIG. 12, are bonded to solder ball pads 434, FIG. 12 and FIG. 22, completing the assembly of a strip of thermally enhanced flip chip electronic packages 570. Individual flip chip electronic packages 570 are singulated from electronic package strip 590 by either punching or sawing the material between the alignment holes and slots.

Figure 23:
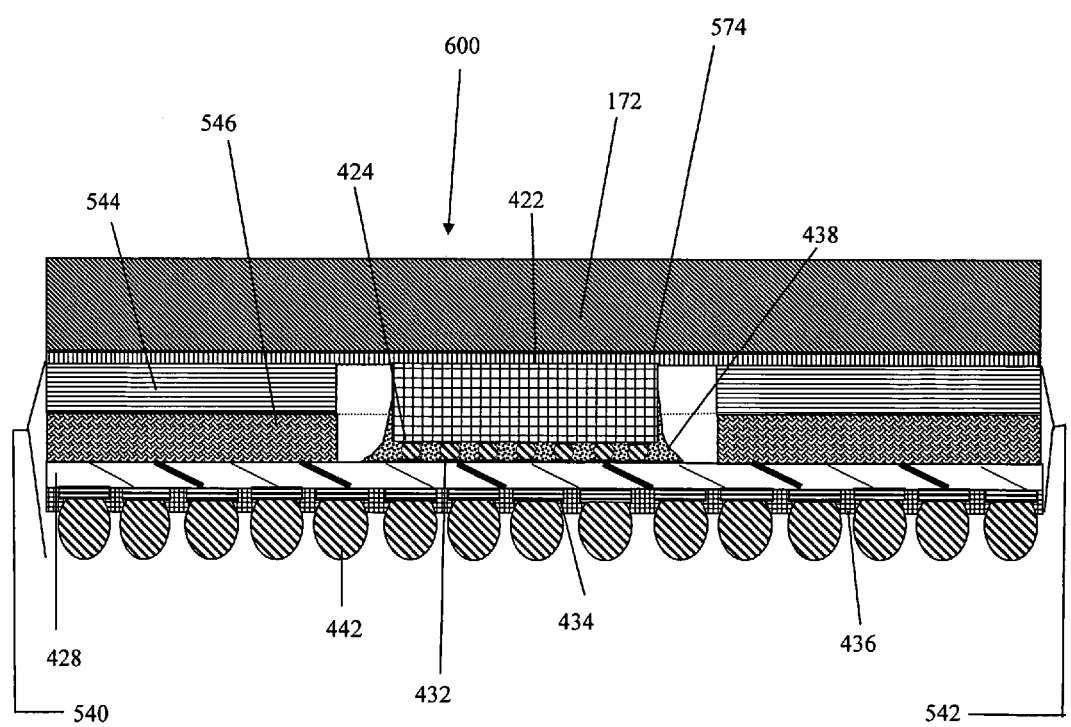
FIG. 23 is a cross-sectional view in side elevation of a fourth embodiment of a flip chip electronic package according to the present invention.

FIG. 23 shows a fourth embodiment of the flip chip electronic package. Flip chip electronic package 600 is the flip chip electronic package 540 of FIG. 19 with heat sink 572 bonded to the top of flip chip electronic package 540 by the thermally conductive secondary bonding member 574. Flip chip electronic package 600 combines the advances of flip chip electronic package 540, FIG. 19, in providing a stiffer electronic package and a stiffer frame for handling multiple flip chip package substrates and multiple flip chip electronic packages during the fabrication processes, with the added heat dissipation properties of flip chip electronic package 570, FIG. 21. The thermal enhancement makes flip chip electronic package 600 particularly well suited for flip chips that generate substantial heat during operation that must be dissipated for reliable operation. The incorporation of stiffening member 544 provides added stiffness of flip chip electronic package 600. The incorporation of metallic strip 550, FIG. 20, in the process of making flip chip package substrate 542 provides additional robustness to the strip of flip chip package substrates 542 produced in fabricating flip chip package substrates 542. This robustness facilitates the handling of the strip of flip chip package substrates 542 in the chip-to-substrate attachment process in making flip chip electronic package 570, FIG. 21, and converting flip chip electronic package 570 to the thermally enhanced flip chip electronic package 600. The heat sinks 572 are bonded to the tops of flip chip electronic packages 540 in the same manner as heat sinks 572 are bonded to the tops of flip chip electronic packages 420 as described above.

Figure 24:
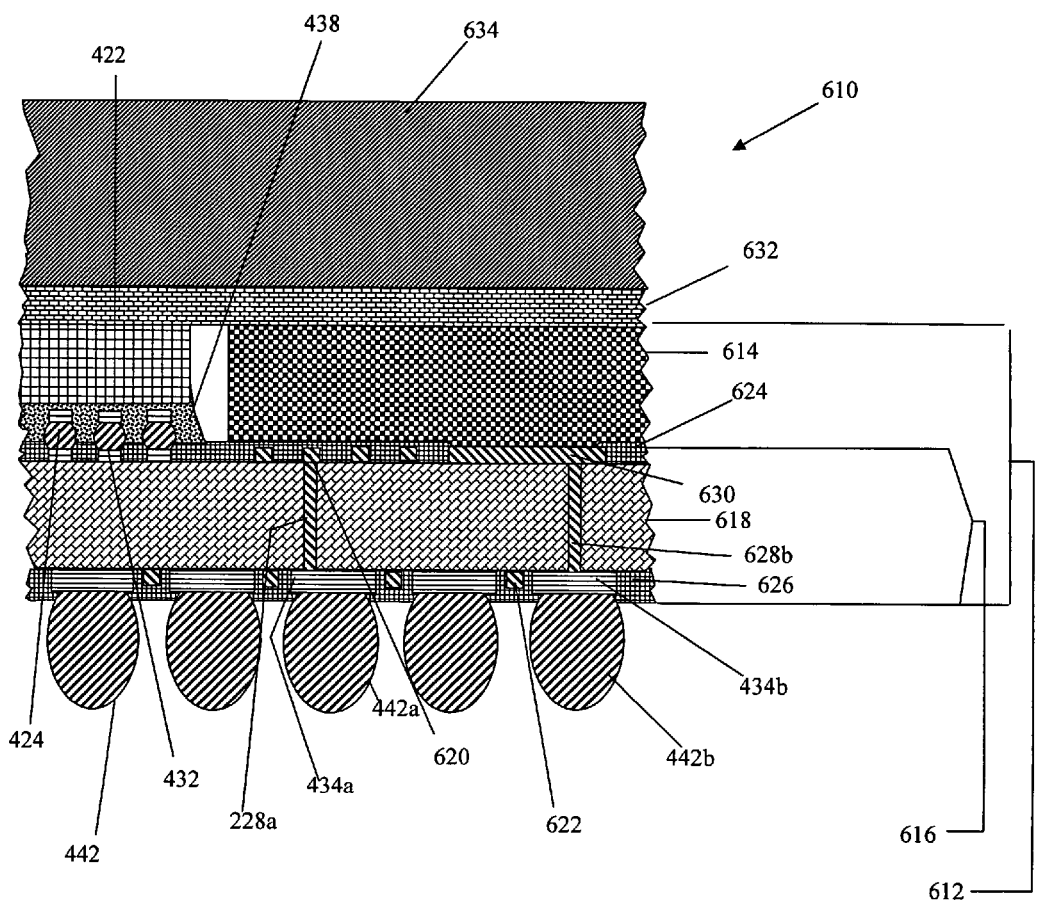
FIG. 24 is an enlarged, cross-sectional view in side elevation cut away of a fifth embodiment of a flip chip electronic package according to the present invention.

FIG. 24 shows an enlarged partial cross section of a fifth embodiment of the flip chip electronic package in which the bonding members are made from electrically conductive adhesives thereby enabling a heat sink to become a very effective ground plane in the flip chip electronic package and enabling the flip chip electronic package to provide its own shielding against electromagnetic interference (EMI). Referring to FIG. 24, reference numeral 610 refers generally to a flip chip electronic package with electrically conductive bonding members. Flip chip 422 in flip chip electronic package 610 is mechanically and electrically bonded to a flip chip package substrate 612. Flip chip package substrate 612 comprises a primary bonding member 614 and a circuitized member 616. Both primary bonding member 614 and circuitized member 616 differ in important aspects from their counterparts, primary bonding member 430 and circuitized member 428, FIGS. 12-16.

Primary bonding member 614 is made from an electrically conductive adhesive. An adhesive is made electrically conductive by filling the adhesive with electrically conductive particles, fibers, flakes, or wires. The electrically conductive fillers typically are metallic. In the preferred embodiment the electrically conductive adhesive is made of an epoxy adhesive filled with silver particles. The silver particles typically are several microns thick by tens of microns long, occupy about 50% of the volume of the adhesive, and provide about 80% of the weight of the adhesive. The multitudinous tiny particles form numerous electrical paths throughout the adhesive during the curing process, making the adhesive an isotropic electrically conductive adhesive when cured. In addition to providing electrical conduction, silver particles dispersed throughout the adhesive are used to regulate the coefficient of thermal expansion. Silver filled epoxy adhesives are not as stiff as the more conventional glass fiber reinforced epoxy adhesives, but generally silver filled epoxy adhesives are of sufficient stiffness when partially cured to a B-stage to allow handling during the fabrication of electronic package substrate 612. Electrically conductive adhesives in strip or sheet form are available from Ablestik Laboratories, a National Starch and Chemical Company, Rancho Dominguez, Calif. Another source is TechFilm of Billerica, Mass. Primary bonding members 614 are fabricated from sheets or laminations of sheets of electrically conductive adhesive in the thickness to provide the appropriate depth of the cavity in flip chip electronic package substrate 612 for the particular flip chip 422 for which electronic package substrate 612 is designed, using the same principles for determining the thickness that are used to determine the thickness of primary bonding member 430 in electronic package substrate 426 and using the same techniques that are used to fabricate primary bonding member 430. The purposes of primary bonding member 614 are to bond to circuitized member 616, to be a support of circuitized member 616, to be a support of flip chip package substrate 612, and to provide electrical conduction as discussed below.

Circuitized member 616, FIG. 24, like circuitized member 428, FIGS. 12-16, preferably is a flexible circuit. Circuitized member 616, as is the case for circuitized member 428, FIGS. 12-16, is designed and fabricated to conform to the size and form factor of flip chip 422 and to the number and arrangement of solder bumps 424 on flip chip 422, as well as to the number and arrangement of solder balls 442 specified for flip chip electronic package 610. In a preferred embodiment, circuitized member 616 has a circuitized member substrate 618 made of polyimide and photolithographically developed conductive traces on both sides of circuitized member substrate 618: upper conductive traces 620 on the top surface of circuitized member substrate 618 and lower conductive traces 622, on the bottom surface of circuitized member substrate 618. An upper solder mask 624 covers upper conductive traces 620; a lower solder mask 626 covers lower conductive traces 622. The solder masks electrically insulate the conductive traces. Circuitized member 616 also includes one or more vias 628 through circuitized member substrate 618, one or more electrically conductive pads 630, multiple solder bump pads 432, and multiple solder ball pads 434. There are holes or openings in the solder masks exposing the solder bump pads 432, solder ball pads 434, and other electrically conductive pads 630 where electrical connections are intended. Both upper conductive traces 620 and lower conductive traces 622 are designed to provide electrical paths to facilitate connections between a specific flip chip 422 and contacts on a circuit board. Conductive traces are the pathways for providing electrical power to specific solder bumps 424 on flip chip 422, for transmitting signals to and from specific solder bumps 424 on flip chip 422, and providing grounding to specific solder bumps 424 on flip chip 422. Vias are used to make electrical connection between the top of circuitized member substrate 618 and the bottom of circuitized member substrate 618 and are used specifically to connect (a) an upper conductive trace 620, (b) a solder bump pad 432, or (c) any other electrically conductive pad 630, on the top of circuitized member substrate 618, to (a) a lower conductive trace 622, (b) a solder ball pad 434, or (c) any other electrically conductive pad, on the bottom of circuitized member substrate 618. Electrically conductive pads 630 are used to make connections between one or more vias and an electrically conductive trace or to make connections between one or more vias or one or more electrically conductive traces and electrically conductive primary bonding member 614, which is bonded to circuitized member 616. Electrically conductive pad 630 as depicted in FIG. 24 is representative of a large plane that functions as a ground plane for circuitized member 616. FIG. 24 shows two representative examples of how these elements provide electrical connections. In FIG. 24, upper conductive trace 620 is connected to via 628*a*; via 628*a* also is connected to solder ball pad 434*a*; upper conductive trace 620, via 628*a*, and solder ball pad 434*a* are all part of circuitized member 618; solder ball pad 434*a* is connected to solder ball 442*a*. In the second example, via 628*b* connects solder ball pad 434*b* to a grounding electrically conductive pad 630; solder ball pad 434*b* connects to solder ball 442*b*; electrically conductive pad 630 connects to electrically conductive primary bonding member 614; these connections form an electrical path from solder ball 442*b* to electrically conductive primary bonding member 614. It should be noted that there is a hole (or gap, when viewed in side elevation) in upper solder mask 624 immediately above electrically conductive pad 630 since electrically conductive pad 630 is intended to function as a ground plane and to bond with electrically conductive primary bonding member 614. There is a hole (not shown) in upper solder mask 624 immediately above each electrically conductive pad (not all such pads are illustrated in FIG. 24) that is intended to function as a ground plane and to bond with electrically conductive primary bonding member 614.

Each solder bump pad 432 on the topside of circuitized member 616 connects to or forms part of an upper conductive trace, similar to upper conductive traces 620, FIG. 24. Solder bump pads 432 are used for connecting solder bumps 424 attached to flip chip 422 to appropriate electrical paths in circuitized member 616. There are openings in upper solder mask 624, in the locations where there are solder bump pads 432, enabling the formation of mechanical and electrical connections between these solder bump pads 432 and solder bumps 424. Upper solder mask 624 insulates the upper conductive traces 620 from the electrically conductive primary bonding member 614 and the underfill encapsulant 438, except where there are specifically designed openings or holes.

Primary bonding member 614 extends into the hole(s) in upper solder mask 624 immediately above electrically conductive pad(s) 630 and is mechanically bonded and electrically connected to electrically conductive pad(s) 630. Primary bonding member 614 also is mechanically and electrically bonded to secondary bonding member 632.

Secondary bonding member 632 bonds primary bonding member 614 to heat sink 634. Secondary bonding member 632 is made from an electrically conductive and thermally conductive adhesive. The silver-filled epoxy adhesive from which primary bonding members 614 are fabricated is thermally conductive as well as electrically conductive. Sheets or strips of thermally conductive and electrically conductive silver-filled epoxy adhesive are available from Ablestik Laboratories, a National Starch and Chemical Company, Rancho Dominguez, Calif., or TechFilm of Billerica, Mass.

Heat sink 634, FIG. 24, functions as both a heat sink and an electrical ground plane. Heat sink 634 preferably is made of copper; however, heat sink 634 can be made of aluminum or other thermally and electrically conductive material. The contacting surface of heat sink 634, i.e. the surface that is bonded to secondary bonding member 632, preferably is treated to improve the adhesion between heat sink 634 and secondary bonding member 632. One treatment of a metallic surface, particularly of copper, that improves its chemical bonding with an adhesive is to apply an electrically and thermally conductive chemical coating, e.g. plate the copper sheet with a thin nickel layer. Additionally, there are various techniques to improve the mechanical bonding attributes of a metal, involving the roughening or texturing of the contacting surface. These techniques include mechanical, electrical, and chemical processes that are employed in the metal processing arts. In comparing heat sink 634 with heat sink 572, in FIGS. 21-23, it should be noted that the specifications for heat sink 634 are more restrictive than the specifications for heat sink 572. Heat sink 572, including its contacting surface, is thermally conducting. Heat sink 634, including its contacting surface, is both thermally conducting and electrically conducting.

Heat sink 634 may vary in size and shape to correspond to the sizes and shapes (typically rectangular) specified for BGA packages in industry standards. For example, the standard size for a BGA package with 256 contacts for input/output is about 27 mm×27 mm. Heat sink 634 preferably is made from copper in the range of about 0.5 mm to about 1.0 mm thick. A copper slug of this size typically provides adequate thermal conductivity for most chips and serves as an adequate ground plane. Heat sinks 634 are preferably stamped or cut out from a sheet of copper in sizes corresponding with conventional sizes of BGA packages.

Flip chip electronic package 610 provides one or more continuous electrical paths from one or more selected solder balls 442 and its corresponding solder ball pads 434, to electrically conductive heat sink 634. Each electrical path starts from a selected solder ball 442 and proceeds through solder ball pad 434, to which such solder ball 442 is connected; through via 628, if via 628 is connected to solder ball pad 434, or through lower conductive trace 622, to which such solder ball pad 434 is connected and then through via 628, to which such lower conductive trace is connected; through electrically conductive pad 630, if via 628 is connected directly to electrically conductive pad 630, or through upper conductive trace 620, which is connected to via 628 to electrically conductive pad 630; through electrically conductive primary bonding member 614, which is electrically connected to all electrically conductive pads 630, because of the holes in upper solder mask 624 immediately above such electrically conductive pads 630; through electrically conductive secondary bonding member 632, which is electrically connected to electrically conductive primary bonding member 614 throughout the contact surfaces; to electrically conductive heat sink 634, which is electrically connected to secondary bonding member 632 throughout the contact surface. Each of these electrical paths is intended to be connected, through selected solder ball 442 to a corresponding solder ball pad (not shown) on a circuit board (not shown), which in turn is connected through circuitry on the circuit board to ground. Thus, when flip chip electronic package 610 is connected to a circuit board, and the circuit board is properly connected to ground, there will be one or more electrical paths connecting heat sink 634, secondary bonding member 632, and primary bonding member 614 to ground. Making more than one such electrical path improves the reliability of the grounding connection. When one or more selected solder ball(s) 442 is (are) connected to ground, primary bonding member 614, secondary bonding member 632 and heat sink 634 surround flip chip 422 on top and on all four sides of flip chip 422 with a grounded enclosure providing shielding of flip chip 422 from electromagnetic interference from the top and all four sides. The grounded enclosure also provides shielding for other circuitry against EMI emitted by flip chip 422 through the top and all four sides of flip chip 422. Grounded solder balls 442 positioned underneath flip chip 422 provide similar shielding of flip chip 422 against EMI from below and shield other circuitry from EMI emitted by flip chip 422 through its bottom.

Flip chip electronic package 610 provides a grounded enclosure on five of the six sides surrounding flip chip 422. PC boards often are made with multi-layers and often have ground planes in large areas of the PC board. A combination of the grounded enclosure of flip chip electronic package 610, the grounded solder balls 442, and a ground plane (not shown) in one layer of a PC board (not shown) directly under flip chip electronic package 610 provides a 6-sided Faraday cage shielding flip chip 422 against electromagnetic interference (EMI) from external sources and shielding circuitry on the PC board from EMI generated by flip chip 422. The combination of flip chip electronic package 610 and a ground plane in one layer of a PC board underneath flip chip 422 provides a high level of EMI shielding that is comparable to what is provided by a separate metal Faraday cage, without the cost and without the extra space required for such a separate Faraday cage.

Electrically conductive pads 630, electrically conductive primary bonding member 614, electrically conductive secondary bonding member 632, and electrically conductive heat sink 634 are all connected electrically. These elements form a common ground plane when one or more electrically conductive pad(s) 630 is (are) connected to ground. Having a common ground plane facilitates making ground connections to the various and often numerous solder bumps 424 of flip chip 422 that need to be grounded. A solder bump 424 that is designed as a ground connection is connected to ground by an upper conductive trace 620 that runs from electrically conductive pad 630 to the solder bump pad 432 connected to the solder bump 424. Alternatively a solder bump 424 is grounded through a path that runs from electrically conductive pad 630 down via 628 directly under electrically conductive pad 630, then along a lower conductive trace 622 to another via 628, then up that via 628 to the solder bump pad 432 to which the solder bump 424 is connected. These specific connections are not illustrated in FIG. 24. Because flip chip electronic package 610 provides these two alternative paths for grounding a solder bump 424, neither of which requires a path directly to its own corresponding solder ball pad 434, the number of solder balls required is reduced and the complexity of ground paths is reduced.

The ability to use heat sink 634 as a ground plane provides a significant advantage in freeing up valuable space on circuitized member 616 that would otherwise be used for a ground plane or to make direct ground connections. Using heat sink 634 as a ground plane effectively provides an added layer to circuitized member 616 without the cost of having a multilayered circuitized member. Because the electrically conducting primary bonding member 614 lies above the whole surface of circuitized member 616, ground connections can be made from any location on the top surface of circuitized member 616 to the electrically conducting primary bonding member 614, which is electrically connected to heat sink 634 thereby increasing the efficiency of routing ground connections to a ground plane. Having a more efficient arrangement for ground paths and having shorter ground paths on circuitized member 616 leaves more room on circuitized member 616 to run conductive traces for signals from solder bumps 424 to solder balls 442. This enables flip chip electronic package 610 to accommodate flip chips with more signal inputs and signal outputs.

Although the sheets of materials, from which circuit strips, adhesive strips, and the heat sinks for flip chip package substrate 612 and flip chip electronic package 610 are fabricated, have different specifications and requirements than the sheets of materials from which circuit strips, adhesive strips, and the heat sinks for flip chip package substrate 426 and flip chip electronic package 570 are fabricated, the components of flip chip package substrate 612 and flip chip electronic package 610 are fabricated, assembled, and bonded in the same way as the components for flip chip package substrate 426 and flip chip electronic package 570 are fabricated, assembled, and bonded as illustrated in FIG. 13, FIG. 18, and FIG. 22 and described in connection therewith.

It has been pointed out that there is a hole or opening in upper solder mask 624 immediately above each electrically conductive pad 630. Hence when an adhesive strip containing a row of primary bonding members 614 is placed upon a circuit strip containing a row of circuitized members 616 to fabricate flip chip package substrate 612, as is done in the assembly process illustrated in FIG. 13, there will be a gap between circuitized member 616 and primary bonding member 614 wherever there is a hole or an opening in upper solder mask 624 immediately above an electrically conductive pad 630. The thickness of this gap is equivalent to the thickness of upper solder mask 624, which is about 10-20 microns. When primary bonding member 614 and circuitized member 616 are compressed and heated to form flip chip package substrate 612, primary bonding member 614 flows and fills in these gaps and bonds mechanically and electrically with electrically conductive pads 630 on circuitized member 616.

Figure 25:
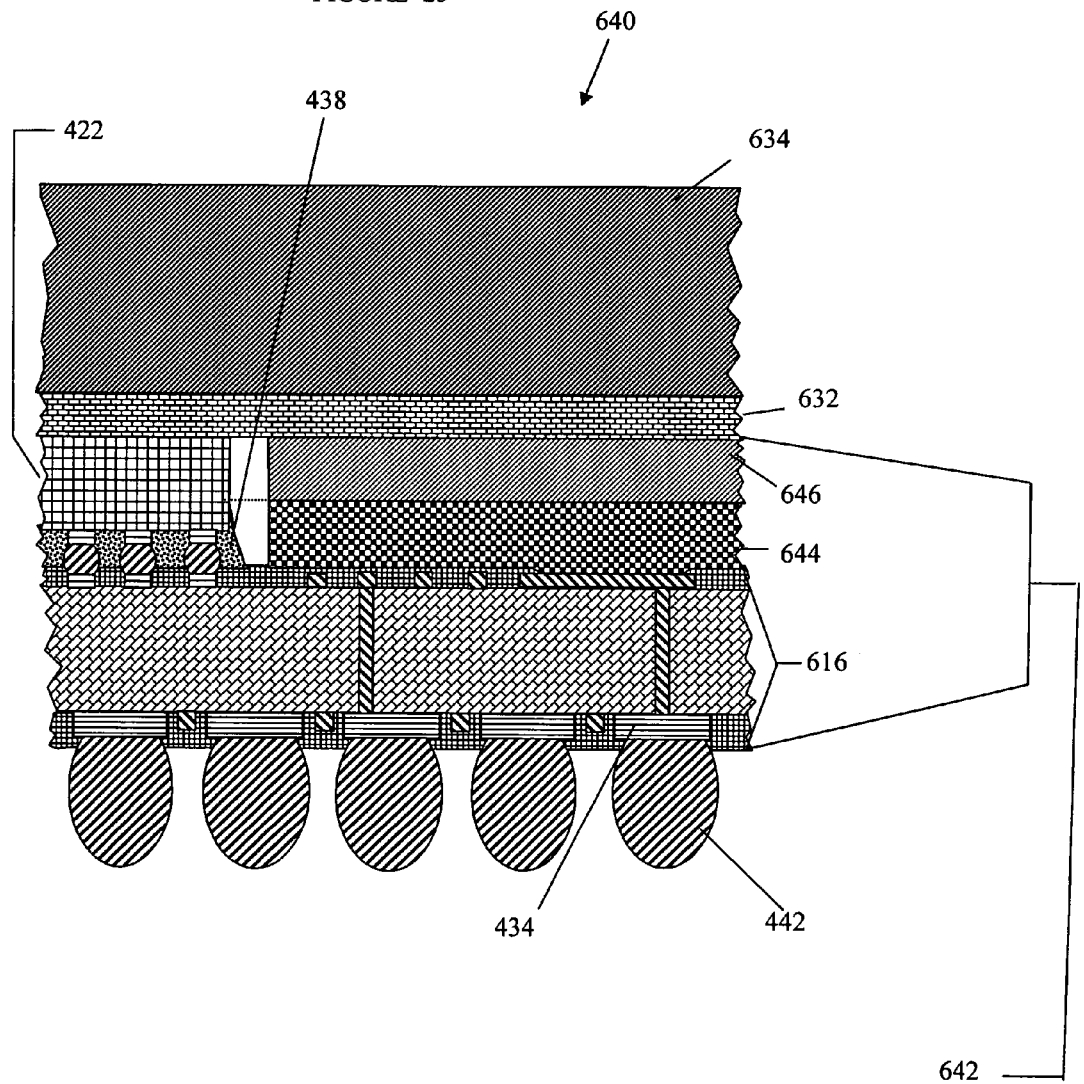
FIG. 25 is an enlarged, cross-sectional view in side elevation cut away of a sixth embodiment of a flip chip electronic package according to the present invention.

FIG. 25 shows an enlarged partial cross section of a sixth embodiment of the flip chip electronic package and is an alternative structure of an electronic package that integrates an electrical ground plane and shielding against EMI, as well as the usual functions of an electrical package. Flip chip electronic package 640 comprises flip chip 422, flip chip package substrate 642, secondary bonding member 632, and heat sink 634. Although flip chip electronic package 640, FIG. 25, incorporates flip chip 422, secondary bonding member 632, and heat sink 634, of flip chip electronic package 610, FIG. 24, flip chip package substrate 642, FIG. 25, differs from flip chip package substrate 612, FIG. 24. Flip chip package substrate 642 incorporates a stiffening member 646 that is similar to stiffening member 544, FIG. 19 and FIG. 23. Flip chip package substrate 642, FIG. 25, incorporates primary bonding member 644, which like primary bonding member 614, FIG. 24, is formed from electrically conductive adhesive. Primary bonding member 644 is fabricated in the same way as primary bonding member 614. The difference between primary bonding member 644 and primary bonding member 614 is that primary bonding member 644 is thinner than primary bonding member 614 to accommodate the incorporation of stiffening member 646 into flip chip package substrate 642. Flip chip package substrate 642, FIG. 25, like flip chip package substrate 612, FIG. 24, incorporates circuitized member 616.

Stiffening member 646, FIG. 25, like stiffening member 544 in FIG. 19 and FIG. 23, provides enhanced stiffness and makes it easier to handle and process strips of flip chip package substrates 642. Stiffening member 646 is a substantially rigid member preferably made of copper, but can be made of other electrically conductive materials. The surface of stiffening member 646 preferably is treated to enhance adhesion between stiffening member 646 and electrically conductive primary bonding member 644 and adhesion between stiffening member 646 and electrically conductive secondary bonding member 632. The preferred treatment leaves an electrically conductive bonding surface on stiffening member 646. Stiffening member 646, FIG. 25, preferably is coated with an electrically conductive layer, preferably nickel, to enhance adhesion with primary bonding member 644 and secondary bonding member 632. The combined thickness of primary bonding member 644 and stiffening member 646 is substantially equivalent to the overall thickness of the flip chip 422 including the height of the solder bumps 424. The overall thickness of a typical flip chip and solder bumps combined is about 18 mils (~0.45 mm). In a flip chip electronic package for a typical flip chip, the preferred thickness of primary bonding member 644 is about 6 mils (~0.15 mm), and the preferred thickness of stiffening member 646 is about 12 mils (~0.30 mm).

Stiffening member 646, FIG. 25 provides four major functions and benefits. Stiffening member 646 provides stiffening, stability, and rigidity to flip chip package substrate 642 and flip chip electronic package 640. Second, as an electrically conductive member, stiffening member is part of a ground plane that facilitates making more efficient ground connections to the numerous solder bumps 424, FIG. 24, that need to be grounded in an efficient manner conserving space on circuitized member 616 for use in forming additional paths for input and output signals. Third, as an electrically conductive metallic member that is connected to ground, stiffening member is part of an electromagnetic shield that provides shielding for flip chip 422 against EMI from sources external to flip chip electronic package 640 and shielding of the circuitry external to flip chip electronic package 640 against EMI generated by flip chip 422 and participates in the formation of an electrical enclosure that serves as a Faraday cage. Fourth, stiffening member 646 reduces the cost of a flip chip package substrate. Electrically conductive adhesive, unlike FR4 and BT resin, is expensive. Incorporating stiffening member 646 into flip chip package substrate 642 reduces the thickness of electrically conductive primary bonding member 644, in comparison with the thickness of electrically conductive primary bonding member 614 in flip chip package substrate 612. Thus, flip chip package substrate 642 and flip chip electronic package 640 will be less expensive to fabricate than corresponding flip chip package substrate 612 and flip chip electronic package 610.

Figure 26:
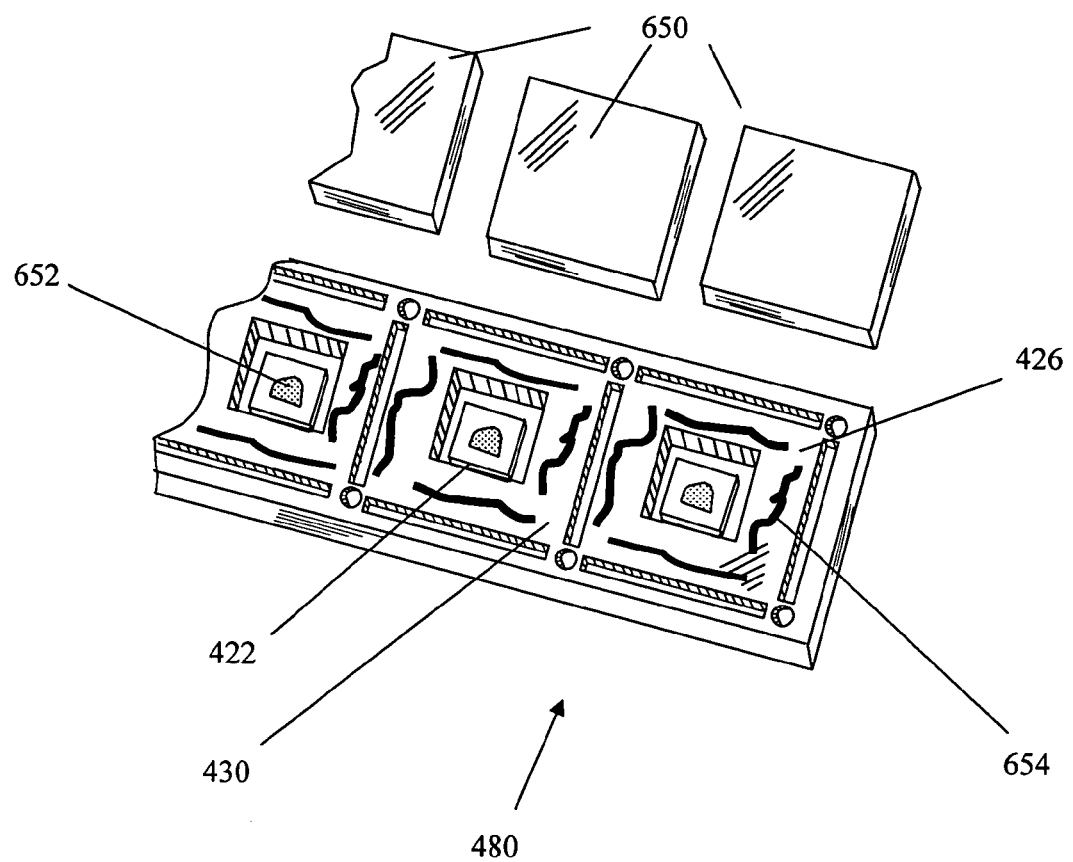
FIG. 26 is an exploded, perspective view cut away of the components for attaching heat sinks onto a row of flip chip package substrates with flip chips attached in a flip chip package substrate strip, in an alternative method for fabricating thermally enhanced flip chip electronic packages.

FIG. 26 shows an alternative method for attaching heat sinks to a flip chip electronic package. Instead of using a fixture and secondary adhesive strip, as illustrated in FIG. 22, to bond heat sinks to a flip chip and its flip chip package substrate, heat sinks 650, FIG. 26, are attached to a flip chip and its flip chip package substrate using adhesive pastes. FIG. 26 illustrates how a heat sink 650 is attached to each flip chip 422 and flip chip package substrate 426 in flip chip package substrate strip 480.

Heat sink 650, FIG. 26, is made from a thermally conductive material, preferably metal. In a first alternative construction heat sink 650 is the same as heat sink 572. In a second alternative construction heat sink 650 is the same as heat sink 634. The first alternative, in which heat sink 650 is the same as heat sink 572, is used in lower cost thermally enhanced cost flip chip electronic packages, such as thermally enhanced flip chip electronic package 570 or thermally enhanced flip chip electronic package 600, when it is not necessary to incorporate a ground plane and it is not necessary to provide shielding against EMI. The second alternative, in which heat sink 650 is the same as heat sink 634, is used in higher performance, thermally enhanced flip chip electronic packages, such as thermally enhanced, EMI-shielded flip chip electronic package 610 and thermally enhanced, EMI-shielded flip chip electronic package 640.

Heat sink 650, FIG. 26, is attached to flip chip 422 using a chip adhesive paste 652. Chip adhesive paste 652 preferably is a thermally conductive die attach paste. Preferably the thermally conductive die attach paste is a silver-filled epoxy paste commercially available from TechFilm Services, Inc. of Billerica, Mass., or Ablestik Laboratories, a National Starch and Chemical Company, Rancho Dominguez, Calif.

Heat sink 650, FIG. 26, is attached to a flip chip package substrate using a substrate adhesive paste 654. In a first alternative, substrate adhesive paste 654 is any epoxy adhesive paste that provides good adhesion between heat sink 650 and a cured primary bonding member, which is the top layer of the flip chip package substrate. FIG. 26 illustrates or indicates the attachment of three heat sinks to three corresponding primary bonding members 430, FIG. 12 and FIG. 26, each of which is the top layer of a flip chip package substrate 426, FIG. 12 and FIG. 26. Substrate adhesive paste 654 in this first alternative need not be electrically conductive and may be chosen to provide a lower cost thermally enhanced, but not EMI-shielded, flip chip electronic package. In a second alternative, substrate adhesive paste 654 is an electrically conductive and thermally conductive epoxy adhesive paste that provides good adhesion and good electrical conductivity between an electrically conductive heat sink 650, i.e. the second alternative construction in which heat sink 650 is the same as heat sink 634, and a cured electrically conductive primary bonding member, such as primary bonding member 614. Substrate adhesive paste 654 in this second alternative provides good electrical conduction enabling heat sink 650 to serve as a ground plane and to provide EMI shielding and to serve as part of a Faraday cage.

Chip adhesive paste 652, FIG. 26, is applied to flip chips 422 and substrate adhesive paste 654 is applied to flip chip package substrates, e.g. flip chip package substrates 426, using conventional dispensers or conventional dispensing techniques. Heat sinks 650 then are pressed onto flip chip package substrate strip 480 covering the respective flip chip package substrates 426. Flip chip package substrate strip 480 with the heat sinks 650 held in place by chip adhesive paste 652 and substrate adhesive paste 654 are heated so that the pastes cure and harden forming strong bonds.

The unique construction of the wire bonded electronic package substrate provides a superior cavity with perpendicular side walls rather than rounded transitions between the bottom wall and the side walls into which a wire bond chip can be placed. The unique construction allows the chip to be placed closer to the side walls and shortens the length of wire bonds used to connected wire bonded chips to the electronic package substrate by about 10-20% greatly improving the electrical performance of the electronic package.

The reduced number of components used to make electronic package substrates and the unique method for fabricating the electronic package substrates in long strips improves the handling and reduces the cost of fabrication of electronic package substrates and electronic packages, ultimately reducing the cost of electronic packages, as well as improving the reliability of the electronic packages.

The unique construction of flip chip package substrates and flip chip electronic packages and the unique method of fabricating flip chip electronic packages reduces the costs of electronic packaging for flip chips. Using magnetic induction heating to melt and fuse solder bumps on flip chips to flip chip package substrate enables the use of lower cost organic materials while retaining the advantages of having solder bumps with higher melting temperatures than the melting temperatures of solder balls used to connect the flip chip electronic package to a PC board.

The employment of an electrically conductive adhesive as a bonding and structural support for the electronic package substrate enables the use of the heat sink as a large ground plane greatly improving the efficient use of the circuitized member by increasing the efficiency of routing ground connections from the chip. The use of an electrically conductive adhesive as a bonding and structural support for electronic package substrate also enables the incorporation of shielding against electromagnetic interference into the electronic package.

While this description sets out the best mode presently contemplated for carrying out the invention, this description is not to be taken in a limiting sense, but is merely for the purpose of describing the general principles of the invention. The scope of the invention should be determined by reference to the following claims.

I claim:

1. A process for fabricating an electronic package substrate, comprising:
    fabricating a relatively stiff adhesive bonding member from a sheet of adhesive of sufficient thickness to act as a structural member;
    forming an orifice, with side walls, through the adhesive bonding member, and a frame of the adhesive bonding member surrounding the orifice;
    fabricating a circuitized member with an array of pads for both mechanically attaching and electrically connecting a flip chip thereon;
    aligning the adhesive bonding member and the circuitized member with the orifice in the adhesive bonding member aligned with the array of pads on the circuitized member;
    bonding the members together with heat and pressure; thereby
    forming a cavity, with the side walls of the orifice through the bonding member as side walls of the cavity and the circuitized member, with an array of pads for both mechanically attaching and electrically connecting a flip chip thereon, as a base of the cavity, surrounded by the frame of the adhesive bonding member, which itself acts as a structural support.

2. The process of claim 1 further including:
    fabricating a flip chip;
    placing the flip chip through the orifice in the adhesive member onto the circuitized member;
    aligning the flip chip and the circuitized member; and
    connecting mechanically and electrically the flip chip to the circuitized member by melting an array of solder bumps on the flip chip;
    thereby forming an electronic flip chip package.

3. The process of claim 2 wherein the melting of the solder bumps is melting by magnetic induction.

4. The process of claim 2 further including thereafter melting and bonding an array of solder balls to the circuitized member at a temperature of at least about 20° C. lower than the temperature at which the solder bumps were melted.

5. The process of claim 2 further including thereafter melting and bonding an array of solder balls to the circuitized member by magnetic induction.

6. The process of claim 2 including:
fabricating a second adhesive bonding member from a sheet of adhesive;
fabricating a heat sink;
aligning the flip chip electronic package, the second adhesive bonding member, and the heat sink with respect to each other;
sandwiching the flip chip electronic package, the second adhesive bonding member, and the heat sink together; and
bonding the flip chip electronic package, the second adhesive bonding member, and the heat sink together with heat and pressure, forming a thermally enhanced electronic flip chip package.

7. The process of claim 2, wherein the adhesive bonding member is a first electrically conductive adhesive bonding member formed from a sheet of electrically conductive adhesive and whereby bonding the members together with heat and pressure electrically connects the first electrically conductive adhesive bonding member to a ground pad on the circuitized member, including:
fabricating a second electrically conductive adhesive bonding member from a sheet of electrically conductive adhesive;
fabricating an electrically conductive heat sink;
aligning the flip chip electronic package, the second adhesive bonding member, and the heat sink with respect to each other;
sandwiching the flip chip electronic package, the second adhesive bonding member, and the heat sink together; and
bonding the flip chip electronic package, the second adhesive bonding member, and the heat sink together with heat and pressure, whereby the first electrically conductive adhesive bonding member is electrically connected to the electrically conductive second adhesive bonding member, and the second adhesive bonding member is electrically connected to the electrically conductive heat sink, thereby forming an electrically groundable shield around the flip chip and an electrically shieldable electronic flip chip package.

8. A process for fabricating an electronic package substrate, comprising:
fabricating an adhesive bonding member from a sheet of adhesive;
forming an orifice through the adhesive bonding member for receiving a semiconductor chip;
fabricating a circuitized member from an electrically insulating sheet with electrically conductive traces thereon;
forming an orifice through the circuitized member;
fabricating a thermally conductive support member;
aligning the thermally conductive support member, the adhesive bonding members and the circuitized member; and
bonding the members together with heat and pressure, thereby forming a cavity.

9. The process of claim 8 wherein the thermally conductive support member is also electrically conductive and wherein the adhesive bonding member is an electrically conductive adhesive bonding member formed from a sheet of electrically conductive adhesive including electrically connecting the bonding member to a ground pad on the circuitized member and to the support member.

10. The process of claim 9 including bonding adhesively a chip to the support member within the cavity; and connecting electrically the chip to the circuitized member forming an electromagnetically shieldable electronic package.

11. The process of claim 8 including bonding adhesively a chip to the support member within the cavity; and connecting electrically the chip to the circuitized member forming an electronic package.

12. The process of claim 8 including forming simultaneously a plurality of substrates in an array surrounded by a frame formed by the sheet of adhesive from which the bonding members are fabricated.

13. A process for fabricating simultaneously a plurality of electronic package substrates, comprising:
fabricating a plurality of adhesive bonding members, from a sheet of adhesive, in an array surrounded by a frame formed by the sheet of adhesive from which the bonding members are fabricated;
fabricating a plurality of circuitized members, from an electrically insulating sheet with electrically conductive traces thereon; in an array, surrounded by a frame formed by the electrically insulating sheet from which the circuitized members are fabricated;
aligning the members with respect to each other; and
bonding the members together with heat and pressure.

* * * * *